United States Patent
Hara et al.

(10) Patent No.: US 11,238,924 B2
(45) Date of Patent: Feb. 1, 2022

(54) NONVOLATILE MEMORY MULTILEVEL CELL PROGRAMMING

(71) Applicant: Kioxia Corporation, Tokyo (JP)

(72) Inventors: Tokumasa Hara, Kawasaki (JP); Noboru Shibata, Kawasaki (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/016,765

(22) Filed: Sep. 10, 2020

(65) Prior Publication Data

US 2021/0158867 A1 May 27, 2021

(30) Foreign Application Priority Data

Nov. 21, 2019 (JP) .............................. JP2019-210823
Jun. 30, 2020 (JP) .............................. JP2020-113206
Aug. 28, 2020 (JP) .............................. JP2020-144847

(51) Int. Cl.
| | |
|---|---|
| *H03M 13/00* | (2006.01) |
| *G11C 11/56* | (2006.01) |
| *G11C 16/04* | (2006.01) |
| *G11C 16/14* | (2006.01) |
| *G06F 3/06* | (2006.01) |

(Continued)

(52) U.S. Cl.
CPC ........ G11C 11/5628 (2013.01); G06F 3/0619 (2013.01); G06F 3/0659 (2013.01); G06F 3/0679 (2013.01); G06F 11/1068 (2013.01); G11C 16/0483 (2013.01); G11C 16/10 (2013.01); G11C 16/14 (2013.01)

(58) Field of Classification Search
CPC .... G06F 3/0619; G06F 3/0659; G06F 3/0679; G06F 11/1068; G11C 11/5628; G11C 11/5635; G11C 11/5642; G11C 16/08; G11C 16/10; G11C 16/14; G11C 16/0483; G11C 2211/5621
See application file for complete search history.

(56) References Cited

U.S. PATENT DOCUMENTS 9,830,983 B1 * 11/2017 Hara ....................... G11C 16/26
9,934,847 B2 * 4/2018 Sakurada ............ G11C 11/5642

(Continued)

FOREIGN PATENT DOCUMENTS

| JP | 2018-005959 A | 1/2018 |
|---|---|---|
| JP | 2021-47970 A | 3/2021 |

*Primary Examiner* — Albert Decady
*Assistant Examiner* — Enamul M Kabir
(74) *Attorney, Agent, or Firm* — Oblon, McClelland, Maier & Neustadt, L.L.P.

(57) ABSTRACT

A memory system includes a nonvolatile memory which comprises a plurality of memory cells capable of storing 4-bit data represented by first to fourth bits by sixteen threshold regions, and a memory controller configured to cause the nonvolatile memory to execute a first program for writing data of the first bit, the second bit, and the fourth bit and then causes the nonvolatile memory to execute a second program for writing data of the third bit. In fifteen boundaries existing between adjacent threshold regions among the first to sixteenth threshold regions, a maximum value of the number of first boundaries used for determining a value of the data of the first bit, the number of second boundaries used for determining a value of the data of the second bit, the number of third boundaries used for determining a value of the data of the third bit.

20 Claims, 117 Drawing Sheets

(51) Int. Cl.
*G06F 11/10* (2006.01)
*G11C 16/10* (2006.01)

(56) References Cited

U.S. PATENT DOCUMENTS

| | | | |
|---|---|---|---|
| 2013/0132652 A1* | 5/2013 | Wood | G06F 3/0629 |
| | | | 711/103 |
| 2016/0170871 A1* | 6/2016 | Hyun | G06F 3/0653 |
| | | | 711/103 |
| 2017/0337969 A1* | 11/2017 | Shikata | G11C 16/3459 |
| 2018/0074896 A1* | 3/2018 | Takada | G06F 11/1048 |
| 2018/0277222 A1* | 9/2018 | Kondo | G11C 16/3481 |
| 2020/0104209 A1* | 4/2020 | El Gamal | G11C 16/26 |
| 2021/0082497 A1 | 3/2021 | Hara et al. | |

* cited by examiner 1-4-5-5 DATA CODING

| Page | Data | | | | | | | | | | | | | | | |
|---|---|---|---|---|---|---|---|---|---|---|---|---|---|---|---|---|
| | S0 | S1 | S2 | S3 | S4 | S5 | S6 | S7 | S8 | S9 | S10 | S11 | S12 | S13 | S14 | S15 |
| Top | 1 | 0 | 0 | 1 | 1 | 0 | 0 | 1 | 1 | 1 | 1 | 1 | 0 | 0 | 0 | 0 |
| Upper | 1 | 1 | 0 | 0 | 0 | 0 | 1 | 1 | 1 | 1 | 0 | 0 | 0 | 1 | 1 | 0 |
| Middle | 1 | 1 | 1 | 1 | 0 | 0 | 0 | 0 | 0 | 1 | 1 | 0 | 0 | 0 | 1 | 1 |
| Lower | 1 | 1 | 1 | 1 | 1 | 1 | 1 | 1 | 0 | 0 | 0 | 0 | 0 | 0 | 0 | 0 |

FIG. 6A

4—3—4—4 DATA CODING

| Page | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| Top | 1 | 0 | 0 | 1 | 1 | 1 | 1 | 1 | 1 | 0 | 0 | 0 | 0 | 0 | 0 | 1 |
| Upper | 1 | 1 | 0 | 0 | 0 | 1 | 1 | 0 | 0 | 0 | 0 | 0 | 1 | 1 | 1 | 1 |
| Middle | 1 | 1 | 1 | 1 | 1 | 1 | 0 | 0 | 0 | 0 | 0 | 1 | 1 | 0 | 0 | 0 |
| Lower | 1 | 1 | 1 | 1 | 0 | 0 | 0 | 0 | 1 | 1 | 0 | 0 | 0 | 0 | 1 | 1 |

FIG. 6B

| WL NUMBER | PROGRAM STAGE | |
|---|---|---|
| | 1st | 2nd |
| 0 | $ST_11$ | $ST_13$ |
| 1 | $ST_12$ | $ST_15$ |
| 2 | $ST_14$ | $ST_17$ |
| 3 | $ST_16$ | $ST_19$ |
| 4 | $ST_18$ | |

FIG. 8A

| WL NUMBER | String0 | | String1 | | String2 | | String3 | |
|---|---|---|---|---|---|---|---|---|
| | 1st | 2nd | 1st | 2nd | 1st | 2nd | 1st | 2nd |
| 0 | $ST_21$ | $ST_26$ | $ST_22$ | $ST_28$ | $ST_23$ | $ST_210$ | $ST_24$ | $ST_212$ |
| 1 | $ST_25$ | $ST_214$ | $ST_27$ | $ST_216$ | $ST_29$ | $ST_218$ | $ST_211$ | $ST_220$ |
| 2 | $ST_213$ | $ST_222$ | $ST_215$ | $ST_224$ | $ST_217$ | $ST_226$ | $ST_219$ | $ST_228$ |
| 3 | $ST_221$ | $ST_230$ | $ST_223$ | $ST_232$ | $ST_225$ | $ST_234$ | $ST_227$ | $ST_236$ |
| 4 | | | | | | | | |

FIG. 8B

| WL NUMBER | String0 | | String1 | | String2 | | String3 | |
|---|---|---|---|---|---|---|---|---|
| | 1st | 2nd | 1st | 2nd | 1st | 2nd | 1st | 2nd |
| 0 | $ST_31$ | $ST_39$ | $ST_32$ | $ST_310$ | $ST_33$ | $ST_311$ | $ST_34$ | $ST_312$ |
| 1 | $ST_35$ | $ST_317$ | $ST_36$ | $ST_318$ | $ST_37$ | $ST_319$ | $ST_38$ | $ST_320$ |
| 2 | $ST_313$ | $ST_325$ | $ST_316$ | $ST_326$ | $ST_315$ | $ST_327$ | $ST_316$ | $ST_328$ |
| 3 | $ST_321$ | $ST_333$ | $ST_322$ | $ST_334$ | $ST_323$ | $ST_335$ | $ST_324$ | $ST_336$ |
| 4 | | | | | | | | |

FIG. 8C

| Read | Data | | | | | | | | | | | | |
|---|---|---|---|---|---|---|---|---|---|---|---|---|---|
| 1st | ○ | ○ | × | ○ | ○ | ○ | ○ | ○ | ~ | ○ | ○ | × | ○ |
| 2nd | × | ○ | ○ | ○ | × | × | ○ | ○ | ~ | × | ○ | ○ | ○ |
| 3rd | ○ | ○ | ○ | ○ | × | ○ | ○ | ○ | ~ | ○ | ○ | × | ○ |
| Majority Decision | ○ | ○ | ○ | ○ | × | ○ | ○ | ○ | ~ | ○ | ○ | ○ | ○ |

FIG.12

| Page | S0 | S1 | S2 | S3 | S4 | S5 | S6 | S7 | S8 | S9 | S10 | S11 | S12 | S13 | S14 | S15 |
|------|----|----|----|----|----|----|----|----|----|----|-----|-----|-----|-----|-----|-----|
| Data | | | | | | | | | | | | | | | | |
| Top | 1 | 0 | 0 | 1 | 1 | 0 | 0 | 1 | 1 | 1 | 1 | 1 | 0 | 0 | 0 | 0 |
| Upper | 1 | 1 | 0 | 0 | 0 | 0 | 1 | 1 | 1 | 1 | 0 | 0 | 0 | 1 | 1 | 0 |
| Middle | 1 | 1 | 1 | 1 | 0 | 0 | 0 | 0 | 0 | 1 | 1 | 0 | 0 | 0 | 1 | 1 |
| Lower | 1 | 1 | 1 | 1 | 1 | 1 | 1 | 1 | 0 | 0 | 0 | 0 | 0 | 0 | 0 | 0 |

FIG.16B 3-2-5-5 DATA CODING

| Page | Data | | | | | | | | | | | | | | | |
|---|---|---|---|---|---|---|---|---|---|---|---|---|---|---|---|---|
| | S0 | S1 | S2 | S3 | S4 | S5 | S6 | S7 | S8 | S9 | S10 | S11 | S12 | S13 | S14 | S15 |
| Top | 1 | 0 | 0 | 1 | 1 | 1 | 1 | 1 | 0 | 0 | 0 | 0 | 0 | 1 | 1 | 0 |
| Upper | 1 | 1 | 0 | 0 | 0 | 0 | 1 | 1 | 1 | 0 | 0 | 1 | 1 | 1 | 0 | 0 |
| Middle | 1 | 1 | 1 | 1 | 0 | 0 | 0 | 0 | 0 | 0 | 0 | 0 | 1 | 1 | 1 | 0 |
| Lower | 1 | 1 | 1 | 1 | 1 | 0 | 0 | 1 | 1 | 1 | 0 | 0 | 0 | 0 | 0 | 0 |

FIG.28

3-2-5-5 DATA CODING

| Page | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| | | | | | | | | | | | | | Data | | | |
| Top | 1 | 0 | 0 | 1 | 1 | 1 | 1 | 1 | 0 | 0 | 0 | 0 | 0 | 1 | 1 | 0 |
| Upper | 1 | 1 | 0 | 0 | 0 | 1 | 1 | 0 | 0 | 0 | 1 | 1 | 1 | 1 | 0 | 0 |
| Middle | 1 | 1 | 1 | 1 | 0 | 0 | 0 | 0 | 0 | 1 | 0 | 0 | 1 | 1 | 1 | 1 |
| Lower | 1 | 1 | 1 | 1 | 1 | 1 | 0 | 0 | 0 | 1 | 1 | 0 | 0 | 0 | 0 | 0 |

FIG.29

1-5-5-4 DATA CODING

| Page | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| Top | 1 | 0 | 0 | 1 | 1 | 1 | 0 | 0 | 0 | 0 | 0 | 0 | 1 | 1 | 1 | 1 |
| Upper | 1 | 1 | 0 | 0 | 0 | 1 | 1 | 0 | 0 | 0 | 1 | 1 | 1 | 1 | 0 | 0 |
| Middle | 1 | 1 | 1 | 1 | 0 | 0 | 0 | 0 | 0 | 1 | 1 | 0 | 0 | 1 | 1 | 0 |
| Lower | 1 | 1 | 1 | 1 | 1 | 1 | 1 | 1 | 0 | 0 | 0 | 0 | 0 | 0 | 0 | 0 |

FIG.30

1-5-4-5 DATA CODING

| Page | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| Top | 1 | 0 | 0 | 1 | 1 | 0 | 0 | 1 | 1 | 1 | 1 | 1 | 0 | 0 | 0 | 0 |
| Upper | 1 | 1 | 0 | 0 | 0 | 0 | 1 | 1 | 1 | 1 | 0 | 0 | 0 | 0 | 1 | 1 |
| Middle | 1 | 1 | 1 | 1 | 0 | 0 | 0 | 0 | 0 | 1 | 1 | 0 | 0 | 1 | 1 | 0 |
| Lower | 1 | 1 | 1 | 1 | 1 | 1 | 1 | 1 | 0 | 0 | 0 | 0 | 0 | 0 | 0 | 0 |

FIG.31

1-4-5-5 DATA CODING

| Page | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| Top | 1 | 0 | 0 | 1 | 1 | 0 | 0 | 1 | 1 | 1 | 1 | 1 | 0 | 0 | 0 | 0 |
| Upper | 1 | 1 | 0 | 0 | 0 | 0 | 1 | 1 | 1 | 0 | 0 | 1 | 1 | 1 | 0 | 0 |
| Middle | 1 | 1 | 1 | 1 | 0 | 0 | 0 | 0 | 0 | 0 | 1 | 0 | 1 | 0 | 0 | 1 |
| Lower | 1 | 1 | 1 | 1 | 1 | 1 | 1 | 1 | 0 | 0 | 0 | 0 | 0 | 0 | 0 | 0 |

FIG.32

1-5-3-6 DATA CODING

| Page | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| | | | | | | | | | Data | | | | | | | |
| Top | 1 | 0 | 0 | 1 | 1 | 0 | 0 | 1 | 1 | 1 | 0 | 0 | 0 | 0 | 1 | 1 |
| Upper | 1 | 1 | 0 | 0 | 0 | 0 | 1 | 1 | 1 | 1 | 1 | 1 | 0 | 0 | 0 | 0 |
| Middle | 1 | 1 | 1 | 1 | 0 | 0 | 0 | 0 | 0 | 1 | 1 | 0 | 0 | 1 | 1 | 0 |
| Lower | 1 | 1 | 1 | 1 | 1 | 1 | 1 | 1 | 0 | 0 | 0 | 0 | 0 | 0 | 0 | 0 |

FIG.33

1-3-6-5 DATA CODING

| Page | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| Top | 1 | 0 | 0 | 1 | 1 | 0 | 0 | 1 | 1 | 1 | 1 | 1 | 0 | 0 | 0 | 0 |
| Upper | 1 | 1 | 0 | 0 | 0 | 0 | 1 | 1 | 1 | 0 | 0 | 1 | 1 | 0 | 0 | 1 |
| Middle | 1 | 1 | 1 | 1 | 0 | 0 | 0 | 0 | 0 | 0 | 1 | 1 | 1 | 1 | 0 | 0 |
| Lower | 1 | 1 | 1 | 1 | 1 | 1 | 1 | 1 | 0 | 0 | 0 | 0 | 0 | 0 | 0 | 0 |

FIG.34

1-2-6-6 DATA CODING

| Page | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| | | | | | | | Data | | | | | | | | | |
| Top | 1 | 0 | 0 | 1 | 1 | 1 | 0 | 0 | 0 | 0 | 1 | 1 | 1 | 0 | 0 | 1 |
| Upper | 1 | 1 | 0 | 0 | 0 | 1 | 1 | 0 | 0 | 1 | 1 | 0 | 0 | 0 | 1 | 1 |
| Middle | 1 | 1 | 1 | 1 | 0 | 0 | 0 | 0 | 0 | 0 | 0 | 0 | 1 | 1 | 1 | 1 |
| Lower | 1 | 1 | 1 | 1 | 1 | 1 | 1 | 1 | 0 | 0 | 0 | 0 | 0 | 0 | 0 | 0 |

FIG.35

1-2-6-6 DATA CODING

| Page | Data | | | | | | | | | | | | | | | |
|---|---|---|---|---|---|---|---|---|---|---|---|---|---|---|---|---|
| | S0 | S1 | S2 | S3 | S4 | S5 | S6 | S7 | S8 | S9 | S10 | S11 | S12 | S13 | S14 | S15 |
| Top | 1 | 0 | 0 | 1 | 1 | 1 | 0 | 0 | 0 | 1 | 1 | 0 | 0 | 0 | 1 | 1 |
| Upper | 1 | 1 | 0 | 0 | 0 | 1 | 1 | 0 | 0 | 0 | 1 | 1 | 1 | 0 | 0 | 1 |
| Middle | 1 | 1 | 1 | 1 | 0 | 0 | 0 | 0 | 0 | 0 | 0 | 0 | 1 | 1 | 1 | 1 |
| Lower | 1 | 1 | 1 | 1 | 1 | 1 | 1 | 1 | 0 | 0 | 0 | 0 | 0 | 0 | 0 | 0 |

FIG.36

1-2-6-6 DATA CODING

| Page | Data | | | | | | | | | | | | | | | |
|---|---|---|---|---|---|---|---|---|---|---|---|---|---|---|---|---|
| | S0 | S1 | S2 | S3 | S4 | S5 | S6 | S7 | S8 | S9 | S10 | S11 | S12 | S13 | S14 | S15 |
| Top | 1 | 0 | 0 | 1 | 1 | 0 | 0 | 1 | 1 | 1 | 0 | 0 | 0 | 0 | 1 | 1 |
| Upper | 1 | 1 | 0 | 0 | 0 | 0 | 1 | 1 | 1 | 0 | 0 | 1 | 1 | 0 | 0 | 1 |
| Middle | 1 | 1 | 1 | 1 | 0 | 0 | 0 | 0 | 0 | 0 | 0 | 0 | 1 | 1 | 1 | 1 |
| Lower | 1 | 1 | 1 | 1 | 1 | 1 | 1 | 1 | 0 | 0 | 0 | 0 | 0 | 0 | 0 | 0 |

FIG.37

1-4-6-4 DATA CODING

| Page | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| Top | 1 | 0 | 0 | 1 | 1 | 1 | 0 | 0 | 0 | 0 | 0 | 0 | 1 | 1 | 1 | 1 |
| Upper | 1 | 1 | 0 | 0 | 0 | 1 | 1 | 0 | 0 | 0 | 1 | 1 | 1 | 0 | 0 | 1 |
| Middle | 1 | 1 | 1 | 1 | 0 | 0 | 0 | 0 | 0 | 1 | 1 | 0 | 0 | 0 | 1 | 1 |
| Lower | 1 | 1 | 1 | 1 | 1 | 1 | 1 | 1 | 0 | 0 | 0 | 0 | 0 | 0 | 0 | 0 |

Data

FIG.38

1-4-4-6 DATA CODING

| Page | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| Top | 1 | 0 | 0 | 1 | 1 | 1 | 0 | 0 | 0 | 0 | 1 | 1 | 1 | 0 | 0 | 1 |
| Upper | 1 | 1 | 0 | 0 | 0 | 1 | 1 | 0 | 0 | 0 | 0 | 0 | 1 | 1 | 1 | 1 |
| Middle | 1 | 1 | 1 | 1 | 0 | 0 | 0 | 0 | 0 | 1 | 1 | 0 | 0 | 0 | 1 | 1 |
| Lower | 1 | 1 | 1 | 1 | 1 | 1 | 1 | 1 | 0 | 0 | 0 | 0 | 0 | 0 | 0 | 0 |

FIG.39

1-4-6-4 DATA CODING

| Page | Data | | | | | | | | | | | | | | | |
|---|---|---|---|---|---|---|---|---|---|---|---|---|---|---|---|---|
| | S0 | S1 | S2 | S3 | S4 | S5 | S6 | S7 | S8 | S9 | S10 | S11 | S12 | S13 | S14 | S15 |
| Top | 1 | 0 | 0 | 1 | 1 | 1 | 0 | 0 | 0 | 0 | 0 | 0 | 1 | 1 | 1 | 1 |
| Upper | 1 | 1 | 0 | 0 | 0 | 1 | 1 | 0 | 0 | 1 | 1 | 0 | 0 | 0 | 1 | 1 |
| Middle | 1 | 1 | 1 | 1 | 0 | 0 | 0 | 0 | 0 | 0 | 1 | 1 | 1 | 0 | 0 | 1 |
| Lower | 1 | 1 | 1 | 1 | 1 | 1 | 1 | 1 | 0 | 0 | 0 | 0 | 0 | 0 | 0 | 0 |

FIG.40

1-4-4-6 DATA CODING

| Page | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| Top | 1 | 0 | 0 | 1 | 1 | 1 | 0 | 0 | 0 | 1 | 1 | 0 | 0 | 0 | 1 | 1 |
| Upper | 1 | 1 | 0 | 0 | 0 | 1 | 1 | 0 | 0 | 0 | 0 | 0 | 1 | 1 | 1 | 1 |
| Middle | 1 | 1 | 1 | 1 | 0 | 0 | 0 | 0 | 0 | 0 | 1 | 1 | 1 | 0 | 0 | 1 |
| Lower | 1 | 1 | 1 | 1 | 1 | 1 | 1 | 1 | 0 | 0 | 0 | 0 | 0 | 0 | 0 | 0 |

FIG.41

2-5-2-6 DATA CODING

| Page | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| | | | | | | | | | Data | | | | | | | |
| Top | 1 | 0 | 0 | 0 | 1 | 1 | 1 | 1 | 0 | 0 | 0 | 1 | 1 | 0 | 0 | 1 |
| Upper | 1 | 1 | 0 | 0 | 0 | 0 | 0 | 0 | 0 | 0 | 1 | 1 | 1 | 1 | 1 | 1 |
| Middle | 1 | 1 | 1 | 0 | 0 | 1 | 1 | 0 | 0 | 1 | 1 | 0 | 0 | 0 | 0 | 0 |
| Lower | 1 | 1 | 1 | 1 | 1 | 1 | 0 | 0 | 0 | 0 | 0 | 0 | 0 | 0 | 1 | 1 |

FIG.42

2-5-2-6 DATA CODING

| Page | Data | | | | | | | | | | | | | | | |
|---|---|---|---|---|---|---|---|---|---|---|---|---|---|---|---|---|
| | S0 | S1 | S2 | S3 | S4 | S5 | S6 | S7 | S8 | S9 | S10 | S11 | S12 | S13 | S14 | S15 |
| Top | 1 | 0 | 0 | 0 | 1 | 1 | 1 | 0 | 0 | 1 | 1 | 1 | 0 | 0 | 0 | 1 |
| Upper | 1 | 1 | 0 | 0 | 0 | 0 | 0 | 0 | 0 | 0 | 1 | 1 | 1 | 1 | 1 | 1 |
| Middle | 1 | 1 | 1 | 0 | 0 | 1 | 1 | 1 | 0 | 0 | 0 | 1 | 1 | 0 | 0 | 0 |
| Lower | 1 | 1 | 1 | 1 | 1 | 1 | 0 | 0 | 0 | 0 | 0 | 0 | 0 | 0 | 1 | 1 |

FIG.43

2-5-2-6 DATA CODING

| Page | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| Top | 1 | 0 | 0 | 1 | 1 | 0 | 0 | 0 | 1 | 1 | 1 | 1 | 0 | 0 | 0 | 1 |
| Upper | 1 | 1 | 0 | 0 | 0 | 0 | 0 | 0 | 0 | 0 | 1 | 1 | 1 | 1 | 1 | 1 |
| Middle | 1 | 1 | 1 | 1 | 0 | 0 | 0 | 1 | 1 | 0 | 0 | 1 | 1 | 0 | 0 | 0 |
| Lower | 1 | 1 | 1 | 1 | 1 | 1 | 0 | 0 | 0 | 0 | 0 | 0 | 0 | 0 | 1 | 1 |

Data

FIG.44

3-3-3-6 DATA CODING

| Page | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| Top | 1 | 0 | 0 | 0 | 1 | 1 | 1 | 0 | 0 | 1 | 1 | 1 | 0 | 0 | 0 | 1 |
| Upper | 1 | 1 | 0 | 0 | 0 | 0 | 0 | 0 | 1 | 1 | 1 | 0 | 1 | 1 | 0 | 0 |
| Middle | 1 | 1 | 1 | 0 | 0 | 1 | 1 | 1 | 1 | 1 | 0 | 1 | 0 | 0 | 0 | 0 |
| Lower | 1 | 1 | 1 | 1 | 1 | 1 | 0 | 0 | 0 | 0 | 0 | 1 | 1 | 0 | 0 | 0 |

FIG.45

3-3-6-3 DATA CODING

| Page | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| Top | 1 | 0 | 0 | 1 | 1 | 1 | 1 | 1 | 1 | 1 | 0 | 0 | 0 | 0 | 0 | 0 |
| Upper | 1 | 1 | 0 | 0 | 0 | 1 | 1 | 0 | 0 | 1 | 1 | 0 | 0 | 0 | 1 | 1 |
| Middle | 1 | 1 | 1 | 1 | 0 | 0 | 0 | 0 | 1 | 1 | 1 | 1 | 0 | 0 | 0 | 0 |
| Lower | 1 | 1 | 1 | 1 | 1 | 1 | 0 | 0 | 0 | 0 | 0 | 0 | 0 | 1 | 1 | 0 |

Data

FIG.46

2-3-4-6 DATA CODING

| Page | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| Top | 1 | 0 | 0 | 0 | 1 | 1 | 1 | 1 | 0 | 0 | 0 | 1 | 1 | 0 | 0 | 1 |
| Upper | 1 | 1 | 0 | 0 | 0 | 0 | 0 | 1 | 1 | 0 | 0 | 0 | 1 | 1 | 1 | 1 |
| Middle | 1 | 1 | 1 | 0 | 0 | 1 | 1 | 1 | 1 | 1 | 0 | 0 | 0 | 0 | 0 | 0 |
| Lower | 1 | 1 | 1 | 1 | 1 | 1 | 0 | 0 | 0 | 0 | 0 | 0 | 0 | 0 | 1 | 1 |

FIG.47

3-4-2-6 DATA CODING

| Page | Data | | | | | | | | | | | | | | | |
|---|---|---|---|---|---|---|---|---|---|---|---|---|---|---|---|---|
| | S0 | S1 | S2 | S3 | S4 | S5 | S6 | S7 | S8 | S9 | S10 | S11 | S12 | S13 | S14 | S15 |
| Top | 1 | 0 | 0 | 0 | 1 | 1 | 1 | 0 | 0 | 1 | 1 | 1 | 0 | 0 | 0 | 1 |
| Upper | 1 | 1 | 0 | 0 | 0 | 0 | 0 | 0 | 0 | 0 | 1 | 1 | 1 | 1 | 1 | 1 |
| Middle | 1 | 1 | 1 | 0 | 0 | 1 | 1 | 1 | 0 | 0 | 0 | 0 | 0 | 0 | 1 | 1 |
| Lower | 1 | 1 | 1 | 1 | 1 | 1 | 0 | 0 | 0 | 0 | 0 | 1 | 1 | 0 | 0 | 0 |

FIG.48

2-3-4-6 DATA CODING

| Page | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| Top | 1 | 0 | 0 | 0 | 1 | 1 | 1 | 0 | 0 | 1 | 1 | 1 | 0 | 0 | 0 | 1 |
| Upper | 1 | 1 | 0 | 0 | 0 | 0 | 0 | 0 | 1 | 1 | 1 | 0 | 0 | 1 | 1 | 1 |
| Middle | 1 | 1 | 1 | 0 | 0 | 1 | 1 | 1 | 1 | 1 | 0 | 0 | 0 | 0 | 0 | 0 |
| Lower | 1 | 1 | 1 | 1 | 1 | 1 | 0 | 0 | 0 | 0 | 0 | 0 | 0 | 0 | 1 | 1 |

Data

FIG.49

3-2-6-4 DATA CODING

| Page | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| Top | 1 | 0 | 0 | 1 | 1 | 1 | 1 | 1 | 0 | 0 | 0 | 0 | 0 | 0 | 1 | 1 |
| Upper | 1 | 1 | 0 | 0 | 0 | 0 | 1 | 1 | 1 | 0 | 0 | 1 | 1 | 0 | 0 | 1 |
| Middle | 1 | 1 | 1 | 1 | 0 | 0 | 0 | 0 | 0 | 0 | 0 | 0 | 1 | 1 | 1 | 0 |
| Lower | 1 | 1 | 1 | 1 | 1 | 0 | 0 | 1 | 1 | 1 | 0 | 0 | 0 | 0 | 0 | 1 |

FIG.50

3-2-4-6 DATA CODING

| Page | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| | | | | | | | | Data | | | | | | | | |
| Top | 1 | 0 | 0 | 1 | 1 | 1 | 0 | 0 | 0 | 1 | 1 | 0 | 0 | 0 | 1 | 1 |
| Upper | 1 | 1 | 0 | 0 | 0 | 0 | 0 | 0 | 1 | 1 | 1 | 1 | 1 | 0 | 0 | 1 |
| Middle | 1 | 1 | 1 | 1 | 0 | 0 | 0 | 0 | 0 | 0 | 0 | 0 | 1 | 1 | 1 | 1 |
| Lower | 1 | 1 | 1 | 1 | 1 | 0 | 0 | 1 | 1 | 1 | 0 | 0 | 0 | 0 | 0 | 0 |

FIG.51

3-2-6-4 DATA CODING

| Page | S0 | S1 | S2 | S3 | S4 | S5 | S6 | S7 | S8 | S9 | S10 | S11 | S12 | S13 | S14 | S15 |
|------|----|----|----|----|----|----|----|----|----|----|-----|-----|-----|-----|-----|-----|
| Top | 1 | 0 | 0 | 1 | 1 | 1 | 1 | 1 | 0 | 0 | 0 | 0 | 0 | 0 | 1 | 1 |
| Upper | 1 | 1 | 0 | 0 | 0 | 1 | 1 | 0 | 0 | 0 | 1 | 1 | 1 | 0 | 0 | 1 |
| Middle | 1 | 1 | 1 | 1 | 0 | 0 | 0 | 0 | 0 | 1 | 0 | 0 | 1 | 1 | 1 | 1 |
| Lower | 1 | 1 | 1 | 1 | 1 | 1 | 0 | 0 | 0 | 1 | 1 | 0 | 0 | 0 | 0 | 0 |

Data

FIG.52

3-4-2-6 DATA CODING

| Page | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| Top | 1 | 0 | 0 | 1 | 1 | 0 | 0 | 0 | 1 | 1 | 1 | 1 | 0 | 0 | 0 | 1 |
| Upper | 1 | 1 | 0 | 0 | 0 | 0 | 0 | 0 | 0 | 0 | 1 | 1 | 1 | 1 | 1 | 1 |
| Middle | 1 | 1 | 1 | 1 | 0 | 0 | 0 | 1 | 1 | 0 | 0 | 0 | 0 | 0 | 1 | 1 |
| Lower | 1 | 1 | 1 | 1 | 1 | 1 | 0 | 0 | 0 | 0 | 0 | 1 | 1 | 0 | 0 | 0 |

FIG.53

3-2-4-6 DATA CODING

| Page | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| Top | 1 | 0 | 0 | 1 | 1 | 0 | 0 | 1 | 1 | 1 | 0 | 0 | 0 | 0 | 1 | 1 |
| Upper | 1 | 1 | 0 | 0 | 0 | 0 | 0 | 0 | 1 | 1 | 1 | 1 | 1 | 0 | 0 | 1 |
| Middle | 1 | 1 | 1 | 1 | 0 | 0 | 0 | 0 | 0 | 0 | 0 | 0 | 1 | 1 | 1 | 1 |
| Lower | 1 | 1 | 1 | 1 | 1 | 1 | 0 | 0 | 0 | 1 | 1 | 0 | 0 | 0 | 0 | 0 |

FIG.54

5-3-2-5 DATA CODING

| Page | Data | | | | | | | | | | | | | | | |
|---|---|---|---|---|---|---|---|---|---|---|---|---|---|---|---|---|
| | S0 | S1 | S2 | S3 | S4 | S5 | S6 | S7 | S8 | S9 | S10 | S11 | S12 | S13 | S14 | S15 |
| Top | 1 | 0 | 0 | 0 | 0 | 1 | 1 | 1 | 1 | 0 | 0 | 1 | 1 | 1 | 0 | 0 |
| Upper | 1 | 1 | 0 | 0 | 0 | 0 | 0 | 0 | 0 | 0 | 1 | 1 | 1 | 1 | 0 | 1 |
| Middle | 1 | 1 | 1 | 0 | 0 | 0 | 0 | 1 | 1 | 1 | 1 | 1 | 0 | 0 | 0 | 0 |
| Lower | 1 | 1 | 1 | 1 | 0 | 0 | 1 | 1 | 0 | 0 | 0 | 0 | 0 | 1 | 1 | 0 |

FIG.55

3-5-2-5 DATA CODING

| Page | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| | | | | | | | | | Data | | | | | | | |
| Top | 1 | 0 | 0 | 1 | 1 | 1 | 1 | 0 | 0 | 0 | 0 | 1 | 1 | 1 | 0 | 0 |
| Upper | 1 | 1 | 0 | 0 | 0 | 0 | 0 | 0 | 0 | 0 | 1 | 1 | 1 | 1 | 1 | 1 |
| Middle | 1 | 1 | 1 | 1 | 0 | 0 | 1 | 1 | 0 | 0 | 0 | 0 | 0 | 1 | 1 | 0 |
| Lower | 1 | 1 | 1 | 1 | 1 | 0 | 0 | 0 | 0 | 1 | 1 | 1 | 0 | 0 | 0 | 0 |

FIG.56

3-2-5-5 DATA CODING

| Page | Data | | | | | | | | | | | | | | | |
|---|---|---|---|---|---|---|---|---|---|---|---|---|---|---|---|---|
| | S0 | S1 | S2 | S3 | S4 | S5 | S6 | S7 | S8 | S9 | S10 | S11 | S12 | S13 | S14 | S15 |
| Top | 1 | 0 | 0 | 1 | 1 | 1 | 1 | 1 | 0 | 0 | 0 | 0 | 0 | 1 | 1 | 0 |
| Upper | 1 | 1 | 0 | 0 | 0 | 0 | 1 | 1 | 1 | 0 | 0 | 1 | 1 | 1 | 0 | 0 |
| Middle | 1 | 1 | 1 | 1 | 0 | 0 | 0 | 0 | 0 | 0 | 0 | 0 | 1 | 1 | 1 | 1 |
| Lower | 1 | 1 | 1 | 1 | 1 | 0 | 0 | 1 | 1 | 1 | 0 | 0 | 0 | 0 | 0 | 0 |

FIG.57

2-3-5-5 DATA CODING

| Page | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| Top | 1 | 0 | 0 | 1 | 1 | 1 | 1 | 1 | 0 | 0 | 1 | 1 | 0 | 0 | 0 | 0 |
| Upper | 1 | 1 | 0 | 0 | 0 | 1 | 1 | 1 | 1 | 0 | 0 | 0 | 0 | 1 | 1 | 0 |
| Middle | 1 | 1 | 1 | 1 | 0 | 0 | 0 | 1 | 1 | 1 | 1 | 0 | 0 | 0 | 0 | 0 |
| Lower | 1 | 1 | 1 | 1 | 1 | 1 | 0 | 0 | 0 | 0 | 0 | 0 | 0 | 0 | 1 | 1 |

FIG.58

2-3-5-5 DATA CODING

| Page | Data | | | | | | | | | | | | | | | |
|---|---|---|---|---|---|---|---|---|---|---|---|---|---|---|---|---|
| | S0 | S1 | S2 | S3 | S4 | S5 | S6 | S7 | S8 | S9 | S10 | S11 | S12 | S13 | S14 | S15 |
| Top | 1 | 0 | 0 | 1 | 1 | 1 | 1 | 1 | 0 | 0 | 0 | 0 | 0 | 1 | 1 | 0 |
| Upper | 1 | 1 | 0 | 0 | 0 | 1 | 1 | 0 | 0 | 0 | 1 | 1 | 1 | 1 | 0 | 0 |
| Middle | 1 | 1 | 1 | 1 | 0 | 0 | 0 | 0 | 0 | 0 | 0 | 0 | 1 | 1 | 1 | 1 |
| Lower | 1 | 1 | 1 | 1 | 1 | 1 | 0 | 0 | 0 | 1 | 1 | 0 | 0 | 0 | 0 | 0 |

FIG.59

2-3-5-5 DATA CODING

| Page | Data | | | | | | | | | | | | | | | | |
|---|---|---|---|---|---|---|---|---|---|---|---|---|---|---|---|---|---|
| | S0 | S1 | S2 | S3 | S4 | S5 | S6 | S7 | S8 | S9 | S10 | S11 | S12 | S13 | S14 | S15 | |
| Top | 1 | 0 | 0 | 1 | 1 | 1 | 1 | 1 | 0 | 0 | 1 | 1 | 0 | 0 | 0 | 0 | |
| Upper | 1 | 1 | 0 | 0 | 0 | 1 | 1 | 0 | 0 | 0 | 0 | 1 | 1 | 1 | 1 | 0 | |
| Middle | 1 | 1 | 1 | 1 | 0 | 0 | 0 | 0 | 0 | 1 | 1 | 1 | 1 | 0 | 0 | 0 | |
| Lower | 1 | 1 | 1 | 1 | 1 | 1 | 0 | 0 | 0 | 0 | 0 | 0 | 0 | 0 | 1 | 1 | |

FIG.60

5-4-2-4 DATA CODING

| Page | Data | | | | | | | | | | | | | | | |
|---|---|---|---|---|---|---|---|---|---|---|---|---|---|---|---|---|
| | S0 | S1 | S2 | S3 | S4 | S5 | S6 | S7 | S8 | S9 | S10 | S11 | S12 | S13 | S14 | S15 |
| Top | 1 | 0 | 0 | 0 | 0 | 0 | 1 | 1 | 1 | 1 | 1 | 1 | 0 | 0 | 0 | 1 |
| Upper | 1 | 1 | 0 | 0 | 0 | 0 | 0 | 0 | 0 | 0 | 1 | 1 | 1 | 1 | 1 | 1 |
| Middle | 1 | 1 | 1 | 0 | 0 | 1 | 1 | 1 | 0 | 0 | 0 | 0 | 0 | 0 | 1 | 1 |
| Lower | 1 | 1 | 1 | 1 | 0 | 0 | 0 | 1 | 1 | 0 | 0 | 1 | 1 | 0 | 0 | 0 |

FIG.61

4-5-2-4 DATA CODING

| Page | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| Top | 1 | 0 | 0 | 0 | 0 | 0 | 1 | 1 | 1 | 1 | 1 | 1 | 0 | 0 | 0 | 1 |
| Upper | 1 | 1 | 0 | 0 | 0 | 0 | 0 | 0 | 0 | 0 | 1 | 1 | 1 | 1 | 1 | 1 |
| Middle | 1 | 1 | 1 | 0 | 0 | 1 | 1 | 1 | 0 | 0 | 0 | 1 | 1 | 0 | 0 | 0 |
| Lower | 1 | 1 | 1 | 1 | 0 | 0 | 0 | 1 | 1 | 0 | 0 | 0 | 0 | 0 | 1 | 1 |

FIG.62

5-4-2-4 DATA CODING

| Page | S0 | S1 | S2 | S3 | S4 | S5 | S6 | S7 | Data S8 | S9 | S10 | S11 | S12 | S13 | S14 | S15 |
|---|---|---|---|---|---|---|---|---|---|---|---|---|---|---|---|---|
| Top | 1 | 0 | 0 | 0 | 0 | 1 | 1 | 1 | 1 | 0 | 0 | 0 | 0 | 1 | 1 | 1 |
| Upper | 1 | 1 | 0 | 0 | 0 | 0 | 0 | 0 | 0 | 0 | 1 | 1 | 1 | 1 | 1 | 1 |
| Middle | 1 | 1 | 1 | 0 | 0 | 0 | 0 | 1 | 1 | 1 | 1 | 0 | 0 | 0 | 0 | 1 |
| Lower | 1 | 1 | 1 | 1 | 0 | 0 | 1 | 1 | 0 | 0 | 0 | 0 | 1 | 1 | 0 | 0 |

FIG.63

2-4-5-4 DATA CODING

| Page | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| | | | | | | | Data | | | | | | | | | |
| Top | 1 | 0 | 0 | 0 | 0 | 1 | 1 | 1 | 1 | 0 | 0 | 0 | 0 | 1 | 1 | 1 |
| Upper | 1 | 1 | 0 | 0 | 1 | 1 | 1 | 1 | 0 | 0 | 1 | 1 | 0 | 0 | 0 | 0 |
| Middle | 1 | 1 | 1 | 0 | 0 | 0 | 0 | 1 | 1 | 1 | 1 | 0 | 0 | 0 | 0 | 1 |
| Lower | 1 | 1 | 1 | 1 | 1 | 1 | 0 | 0 | 0 | 0 | 0 | 0 | 0 | 0 | 1 | 1 |

FIG.64

2-4-5-4 DATA CODING

| Page | S0 | S1 | S2 | S3 | S4 | S5 | S6 | S7 | S8 | S9 | S10 | S11 | S12 | S13 | S14 | S15 |
|------|----|----|----|----|----|----|----|----|----|----|-----|-----|-----|-----|-----|-----|
| Top    | 1 | 0 | 0 | 0 | 0 | 1 | 1 | 0 | 0 | 0 | 0 | 1 | 1 | 1 | 1 | 1 |
| Upper  | 1 | 1 | 0 | 0 | 1 | 1 | 1 | 1 | 0 | 0 | 1 | 1 | 0 | 0 | 0 | 0 |
| Middle | 1 | 1 | 1 | 0 | 0 | 0 | 0 | 0 | 0 | 1 | 1 | 1 | 1 | 0 | 0 | 1 |
| Lower  | 1 | 1 | 1 | 1 | 1 | 1 | 0 | 0 | 0 | 0 | 0 | 0 | 0 | 0 | 1 | 1 |

FIG.65

2-5-4-4 DATA CODING

| Page | Data | | | | | | | | | | | | | | | |
|---|---|---|---|---|---|---|---|---|---|---|---|---|---|---|---|---|
| | S0 | S1 | S2 | S3 | S4 | S5 | S6 | S7 | S8 | S9 | S10 | S11 | S12 | S13 | S14 | S15 |
| Top | 1 | 0 | 0 | 0 | 1 | 1 | 1 | 1 | 1 | 1 | 0 | 0 | 0 | 0 | 0 | 1 |
| Upper | 1 | 1 | 0 | 0 | 0 | 0 | 1 | 0 | 1 | 1 | 1 | 0 | 0 | 1 | 1 | 1 |
| Middle | 1 | 1 | 1 | 0 | 1 | 1 | 1 | 0 | 0 | 1 | 1 | 0 | 0 | 0 | 0 | 0 |
| Lower | 1 | 1 | 1 | 1 | 1 | 1 | 0 | 0 | 0 | 0 | 0 | 0 | 0 | 0 | 1 | 1 |

FIG.66

2-5-4-4 DATA CODING

| Page | Data | | | | | | | | | | | | | | | |
|---|---|---|---|---|---|---|---|---|---|---|---|---|---|---|---|---|
| | S0 | S1 | S2 | S3 | S4 | S5 | S6 | S7 | S8 | S9 | S10 | S11 | S12 | S13 | S14 | S15 |
| Top | 1 | 0 | 0 | 0 | 1 | 1 | 1 | 1 | 1 | 1 | 0 | 0 | 0 | 0 | 0 | 1 |
| Upper | 1 | 1 | 0 | 0 | 0 | 0 | 0 | 1 | 1 | 0 | 0 | 0 | 1 | 1 | 1 | 1 |
| Middle | 1 | 1 | 1 | 0 | 0 | 1 | 1 | 1 | 0 | 0 | 0 | 1 | 1 | 0 | 0 | 0 |
| Lower | 1 | 1 | 1 | 1 | 1 | 1 | 0 | 0 | 0 | 0 | 0 | 0 | 0 | 0 | 1 | 1 |

FIG.67

2-5-4-4 DATA CODING

| Page | | | | | | | | Data | | | | | | | | |
|---|---|---|---|---|---|---|---|---|---|---|---|---|---|---|---|---|
| | S0 | S1 | S2 | S3 | S4 | S5 | S6 | S7 | S8 | S9 | S10 | S11 | S12 | S13 | S14 | S15 |
| Top | 1 | 0 | 0 | 1 | 1 | 1 | 1 | 0 | 0 | 0 | 0 | 0 | 0 | 1 | 1 | 1 |
| Upper | 1 | 1 | 0 | 0 | 0 | 0 | 0 | 0 | 0 | 0 | 1 | 1 | 1 | 1 | 1 | 1 |
| Middle | 1 | 1 | 1 | 1 | 0 | 0 | 1 | 0 | 0 | 0 | 0 | 0 | 1 | 1 | 0 | 0 |
| Lower | 1 | 1 | 1 | 1 | 1 | 0 | 0 | 0 | 0 | 1 | 1 | 0 | 0 | 0 | 0 | 1 |

FIG.68

1-5-4-5 DATA CODING

| Page | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| Top | 1 | 0 | 0 | 0 | 0 | 1 | 1 | 1 | 1 | 1 | 0 | 0 | 0 | 1 | 1 | 0 |
| Upper | 1 | 1 | 0 | 0 | 1 | 1 | 0 | 0 | 0 | 0 | 0 | 0 | 1 | 1 | 1 | 1 |
| Middle | 1 | 1 | 1 | 0 | 0 | 0 | 0 | 1 | 1 | 0 | 0 | 1 | 1 | 1 | 0 | 0 |
| Lower | 1 | 1 | 1 | 1 | 1 | 1 | 1 | 1 | 0 | 0 | 0 | 0 | 0 | 0 | 0 | 0 |

FIG.69

1-4-5-5 DATA CODING

| Page | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| | | | | | | | Data | | | | | | | | | |
| Top | 1 | 0 | 0 | 0 | 0 | 1 | 1 | 1 | 1 | 1 | 0 | 0 | 1 | 1 | 0 | 0 |
| Upper | 1 | 1 | 0 | 0 | 1 | 1 | 0 | 0 | 0 | 0 | 0 | 1 | 1 | 1 | 0 | 0 |
| Middle | 1 | 1 | 1 | 0 | 0 | 0 | 0 | 1 | 1 | 0 | 0 | 0 | 0 | 1 | 1 | 1 |
| Lower | 1 | 1 | 1 | 1 | 1 | 1 | 1 | 1 | 0 | 0 | 0 | 0 | 0 | 0 | 0 | 0 |

FIG.70

1-5-5-4 DATA CODING

| Page | Data | | | | | | | | | | | | | | | |
|---|---|---|---|---|---|---|---|---|---|---|---|---|---|---|---|---|
| | S0 | S1 | S2 | S3 | S4 | S5 | S6 | S7 | S8 | S9 | S10 | S11 | S12 | S13 | S14 | S15 |
| Top | 1 | 0 | 0 | 0 | 0 | 1 | 1 | 1 | 1 | 1 | 1 | 0 | 0 | 0 | 0 | 1 |
| Upper | 1 | 1 | 0 | 0 | 1 | 1 | 0 | 0 | 0 | 1 | 1 | 1 | 1 | 0 | 0 | 0 |
| Middle | 1 | 1 | 1 | 0 | 0 | 0 | 0 | 1 | 1 | 1 | 0 | 0 | 1 | 1 | 0 | 0 |
| Lower | 1 | 1 | 1 | 1 | 1 | 1 | 1 | 1 | 0 | 0 | 0 | 0 | 0 | 0 | 0 | 0 |

FIG.71

1-4-5-5 DATA CODING

| Page | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| Top | 1 | 0 | 0 | 0 | 0 | 1 | 1 | 1 | 1 | 1 | 0 | 0 | 1 | 1 | 0 | 0 |
| Upper | 1 | 1 | 0 | 0 | 1 | 1 | 0 | 0 | 0 | 1 | 1 | 1 | 1 | 0 | 0 | 0 |
| Middle | 1 | 1 | 1 | 0 | 0 | 0 | 0 | 1 | 1 | 1 | 1 | 0 | 0 | 0 | 0 | 1 |
| Lower | 1 | 1 | 1 | 1 | 1 | 1 | 1 | 1 | 0 | 0 | 0 | 0 | 0 | 0 | 0 | 0 |

Data

FIG.72

1-5-5-4 DATA CODING

| Page | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| Top | 1 | 0 | 0 | 0 | 0 | 1 | 1 | 1 | 1 | 0 | 0 | 0 | 0 | 1 | 1 | 1 |
| Upper | 1 | 1 | 0 | 0 | 1 | 1 | 0 | 0 | 0 | 0 | 0 | 1 | 1 | 1 | 1 | 0 |
| Middle | 1 | 1 | 1 | 0 | 0 | 0 | 0 | 1 | 1 | 1 | 0 | 0 | 1 | 1 | 0 | 0 |
| Lower | 1 | 1 | 1 | 1 | 1 | 1 | 1 | 1 | 0 | 0 | 0 | 0 | 0 | 0 | 0 | 0 |

FIG.73

1-5-4-5 DATA CODING

| Page | S0 | S1 | S2 | S3 | S4 | S5 | S6 | S7 | S8 | S9 | S10 | S11 | S12 | S13 | S14 | S15 |
|------|----|----|----|----|----|----|----|----|----|----|----|----|----|----|----|----|
| Top | 1 | 0 | 0 | 0 | 0 | 1 | 1 | 1 | 1 | 0 | 0 | 1 | 1 | 1 | 0 | 0 |
| Upper | 1 | 1 | 0 | 0 | 1 | 1 | 0 | 0 | 0 | 0 | 0 | 0 | 1 | 1 | 1 | 1 |
| Middle | 1 | 1 | 1 | 0 | 0 | 0 | 0 | 1 | 1 | 1 | 0 | 0 | 0 | 1 | 1 | 0 |
| Lower | 1 | 1 | 1 | 1 | 1 | 1 | 1 | 1 | 0 | 0 | 0 | 0 | 0 | 0 | 0 | 0 |

FIG.74

1-5-5-4 DATA CODING

| Page | S0 | S1 | S2 | S3 | S4 | S5 | S6 | S7 | S8 | S9 | S10 | S11 | S12 | S13 | S14 | S15 |
|------|----|----|----|----|----|----|----|----|----|----|-----|-----|-----|-----|-----|-----|
| Top | 1 | 0 | 0 | 1 | 1 | 1 | 0 | 0 | 0 | 0 | 0 | 0 | 1 | 1 | 1 | 1 |
| Upper | 1 | 1 | 0 | 0 | 0 | 1 | 1 | 0 | 0 | 0 | 1 | 1 | 1 | 1 | 0 | 0 |
| Middle | 1 | 1 | 1 | 1 | 0 | 0 | 0 | 0 | 0 | 1 | 1 | 0 | 0 | 1 | 1 | 0 |
| Lower | 1 | 1 | 1 | 1 | 1 | 1 | 1 | 1 | 0 | 0 | 0 | 0 | 0 | 0 | 0 | 0 |

FIG.75

1-5-4-5 DATA CODING

| Page | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| Top | 1 | 0 | 0 | 1 | 1 | 1 | 0 | 0 | 0 | 0 | 1 | 1 | 1 | 1 | 0 | 0 |
| Upper | 1 | 1 | 0 | 0 | 0 | 1 | 1 | 0 | 0 | 0 | 0 | 0 | 1 | 1 | 1 | 1 |
| Middle | 1 | 1 | 1 | 1 | 0 | 0 | 0 | 0 | 0 | 1 | 1 | 0 | 0 | 1 | 1 | 0 |
| Lower | 1 | 1 | 1 | 1 | 1 | 1 | 1 | 1 | 0 | 0 | 0 | 0 | 0 | 0 | 0 | 0 |

FIG.76

1-4-5-5 DATA CODING

| Page | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| Top | 1 | 0 | 0 | 1 | 1 | 1 | 0 | 0 | 0 | 0 | 0 | 1 | 1 | 1 | 1 | 0 |
| Upper | 1 | 1 | 0 | 0 | 0 | 1 | 1 | 0 | 0 | 1 | 1 | 1 | 1 | 0 | 0 | 0 |
| Middle | 1 | 1 | 1 | 1 | 0 | 0 | 0 | 0 | 0 | 0 | 1 | 1 | 0 | 0 | 1 | 0 |
| Lower | 1 | 1 | 1 | 1 | 1 | 1 | 1 | 1 | 0 | 0 | 0 | 0 | 0 | 0 | 0 | 0 |

FIG.77

1-4-5-5 DATA CODING

| Page | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| | | | | | | | | | | | | | Data | | | |
| Top | 1 | 0 | 0 | 1 | 1 | 1 | 0 | 0 | 0 | 1 | 1 | 1 | 1 | 0 | 0 | 0 |
| Upper | 1 | 1 | 0 | 0 | 0 | 1 | 1 | 0 | 0 | 0 | 0 | 1 | 1 | 1 | 1 | 0 |
| Middle | 1 | 1 | 1 | 1 | 0 | 0 | 0 | 0 | 0 | 0 | 1 | 0 | 0 | 0 | 1 | 1 |
| Lower | 1 | 1 | 1 | 1 | 1 | 1 | 1 | 1 | 0 | 0 | 0 | 0 | 0 | 0 | 0 | 0 |

FIG.78

1-4-5-5 DATA CODING

| Page | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| | | | | | | | | | Data | | | | | | | |
| Top | 1 | 0 | 0 | 1 | 1 | 0 | 0 | 1 | 1 | 1 | 1 | 1 | 0 | 0 | 0 | 0 |
| Upper | 1 | 1 | 0 | 0 | 0 | 0 | 1 | 1 | 1 | 1 | 0 | 0 | 0 | 1 | 1 | 0 |
| Middle | 1 | 1 | 1 | 1 | 0 | 0 | 0 | 0 | 0 | 1 | 1 | 0 | 0 | 0 | 1 | 1 |
| Lower | 1 | 1 | 1 | 1 | 1 | 1 | 1 | 1 | 0 | 0 | 0 | 0 | 0 | 0 | 0 | 0 |

FIG.79

1-4-5-5 DATA CODING

| Page | S0 | S1 | S2 | S3 | S4 | S5 | S6 | S7 | Data S8 | S9 | S10 | S11 | S12 | S13 | S14 | S15 |
|---|---|---|---|---|---|---|---|---|---|---|---|---|---|---|---|---|
| Top | 1 | 0 | 0 | 1 | 1 | 0 | 0 | 1 | 1 | 1 | 1 | 1 | 0 | 0 | 0 | 0 |
| Upper | 1 | 1 | 0 | 0 | 0 | 0 | 1 | 1 | 1 | 0 | 0 | 1 | 1 | 1 | 0 | 0 |
| Middle | 1 | 1 | 1 | 1 | 0 | 0 | 0 | 0 | 0 | 0 | 1 | 1 | 1 | 0 | 0 | 1 |
| Lower | 1 | 1 | 1 | 1 | 1 | 1 | 1 | 1 | 0 | 0 | 0 | 0 | 0 | 0 | 0 | 0 |

FIG.80

3-5-4-3 DATA CODING

| Page | S0 | S1 | S2 | S3 | S4 | S5 | S6 | S7 | Data S8 | S9 | S10 | S11 | S12 | S13 | S14 | S15 |
|---|---|---|---|---|---|---|---|---|---|---|---|---|---|---|---|---|
| Top | 1 | 0 | 0 | 0 | 0 | 1 | 1 | 1 | 1 | 1 | 1 | 1 | 0 | 0 | 0 | 0 |
| Upper | 1 | 1 | 0 | 0 | 1 | 1 | 1 | 1 | 0 | 0 | 0 | 0 | 0 | 0 | 1 | 1 |
| Middle | 1 | 1 | 1 | 0 | 0 | 0 | 0 | 1 | 1 | 1 | 0 | 0 | 0 | 1 | 1 | 0 |
| Lower | 1 | 1 | 1 | 1 | 1 | 1 | 0 | 0 | 0 | 1 | 1 | 0 | 0 | 0 | 0 | 0 |

FIG.81

3-4-5-3 DATA CODING

| Page | | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|---|
| | Data | | | | | | | | | | | | | | | | |
| Top | | 1 | 0 | 0 | 0 | 0 | 1 | 1 | 1 | 1 | 1 | 1 | 1 | 0 | 0 | 0 | 0 |
| Upper | | 1 | 1 | 0 | 0 | 1 | 1 | 1 | 1 | 0 | 0 | 0 | 0 | 0 | 1 | 1 | 0 |
| Middle | | 1 | 1 | 1 | 0 | 0 | 0 | 0 | 1 | 1 | 1 | 0 | 0 | 0 | 0 | 1 | 1 |
| Lower | | 1 | 1 | 1 | 1 | 1 | 1 | 0 | 0 | 0 | 1 | 1 | 0 | 0 | 0 | 0 | 0 |

FIG. 82

3-5-3-4 DATA CODING

| Page | S0 | S1 | S2 | S3 | S4 | S5 | S6 | S7 | S8 | S9 | S10 | S11 | S12 | S13 | S14 | S15 |
|------|----|----|----|----|----|----|----|----|----|----|----|----|----|----|----|----|
| Top | 1 | 0 | 0 | 0 | 0 | 1 | 1 | 1 | 0 | 0 | 0 | 0 | 1 | 1 | 1 | 1 |
| Upper | 1 | 1 | 0 | 0 | 1 | 1 | 1 | 1 | 1 | 1 | 0 | 0 | 0 | 0 | 0 | 0 |
| Middle | 1 | 1 | 1 | 0 | 0 | 0 | 0 | 1 | 1 | 0 | 0 | 1 | 1 | 1 | 0 | 0 |
| Lower | 1 | 1 | 1 | 1 | 1 | 1 | 0 | 0 | 0 | 0 | 0 | 0 | 0 | 1 | 1 | 0 |

FIG.83

3-4-3-5 DATA CODING

| Page | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| Top | 1 | 0 | 0 | 0 | 0 | 1 | 1 | 1 | 0 | 0 | 0 | 1 | 1 | 1 | 1 | 0 |
| Upper | 1 | 1 | 0 | 0 | 1 | 1 | 1 | 1 | 1 | 1 | 0 | 0 | 0 | 0 | 0 | 0 |
| Middle | 1 | 1 | 1 | 0 | 0 | 0 | 0 | 1 | 1 | 0 | 0 | 0 | 0 | 1 | 1 | 0 |
| Lower | 1 | 1 | 1 | 1 | 1 | 1 | 0 | 0 | 0 | 0 | 0 | 0 | 1 | 1 | 0 | 0 |

FIG.84

3-4-5-3 DATA CODING

| Page | Data | | | | | | | | | | | | | | | | |
|---|---|---|---|---|---|---|---|---|---|---|---|---|---|---|---|---|---|
| | S0 | S1 | S2 | S3 | S4 | S5 | S6 | S7 | S8 | S9 | S10 | S11 | S12 | S13 | S14 | S15 |
| Top | 1 | 0 | 0 | 0 | 0 | 1 | 1 | 1 | 1 | 1 | 1 | 1 | 0 | 0 | 0 | 0 |
| Upper | 1 | 1 | 0 | 0 | 1 | 1 | 1 | 0 | 0 | 0 | 0 | 1 | 1 | 1 | 0 | 0 |
| Middle | 1 | 1 | 1 | 0 | 0 | 0 | 0 | 0 | 0 | 1 | 1 | 1 | 1 | 0 | 0 | 1 |
| Lower | 1 | 1 | 1 | 1 | 1 | 1 | 0 | 0 | 1 | 1 | 0 | 0 | 0 | 0 | 0 | 0 |

FIG.85

3-4-3-5 DATA CODING

| Page | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| Top | 1 | 0 | 0 | 0 | 0 | 1 | 1 | 0 | 0 | 1 | 1 | 1 | 1 | 1 | 0 | 0 |
| Upper | 1 | 1 | 0 | 0 | 1 | 1 | 1 | 1 | 1 | 1 | 0 | 0 | 0 | 0 | 0 | 0 |
| Middle | 1 | 1 | 1 | 0 | 0 | 0 | 0 | 0 | 1 | 1 | 1 | 1 | 0 | 0 | 0 | 1 |
| Lower | 1 | 1 | 1 | 1 | 1 | 1 | 0 | 0 | 0 | 0 | 0 | 1 | 1 | 0 | 0 | 0 |

FIG. 86

3-3-5-4 DATA CODING

| Page | S0 | S1 | S2 | S3 | S4 | S5 | S6 | S7 | Data S8 | S9 | S10 | S11 | S12 | S13 | S14 | S15 |
|---|---|---|---|---|---|---|---|---|---|---|---|---|---|---|---|---|
| Top | 1 | 0 | 0 | 0 | 0 | 1 | 1 | 0 | 0 | 0 | 0 | 1 | 1 | 1 | 1 | 1 |
| Upper | 1 | 1 | 0 | 0 | 1 | 1 | 1 | 1 | 0 | 0 | 1 | 1 | 0 | 0 | 0 | 0 |
| Middle | 1 | 1 | 1 | 0 | 0 | 0 | 0 | 0 | 0 | 1 | 1 | 1 | 1 | 1 | 0 | 0 |
| Lower | 1 | 1 | 1 | 1 | 1 | 1 | 0 | 0 | 0 | 0 | 0 | 0 | 0 | 1 | 1 | 0 |

FIG.87

3-3-5-4 DATA CODING

| Page | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| Top | 1 | 0 | 0 | 0 | 1 | 1 | 1 | 1 | 0 | 0 | 0 | 0 | 0 | 1 | 1 | 1 |
| Upper | 1 | 1 | 0 | 0 | 0 | 0 | 0 | 1 | 1 | 0 | 0 | 1 | 1 | 1 | 1 | 0 |
| Middle | 1 | 1 | 1 | 0 | 0 | 1 | 1 | 1 | 1 | 1 | 0 | 0 | 0 | 0 | 0 | 0 |
| Lower | 1 | 1 | 1 | 1 | 1 | 1 | 0 | 0 | 0 | 0 | 0 | 0 | 1 | 1 | 0 | 0 |

FIG.88

4-5-3-3 DATA CODING

| Page | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| | | | | | | | | | Data | | | | | | | |
| Top | 1 | 0 | 0 | 1 | 1 | 1 | 1 | 1 | 1 | 1 | 0 | 0 | 0 | 0 | 0 | 0 |
| Upper | 1 | 1 | 0 | 0 | 0 | 0 | 0 | 1 | 1 | 1 | 1 | 1 | 1 | 0 | 0 | 0 |
| Middle | 1 | 1 | 1 | 1 | 0 | 0 | 1 | 1 | 0 | 0 | 0 | 0 | 1 | 1 | 0 | 0 |
| Lower | 1 | 1 | 1 | 1 | 1 | 0 | 0 | 0 | 0 | 1 | 1 | 0 | 0 | 0 | 0 | 1 |

FIG.89

3-5-4-3 DATA CODING

| Page | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| Top | 1 | 0 | 0 | 1 | 1 | 1 | 1 | 1 | 1 | 1 | 0 | 0 | 0 | 0 | 0 | 0 |
| Upper | 1 | 1 | 0 | 0 | 0 | 0 | 0 | 1 | 1 | 1 | 1 | 0 | 0 | 0 | 1 | 1 |
| Middle | 1 | 1 | 1 | 1 | 0 | 0 | 1 | 1 | 0 | 0 | 0 | 0 | 0 | 1 | 1 | 0 |
| Lower | 1 | 1 | 1 | 1 | 1 | 0 | 0 | 0 | 0 | 1 | 1 | 1 | 0 | 0 | 0 | 0 |

FIG.90

3-4-5-3 DATA CODING

| Page | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| | | | | | | | | Data | | | | | | | | |
| Top | 1 | 0 | 0 | 1 | 1 | 1 | 1 | 1 | 1 | 1 | 0 | 0 | 0 | 0 | 0 | 0 |
| Upper | 1 | 1 | 0 | 0 | 0 | 0 | 0 | 1 | 1 | 1 | 1 | 0 | 0 | 1 | 1 | 0 |
| Middle | 1 | 1 | 1 | 1 | 0 | 0 | 1 | 1 | 0 | 0 | 0 | 0 | 0 | 0 | 1 | 1 |
| Lower | 1 | 1 | 1 | 1 | 1 | 0 | 0 | 0 | 0 | 1 | 1 | 1 | 0 | 0 | 0 | 0 |

FIG.91

3-3-4-5 DATA CODING

| Page | Data | | | | | | | | | | | | | | | |
|---|---|---|---|---|---|---|---|---|---|---|---|---|---|---|---|---|
| | S0 | S1 | S2 | S3 | S4 | S5 | S6 | S7 | S8 | S9 | S10 | S11 | S12 | S13 | S14 | S15 |
| Top | 1 | 0 | 0 | 1 | 1 | 1 | 1 | 1 | 0 | 0 | 0 | 0 | 1 | 1 | 0 | 0 |
| Upper | 1 | 1 | 0 | 0 | 0 | 0 | 1 | 1 | 1 | 0 | 0 | 0 | 0 | 1 | 1 | 1 |
| Middle | 1 | 1 | 1 | 1 | 0 | 0 | 0 | 0 | 0 | 0 | 0 | 1 | 1 | 1 | 1 | 1 |
| Lower | 1 | 1 | 1 | 1 | 1 | 0 | 0 | 1 | 1 | 1 | 0 | 0 | 0 | 0 | 0 | 0 |

FIG.92

3-3-4-5 DATA CODING

| Page | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| | | | | | | | | Data | | | | | | | | |
| Top | 1 | 0 | 0 | 1 | 1 | 1 | 0 | 0 | 0 | 1 | 1 | 1 | 1 | 0 | 0 | 0 |
| Upper | 1 | 1 | 0 | 0 | 0 | 0 | 0 | 0 | 1 | 1 | 1 | 1 | 0 | 0 | 1 | 1 |
| Middle | 1 | 1 | 1 | 1 | 0 | 0 | 0 | 0 | 1 | 0 | 0 | 1 | 1 | 1 | 1 | 0 |
| Lower | 1 | 1 | 1 | 1 | 0 | 0 | 0 | 1 | 1 | 1 | 0 | 0 | 0 | 0 | 0 | 0 |

FIG.93

3-3-4-5 DATA CODING

| Page | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| Top | 1 | 0 | 0 | 1 | 1 | 1 | 1 | 1 | 0 | 0 | 1 | 1 | 0 | 0 | 0 | 0 |
| Upper | 1 | 1 | 0 | 0 | 0 | 1 | 1 | 1 | 1 | 0 | 0 | 0 | 0 | 0 | 1 | 1 |
| Middle | 1 | 1 | 1 | 1 | 0 | 0 | 0 | 1 | 1 | 1 | 1 | 0 | 0 | 0 | 0 | 0 |
| Lower | 1 | 1 | 1 | 1 | 1 | 1 | 0 | 0 | 0 | 0 | 0 | 0 | 0 | 1 | 1 | 0 |

FIG.94

3-4-5-3 DATA CODING

| Page | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| Top | 1 | 0 | 0 | 1 | 1 | 1 | 1 | 1 | 1 | 1 | 0 | 0 | 0 | 0 | 0 | 0 |
| Upper | 1 | 1 | 0 | 0 | 0 | 1 | 1 | 0 | 0 | 1 | 1 | 1 | 0 | 0 | 0 | 0 |
| Middle | 1 | 1 | 1 | 1 | 0 | 0 | 0 | 0 | 1 | 1 | 1 | 0 | 0 | 0 | 0 | 1 |
| Lower | 1 | 1 | 1 | 1 | 1 | 1 | 0 | 0 | 0 | 0 | 0 | 0 | 1 | 1 | 0 | 0 |

FIG.95

3-3-5-4 DATA CODING

| Page | Data | | | | | | | | | | | | | | | |
|---|---|---|---|---|---|---|---|---|---|---|---|---|---|---|---|---|
| | S0 | S1 | S2 | S3 | S4 | S5 | S6 | S7 | S8 | S9 | S10 | S11 | S12 | S13 | S14 | S15 |
| Top | 1 | 0 | 0 | 1 | 1 | 1 | 1 | 0 | 0 | 0 | 0 | 0 | 0 | 1 | 1 | 1 |
| Upper | 1 | 1 | 0 | 0 | 0 | 1 | 1 | 1 | 1 | 0 | 0 | 0 | 1 | 1 | 0 | 0 |
| Middle | 1 | 1 | 1 | 1 | 0 | 0 | 0 | 0 | 0 | 0 | 0 | 1 | 1 | 1 | 1 | 0 |
| Lower | 1 | 1 | 1 | 1 | 1 | 1 | 0 | 0 | 1 | 1 | 0 | 0 | 0 | 0 | 0 | 0 |

FIG.96

3-3-4-5 DATA CODING

| Page | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| | | | | | | | | Data | | | | | | | | |
| Top | 1 | 0 | 0 | 1 | 1 | 0 | 0 | 0 | 0 | 1 | 1 | 1 | 1 | 1 | 0 | 0 |
| Upper | 1 | 1 | 0 | 0 | 0 | 0 | 0 | 0 | 1 | 1 | 0 | 0 | 1 | 1 | 1 | 1 |
| Middle | 1 | 1 | 1 | 1 | 0 | 0 | 0 | 1 | 1 | 1 | 1 | 0 | 0 | 0 | 0 | 0 |
| Lower | 1 | 1 | 1 | 1 | 1 | 1 | 0 | 0 | 0 | 0 | 0 | 0 | 0 | 1 | 1 | 0 |

FIG.97

4-3-4-4 DATA CODING

| Page | Data | | | | | | | | | | | | | | | |
|---|---|---|---|---|---|---|---|---|---|---|---|---|---|---|---|---|
| | S0 | S1 | S2 | S3 | S4 | S5 | S6 | S7 | S8 | S9 | S10 | S11 | S12 | S13 | S14 | S15 |
| Top | 1 | 0 | 0 | 0 | 0 | 0 | 0 | 1 | 1 | 1 | 1 | 1 | 1 | 0 | 0 | 1 |
| Upper | 1 | 1 | 0 | 0 | 0 | 0 | 1 | 1 | 0 | 0 | 0 | 0 | 1 | 1 | 1 | 1 |
| Middle | 1 | 1 | 1 | 0 | 0 | 1 | 1 | 1 | 1 | 1 | 0 | 0 | 0 | 0 | 0 | 0 |
| Lower | 1 | 1 | 1 | 1 | 0 | 0 | 0 | 0 | 0 | 1 | 1 | 0 | 0 | 0 | 1 | 1 |

FIG.98

3-4-4-4 DATA CODING

| Page | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| | | | | | | | Data | | | | | | | | | |
| Top | 1 | 0 | 0 | 0 | 0 | 0 | 1 | 1 | 1 | 1 | 1 | 1 | 0 | 0 | 0 | 1 |
| Upper | 1 | 1 | 0 | 0 | 1 | 1 | 1 | 1 | 0 | 0 | 0 | 0 | 0 | 0 | 1 | 1 |
| Middle | 1 | 1 | 1 | 0 | 0 | 0 | 0 | 0 | 0 | 1 | 1 | 0 | 0 | 1 | 1 | 1 |
| Lower | 1 | 1 | 1 | 1 | 1 | 0 | 0 | 1 | 1 | 1 | 0 | 0 | 0 | 0 | 0 | 0 |

FIG.99

3-4-4-4 DATA CODING

| Page | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| | | | | | | | | | Data | | | | | | | |
| Top | 1 | 0 | 0 | 0 | 1 | 1 | 1 | 1 | 1 | 1 | 0 | 0 | 0 | 0 | 0 | 1 |
| Upper | 1 | 1 | 0 | 0 | 0 | 0 | 0 | 0 | 1 | 1 | 1 | 1 | 0 | 0 | 1 | 1 |
| Middle | 1 | 1 | 1 | 0 | 0 | 1 | 1 | 0 | 0 | 0 | 0 | 0 | 0 | 1 | 1 | 1 |
| Lower | 1 | 1 | 1 | 1 | 1 | 1 | 0 | 0 | 0 | 1 | 1 | 0 | 0 | 0 | 0 | 0 |

FIG.100

4-3-4-4 DATA CODING

| Page | S0 | S1 | S2 | S3 | S4 | S5 | S6 | S7 | S8 | S9 | S10 | S11 | S12 | S13 | S14 | S15 |
|------|----|----|----|----|----|----|----|----|----|----|-----|-----|-----|-----|-----|-----|
| Top    | 1 | 0 | 0 | 1 | 1 | 1 | 0 | 0 | 0 | 0 | 0  | 0 | 1 | 1 | 1 | 1 |
| Upper  | 1 | 1 | 0 | 0 | 0 | 0 | 0 | 0 | 1 | 1 | 1  | 0 | 0 | 1 | 1 | 1 |
| Middle | 1 | 1 | 1 | 1 | 0 | 0 | 0 | 0 | 0 | 0 | 1  | 1 | 1 | 1 | 0 | 0 |
| Lower  | 1 | 1 | 1 | 1 | 1 | 0 | 0 | 1 | 1 | 0 | 0  | 0 | 0 | 0 | 0 | 1 |

FIG.101

3-4-4-4 DATA CODING

| Page | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| | | | | | | Data | | | | | | | | | | |
| Top | 1 | 0 | 0 | 1 | 1 | 1 | 1 | 1 | 1 | 0 | 0 | 0 | 0 | 0 | 0 | 1 |
| Upper | 1 | 1 | 0 | 0 | 0 | 1 | 1 | 0 | 0 | 0 | 0 | 0 | 1 | 1 | 1 | 1 |
| Middle | 1 | 1 | 1 | 1 | 0 | 0 | 0 | 0 | 1 | 1 | 0 | 0 | 0 | 0 | 1 | 1 |
| Lower | 1 | 1 | 1 | 1 | 1 | 1 | 0 | 0 | 0 | 0 | 0 | 1 | 1 | 0 | 0 | 0 |

FIG.102

3-4-4-4 DATA CODING

| Page | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| Top | 1 | 0 | 0 | 1 | 1 | 0 | 0 | 0 | 0 | 0 | 0 | 1 | 1 | 1 | 1 | 1 |
| Upper | 1 | 1 | 0 | 0 | 0 | 0 | 0 | 0 | 1 | 1 | 1 | 1 | 1 | 0 | 0 | 1 |
| Middle | 1 | 1 | 1 | 1 | 0 | 0 | 0 | 1 | 0 | 0 | 0 | 0 | 0 | 0 | 1 | 1 |
| Lower | 1 | 1 | 1 | 1 | 1 | 1 | 0 | 0 | 0 | 0 | 1 | 1 | 0 | 0 | 0 | 0 |

3-4-4-4 DATA CODING

| Page | Data | | | | | | | | | | | | | | | |
|---|---|---|---|---|---|---|---|---|---|---|---|---|---|---|---|---|
| | S0 | S1 | S2 | S3 | S4 | S5 | S6 | S7 | S8 | S9 | S10 | S11 | S12 | S13 | S14 | S15 |
| Top | 1 | 0 | 0 | 0 | 0 | 1 | 1 | 1 | 1 | 1 | 1 | 0 | 0 | 0 | 0 | 1 |
| Upper | 1 | 1 | 0 | 0 | 1 | 1 | 1 | 0 | 0 | 0 | 0 | 0 | 0 | 1 | 1 | 1 |
| Middle | 1 | 1 | 1 | 0 | 0 | 0 | 0 | 0 | 0 | 1 | 1 | 1 | 0 | 0 | 1 | 1 |
| Lower | 1 | 1 | 1 | 1 | 1 | 1 | 0 | 0 | 1 | 1 | 0 | 0 | 0 | 0 | 0 | 0 |

3-4-4-4 DATA CODING

| Page | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| Top | 1 | 0 | 0 | 1 | 1 | 1 | 1 | 0 | 0 | 0 | 0 | 0 | 0 | 1 | 1 | 1 |
| Upper | 1 | 1 | 0 | 0 | 0 | 0 | 0 | 0 | 1 | 1 | 0 | 0 | 1 | 1 | 1 | 1 |
| Middle | 1 | 1 | 1 | 1 | 0 | 0 | 1 | 1 | 1 | 0 | 0 | 0 | 0 | 0 | 0 | 1 |
| Lower | 1 | 1 | 1 | 1 | 1 | 0 | 0 | 0 | 0 | 0 | 0 | 1 | 1 | 1 | 0 | 0 |

FIG.105

4-4-3-4 DATA CODING

| Page | Data | | | | | | | | | | | | | | | |
|---|---|---|---|---|---|---|---|---|---|---|---|---|---|---|---|---|
| | S0 | S1 | S2 | S3 | S4 | S5 | S6 | S7 | S8 | S9 | S10 | S11 | S12 | S13 | S14 | S15 |
| Top | 1 | 0 | 0 | 0 | 0 | 0 | 0 | 1 | 1 | 0 | 0 | 1 | 1 | 1 | 1 | 1 |
| Upper | 1 | 1 | 0 | 0 | 0 | 0 | 1 | 1 | 1 | 1 | 1 | 1 | 0 | 0 | 0 | 0 |
| Middle | 1 | 1 | 1 | 0 | 0 | 1 | 1 | 1 | 0 | 0 | 0 | 0 | 0 | 0 | 1 | 1 |
| Lower | 1 | 1 | 1 | 1 | 0 | 0 | 0 | 0 | 0 | 0 | 1 | 1 | 1 | 0 | 0 | 1 |

FIG.106

4-4-3-4 DATA CODING

| Page | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| Top | 1 | 0 | 0 | 0 | 0 | 0 | 0 | 1 | 1 | 1 | 0 | 0 | 1 | 1 | 1 | 1 |
| Upper | 1 | 1 | 0 | 0 | 0 | 1 | 1 | 1 | 1 | 1 | 1 | 0 | 0 | 0 | 0 | 0 |
| Middle | 1 | 1 | 1 | 0 | 0 | 0 | 0 | 0 | 0 | 1 | 1 | 1 | 1 | 0 | 0 | 1 |
| Lower | 1 | 1 | 1 | 1 | 0 | 0 | 1 | 1 | 0 | 0 | 0 | 0 | 0 | 0 | 1 | 1 |

Data

FIG.107

NONVOLATILE MEMORY MULTILEVEL CELL PROGRAMMING

CROSS REFERENCE TO RELATED APPLICATIONS

This application is based upon and claims the benefit of priority from the prior Japanese Patent Applications No 2019-210823 filed on Nov. 21, 2019, No 2020-113206 filed on Jun. 30, 2020, and No. 2020-144847 filed on Aug. 28, 2020, the entire contents of which are incorporated herein by reference.

FIELD

Embodiments described herein relate generally to a memory system.

BACKGROUND

In a NAND flash memory, multi-level data configured of multiple bits is generally written into memory cells, and a triple level cell (TLC) technology for writing multi-level data configured of three bits into memory cells has been put into practical use. In the future, a quadruple level cell (QLC) technology for writing multi-level data configured of four bits will be the mainstream.

In the QLC, in order to avoid inter-cell interference, a method has been studied in which 4-bit data is written simultaneously to the first memory cell, 4-bit data also is written simultaneously to the adjacent cells similarly, and then 4-bit data is rewritten simultaneously to the first memory cell. However, in this method, it is necessary to hold 4-bit data in the write buffer in the memory controller until rewriting is completed.

In recent years, the NAND memory has been made three-dimensional, and there is a problem that the memory capacity of the required write buffer increases, and the cost of the memory controller incorporating the write buffer increases. For this reason, even in a three-dimensional nonvolatile memory, a measure for reducing the write buffer amount of the memory controller is necessary.

As the measure for reducing the write buffer amount of the memory controller while avoiding the inter-cell interference, a method is known in which when each bit of data is written to the memory cell, it is not necessary to rewrite all bit data by writing the data in two stages in a dividing manner.

However, this method has a problem that the bit error rate is largely biased when each bit data is written in the memory cell.

To improve the reliability of the QLC technology, it is necessary to avoid the inter-cell interference, reduce the capacity of the write buffer in the memory controller, and suppress the bias of the bit error rate at the time of writing each bit data.

BRIEF DESCRIPTION OF THE DRAWINGS

FIG. 6A is a diagram illustrating an example of data coding according to the first embodiment;

FIG. 6B is a diagram illustrating another example of the data coding according to the first embodiment;

FIG. 8A is a diagram illustrating a first example of a program order according to the first embodiment;

FIG. 8B is a diagram illustrating a second example of the program order according to the first embodiment;

FIG. 8C is a diagram illustrating a third example of the program order according to the first embodiment;

FIG. 12 is a diagram for explaining a majority processing of a plurality of read results;

FIG. 16B is a drawing illustrating an example of data coding suitable for the page read process according to the modification;

FIG. 28 is a diagram illustrating an example of 3-2-5-5 data coding;
FIG. 29 is a diagram illustrating an example of 3-2-5-5 data coding;
FIG. 30 is a diagram illustrating an example of 1-5-5-4 data coding;
FIG. 31 is a diagram illustrating an example of 1-5-4-5 data coding;
FIG. 32 is a diagram illustrating an example of 1-4-5-5 data coding;
FIG. 33 is a diagram illustrating an example of 1-5-3-6 data coding;
FIG. 34 is a diagram illustrating an example of 1-3-6-5 data coding;
FIG. 35 is a diagram illustrating an example of 1-2-6-6 data coding;
FIG. 36 is a diagram illustrating an example of 1-2-6-6 data coding;
FIG. 37 is a diagram illustrating an example of 1-2-6-6 data coding;
FIG. 38 is a diagram illustrating an example of 1-4-6-4 data coding;
FIG. 39 is a diagram illustrating an example of 1-4-4-6 data coding;
FIG. 40 is a diagram illustrating an example of 1-4-6-4 data coding;
FIG. 41 is a diagram illustrating an example of 1-4-4-6 data coding;
FIG. 42 is a diagram illustrating an example of 2-5-2-6 data coding;
FIG. 43 is a diagram illustrating an example of 2-5-2-6 data coding;
FIG. 44 is a diagram illustrating an example of 2-5-2-6 data coding;
FIG. 45 is a diagram illustrating an example of 3-3-3-6 data coding;
FIG. 46 is a diagram illustrating an example of 3-3-6-3 data coding;
FIG. 47 is a diagram illustrating an example of 2-3-4-6 data coding;
FIG. 48 is a diagram illustrating an example of 3-4-2-6 data coding;
FIG. 49 is a diagram illustrating an example of 2-3-4-6 data coding;
FIG. 50 is a diagram illustrating an example of 3-2-6-4 data coding;
FIG. 51 is a diagram illustrating an example of 3-2-4-6 data coding;
FIG. 52 is a diagram illustrating an example of 3-2-6-4 data coding;
FIG. 53 is a diagram illustrating an example of 3-4-2-6 data coding;
FIG. 54 is a diagram illustrating an example of 3-2-4-6 data coding;
FIG. 55 is a diagram illustrating an example of 5-3-2-5 data coding;
FIG. 56 is a diagram illustrating an example of 3-5-2-5 data coding;
FIG. 57 is a diagram illustrating an example of 3-2-5-5 data coding;
FIG. 58 is a diagram illustrating an example of 2-3-5-5 data coding;
FIG. 59 is a diagram illustrating an example of 2-3-5-5 data coding;
FIG. 60 is a diagram illustrating an example of 2-3-5-5 data coding;
FIG. 61 is a diagram illustrating an example of 5-4-2-4 data coding;
FIG. 62 is a diagram illustrating an example of 4-5-2-4 data coding;
FIG. 63 is a diagram illustrating an example of 5-4-2-4 data coding;
FIG. 64 is a diagram illustrating an example of 2-4-5-4 data coding;
FIG. 65 is a diagram illustrating an example of 2-4-5-4 data coding;
FIG. 66 is a diagram illustrating an example of 2-5-4-4 data coding;
FIG. 67 is a diagram illustrating an example of 2-5-4-4 data coding;
FIG. 68 is a diagram illustrating an example of 2-5-4-4 data coding;
FIG. 69 is a diagram illustrating an example of 1-5-4-5 data coding;
FIG. 70 is a diagram illustrating an example of 1-4-5-5 data coding;
FIG. 71 is a diagram illustrating an example of 1-5-5-4 data coding;
FIG. 72 is a diagram illustrating an example of 1-4-5-5 data coding;
FIG. 73 is a diagram illustrating an example of 1-5-5-4 data coding;
FIG. 74 is a diagram illustrating an example of 1-5-4-5 data coding;
FIG. 75 is a diagram illustrating an example of 1-5-5-4 data coding;
FIG. 76 is a diagram illustrating an example of 1-5-4-5 data coding;
FIG. 77 is a diagram illustrating an example of 1-4-5-5 data coding;
FIG. 78 is a diagram illustrating an example of 1-4-5-5 data coding;
FIG. 79 is a diagram illustrating an example of 1-4-5-5 data coding;
FIG. 80 is a diagram illustrating an example of 1-4-5-5 data coding;
FIG. 81 is a diagram illustrating an example of 3-5-4-3 data coding;
FIG. 82 is a diagram illustrating an example of 3-4-5-3 data coding;
FIG. 83 is a diagram illustrating an example of 3-5-3-4 data coding;
FIG. 84 is a diagram illustrating an example of 3-4-3-5 data coding;
FIG. 85 is a diagram illustrating an example of 3-4-5-3 data coding;
FIG. 86 is a diagram illustrating an example of 3-4-3-5 data coding;
FIG. 87 is a diagram illustrating an example of 3-3-5-4 data coding;
FIG. 88 is a diagram illustrating an example of 3-3-5-4 data coding;
FIG. 89 is a diagram illustrating an example of 4-5-3-3 data coding;
FIG. 90 is a diagram illustrating an example of 3-5-4-3 data coding;

FIG. 91 is a diagram illustrating an example of 3-4-5-3 data coding;

FIG. 92 is a diagram illustrating an example of 3-3-4-5 data coding;

FIG. 93 is a diagram illustrating an example of 3-3-4-5 data coding;

FIG. 94 is a diagram illustrating an example of 3-3-4-5 data coding;

FIG. 95 is a diagram illustrating an example of 3-4-5-3 data coding;

FIG. 96 is a diagram illustrating an example of 3-3-5-4 data coding;

FIG. 97 is a diagram illustrating an example of 3-3-4-5 data coding;

FIG. 98 is a diagram illustrating an example of 4-3-4-4 data coding;

FIG. 99 is a diagram illustrating an example of 3-4-4-4 data coding;

FIG. 100 is a diagram illustrating an example of 3-4-4-4 data coding;

FIG. 101 is a diagram illustrating an example of 4-3-4-4 data coding;

FIG. 102 is a diagram illustrating an example of 3-4-4-4 data coding;

FIG. 103 is a diagram illustrating an example of 3-4-4-4 data coding;

FIG. 104 is a diagram illustrating an example of 3-4-4-4 data coding;

FIG. 105 is a diagram illustrating an example of 3-4-4-4 data coding;

FIG. 106 is a diagram illustrating an example of 4-4-3-4 data coding;

FIG. 107 is a diagram illustrating an example of 4-4-3-4 data coding;

DETAILED DESCRIPTION

According to one embodiment a memory system includes:

a nonvolatile memory which includes a plurality of memory cells capable of storing 4-bit data represented by first to fourth bits by sixteen threshold regions including a first threshold region indicating an erased state in which data is erased and second to sixteenth threshold regions having a higher voltage level than that of the first threshold region and indicating a written state in which data is written; and a memory controller configured to cause the nonvolatile memory to execute a first program for writing data of the first bit, the second bit, and the fourth bit and then causes the nonvolatile memory to execute a second program for writing data of the third bit, wherein in fifteen boundaries existing between adjacent threshold regions among the first to sixteenth threshold regions, a maximum value of the number of first boundaries used for determining a value of the data of the first bit, the number of second boundaries used for determining a value of the data of the second bit, the number of third boundaries used for determining a value of the data of the third bit, and the number of fourth boundaries used for determining a value of the data of the fourth bit is five, and a second largest value is four, the memory controller is configured to cause the nonvolatile memory to execute the first program such that the threshold region in the memory cell becomes any threshold region of a seventeenth threshold region indicating an erased state in which data is erased and eighteenth to twenty-fourth threshold regions having a higher voltage level than that of the seventeenth threshold region and indicating a written state in which data is written according to the data of the first bit, the second bit, and the fourth bit, the memory controller is configured to cause the nonvolatile memory to execute the second program such that the threshold region in the memory cell becomes any threshold region in two threshold regions among the first to sixteenth threshold regions from any threshold region of the seventeenth to twenty-fourth threshold regions according to the data of the third bit, the number of threshold regions between a threshold region having a lowest voltage level and a threshold region having a highest voltage level among the two threshold regions is two or less, and the memory controller is configured to input the second bit data and the third bit data to the nonvolatile memory when causing the nonvolatile memory to execute the second program.

Figure 1:
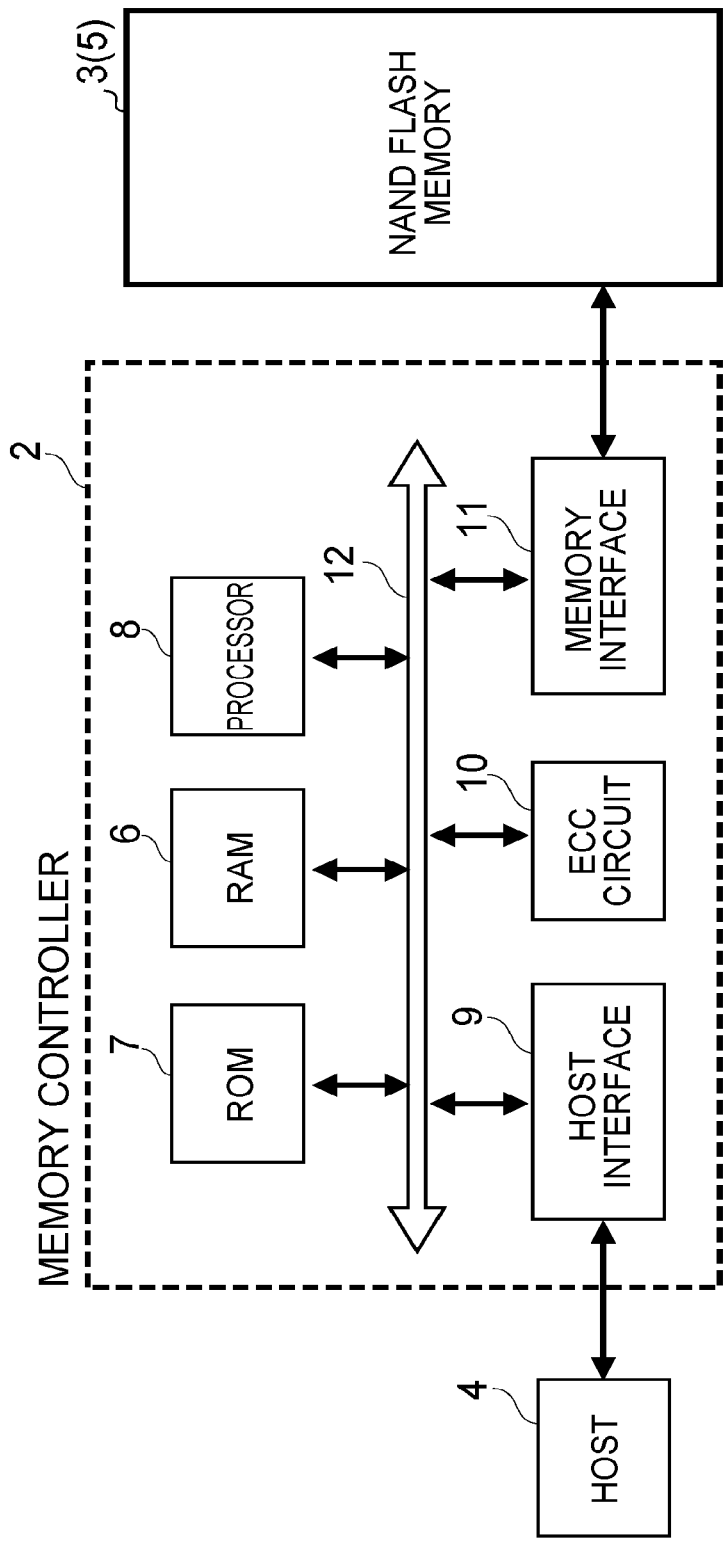
FIG. 1 is a block diagram illustrating a schematic configuration of a memory system according to a first embodiment.

FIG. 1 is a block diagram illustrating a schematic configuration of a memory system 1 according to a first embodiment. The memory system 1 in FIG. 1 includes a memory controller 2 and a nonvolatile memory 3. The memory system 1 in FIG. 1 can be connected to a host processor (hereinafter simply referred to as a host) 4. The host 4 is an electronic device such as a personal computer or a mobile terminal.

The nonvolatile memory 3 is a memory that stores data in a nonvolatile manner, and includes, for example, a NAND flash memory (hereinafter also referred to as a NAND memory) 5. In this embodiment, an example will be described in which the nonvolatile memory 3 is a 4-bit/Cell (QLC: Quad Level Cell) NAND memory 5 having memory cells capable of storing 4-bit data per memory cell. The nonvolatile memory 3 according to this embodiment has a three-dimensional structure in which memory cells are stacked three-dimensionally. The nonvolatile memory 3 includes a plurality of memory cells capable of storing 4-bit data represented by first to fourth bits by sixteen threshold regions including a first threshold region indicating an erased state in which data is erased and second to sixteenth threshold regions having a higher voltage level than that of the first threshold region and indicating a written state in which data is written. For example, the first bit is a least significant Lower bit, the second bit is a second smallest Middle bit, the third bit is a second largest Upper bit, and the fourth bit is a most significant Top bit.

The memory controller 2 controls the writing of data to the nonvolatile memory 3 in accordance with a write command from the host 4. The memory controller 2 controls the reading of data from the nonvolatile memory 3 in accordance with a read command from the host 4. The memory controller 2 includes a random access memory (RAM) 6, a read only memory (ROM) 7, a processor 8, a host interface 9, an error check and correct (ECC) circuit 10, and a memory interface 11. The RAM 6, the processor 8, the host interface 9, the ECC circuit 10, and the memory interface 11 are connected by a common internal bus 12.

As described above, the memory controller 2 according to this embodiment causes the nonvolatile memory 3 to execute the first program for writing the data of the first bit, the second bit, and the fourth bit, and then causes the nonvolatile memory 3 to execute the second program for writing the third bit data. In fifteen boundaries existing between adjacent threshold regions among the first to sixteenth threshold regions, the maximum value of the number of first boundaries used for determining a value of the data of the first bit, the number of second boundaries used for determining a value of the data of the second bit, the number of third boundaries used for determining a value of the data of the third bit, and the number of fourth boundaries used for determining a value of the data of the fourth bit is five, and the second largest value is four. The memory controller 2 is configured to cause the nonvolatile memory 3 to execute the first program such that the threshold region in the memory cell becomes any threshold region of a seventeenth threshold region indicating an erased state in which data is erased and eighteenth to twenty-fourth threshold regions having a higher voltage level than that of the seventeenth threshold region and indicating a written state in which data is written according to the data of the first bit, the second bit, and the fourth bit. The memory controller 2 is configured to cause the nonvolatile memory 3 to execute the second program such that the threshold region in the memory cell becomes any threshold region in two threshold regions among the first to sixteenth threshold regions from any threshold region of the seventeenth to twenty-fourth threshold regions according to the data of the third bit. The number of threshold regions between the threshold region having the lowest voltage level and the threshold region having the highest voltage level among the two threshold regions is two or less. The memory controller 2 is configured to input the second bit data and the third bit data to the nonvolatile memory 3 when causing the nonvolatile memory 3 to execute the second program.

More specifically, the memory controller 2 causes the nonvolatile memory to execute the first program and the second program such that, among fifteen boundaries between sixteen threshold regions (the first to sixteenth threshold regions), the number of boundaries having different values of the first bit between adjacent threshold regions, the number of boundaries having different values of the second bit, the number of boundaries having different values of the third bit, and the number of boundaries having different values of the fourth bit are (1, 4, 5, 5), (1, 5, 4, 5), or (3, 3, 4, 5) in order.

Alternatively, the memory controller 2 according to this embodiment causes the nonvolatile memory 3 to execute the first program for writing the data of the first bit, the second bit, and the fourth bit, and then causes the nonvolatile memory 3 to execute the second program for writing the third bit data. In fifteen boundaries existing between adjacent threshold regions among the first to sixteenth threshold regions, the number of first boundaries used for determining a value of the data of the first bit, the number of second boundaries used for determining a value of the data of the second bit, the number of third boundaries used for determining a value of the data of the third bit, and the number of fourth boundaries used for determining a value of the data of the fourth bit are (3, 5, 2, 5) in order. The memory controller 2 is configured to cause the nonvolatile memory 3 to execute the first program such that the threshold region in the memory cell becomes any threshold region of a seventeenth threshold region indicating an erased state in which data is erased and eighteenth to twenty-fourth threshold regions having a higher voltage level than that of the seventeenth threshold region and indicating a written state in which data is written according to the data of the first bit, the second bit, and the fourth bit. The memory controller 2 is configured to cause the nonvolatile memory 3 to execute the second program such that the threshold region in the memory cell becomes any threshold region in two threshold regions among the first to sixteenth threshold regions from any threshold region of the seventeenth to twenty-fourth threshold regions according to the data of the third bit. The number of threshold regions between the threshold region having the lowest voltage level and the threshold region having the highest voltage level among the two threshold regions is two or less. The memory controller 2 is configured to input the second bit data and the third bit data to the nonvolatile memory 3 when causing the nonvolatile memory 3 to execute the second program.

The memory controller 2 may cause the nonvolatile memory to execute the first program such that a difference in voltage level between two threshold regions having different values of the second bit data among the seventeenth to twenty-fourth threshold regions is smaller than a difference in voltage level between two threshold regions having different values of the first bit data and further is smaller than a difference in voltage level between two threshold regions having different values of the fourth bit data.

Alternatively, the memory controller 2 may cause the nonvolatile memory to execute the second program such that an interval between adjacent threshold regions among four threshold regions obtained by performing the second program on two threshold regions, which have different values of the second bit data during the first program, by the third bit data is wider than an interval of the two threshold regions.

The host interface 9 outputs the command, the user data (write data), and the like received from the host 4 to the internal bus 12. In addition, the host interface 9 transmits the user data read from the nonvolatile memory 3, the response from the processor 8, and the like to the host 4.

The memory interface 11 controls processing of writing user data and the like to the nonvolatile memory 3 and processing of reading from the nonvolatile memory 3 based on instructions from the processor 8.

The processor 8 controls the memory controller 2 in an integrated manner. The processor 8 is, for example, a central processing unit (CPU), a micro processing unit (MPU), or the like. When receiving a command from the host 4 via the host interface 9, the processor 8 performs control according to the command. For example, the processor 8 instructs the memory interface 11 to write user data and parity to the nonvolatile memory 3 in accordance with the command from the host 4. Further, the processor 8 instructs the memory interface 11 to read the user data and the parity from the nonvolatile memory 3 in accordance with a command from the host 4.

The user data is stored in the RAM 6 via the internal bus 12. The processor 8 determines a storage region (memory region) on the nonvolatile memory 3 for the user data stored in the RAM 6. The processor 8 determines a memory region on the nonvolatile memory 3 for page unit data (page data) that is a write unit. In this specification, the user data stored in one page of the nonvolatile memory 3 is defined as unit data. The unit data is generally encoded and stored as a code word in the nonvolatile memory 3, but the encoding is not essential. The memory controller 2 may store the unit data in the nonvolatile memory 3 without encoding, but FIG. 1 illustrates a configuration for encoding as one configuration example. When the memory controller 2 does not perform encoding, the page data matches the unit data. One code word may be generated based on one unit data, or one code word may be generated based on divided data obtained by dividing unit data. One code word may be generated using a plurality of unit data.

The processor 8 determines the memory region of the nonvolatile memory 3 to be a writing destination for each unit data. A physical address is assigned to the memory region of the nonvolatile memory 3. The processor 8 manages the memory region to be a writing destination of unit data using the physical address. The processor 8 specifies the determined memory region (physical address) and instructs the memory interface 11 to write the user data to the nonvolatile memory 3. On the other hand, the host 4 manages data with a logical address. For this reason, the processor 8 manages the correspondence between the logical address and the physical address of the user data. When the processor 8 receives a read command including a logical address from the host 4, the processor 8 specifies a physical address corresponding to the logical address and specifies the physical address to instruct the memory interface 11 to read user data.

In this specification, a plurality of memory cells commonly connected to one word line are defined as a memory cell group MG. One memory cell group MG is a unit for writing (programming). In this embodiment, the nonvolatile memory 3 is a NAND memory 5 of 4 bits/cell, and one memory cell group MG has a data amount of 4 bits×the number of bits. Each bit written to each memory cell corresponds to a different page. In this embodiment, the four pages of one memory cell group MG are referred to as a Lower page (first page), a Middle page (second page), an Upper page (third page), and a Top page (fourth page).

The ECC circuit 10 encodes user data stored in the RAM 6 to generate a code word. Further, the ECC circuit 10 decodes the code word read from the nonvolatile memory 3. The ECC circuit 10 corrects a bit error included in the code word read from the nonvolatile memory 3 and then decodes the bit error into user data.

The RAM 6 temporarily stores the user data received from the host 4 until the user data is stored in the nonvolatile memory 3, and temporarily stores the data read from the nonvolatile memory 3 until the data is transmitted to the host 4. The RAM 6 is a general-purpose memory such as a static random access memory (SRAM) or a dynamic random access memory (DRAM).

FIG. 1 illustrates a configuration example in which the memory controller 2 includes the ECC circuit 10 and the memory interface 11. However, the ECC circuit 10 may be built in the memory interface 11. Further, the ECC circuit 10 may be built in the nonvolatile memory 3.

When a write request is received from the host 4, the memory system 1 operates as follows. The processor 8 temporarily stores the write data in the RAM 6. The processor 8 reads the data stored in the RAM 6 and inputs the data to the ECC circuit 10. The ECC circuit 10 encodes the input data and inputs the code word to the memory interface 11. The memory interface 11 writes the input code word into the nonvolatile memory 3.

When the read request is received from the host 4, the memory system 1 operates as follows. The memory interface 11 inputs the code word read from the nonvolatile memory 3 to the ECC circuit 10. The ECC circuit 10 decodes the input code word and temporarily stores the decoded data in the RAM 6. The processor 8 transmits the data stored in the RAM 6 to the host 4 via the host interface 9. Note that the nonvolatile memory 3 may be configured of a plurality of chips, and the nonvolatile memory 3 and the memory interface 11 can be connected by a through via (TSV: Through Silicon Via).

Note that the configuration of the memory controller 2 illustrated in FIG. 1 is an example, and various other derivative forms may be made such that the internal bus 12 has a divided structure or a hierarchical structure or additional functional blocks are connected, for example.

Figure 2:
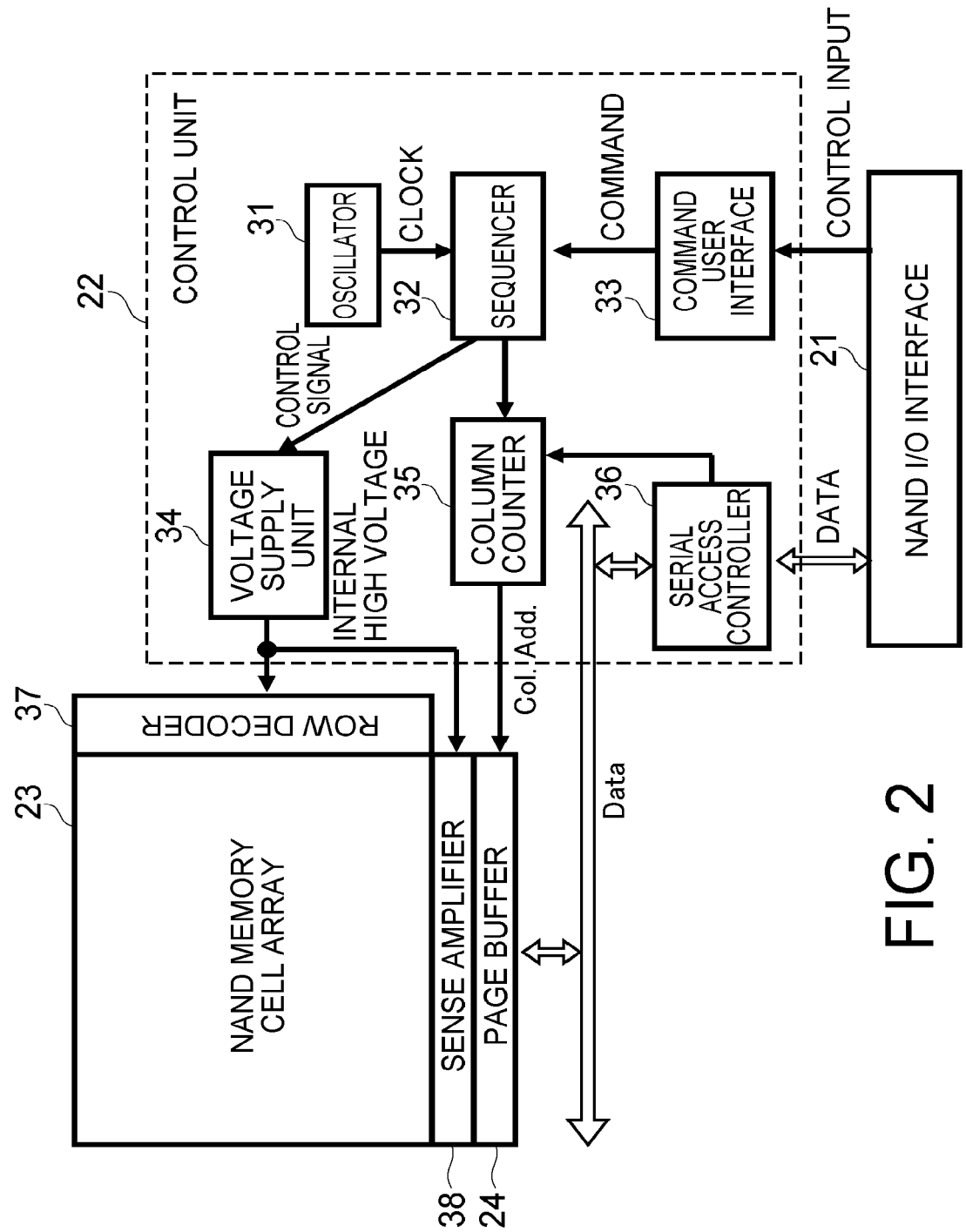
FIG. 2 is a block diagram illustrating an example of an internal configuration of a nonvolatile memory according to this embodiment.

FIG. 2 is a block diagram illustrating an example of the internal configuration of the nonvolatile memory 3 of this embodiment. The nonvolatile memory 3 includes a NAND I/O interface 21, a control unit 22, a NAND memory cell array (memory cell unit) 23, and a page buffer (second storage) 24. The nonvolatile memory 3 is formed on a semiconductor substrate (for example, a silicon substrate), for example, and formed into a chip.

The control unit 22 controls the operation of the nonvolatile memory 3 based on the command from the memory controller 2 via the NAND I/O interface 21. Specifically, when a write request is input, the control unit 22 performs control to write the data requested to be written to a specified address on the NAND memory cell array 23. In addition, when a read request is input, the control unit 22 reads the data requested to be read from the NAND memory cell array 23 and outputs the data to the memory controller 2 via the NAND I/O interface 21. The page buffer 24 is a buffer that temporarily stores the data input from the memory controller 2 when writing to the NAND memory cell array 23 and temporarily stores the data read from the NAND memory cell array 23.

As will be described later, on the basis of the data obtained by reading the data programmed by the program of the first stage, the data of the bit input redundantly in the programs of the first stage and the second stage, and the input data of the bit programmed by the program of the second stage, the control unit 22 determines the threshold voltage of the data of the bit programmed by the second stage program.

The control unit 22 includes an oscillator 31, a sequencer 32, a command user interface 33, a voltage supply unit 34, a column counter 35, and a serial access controller 36. The NAND memory cell array 23 includes a row decoder 37 and a sense amplifier 38.

The NAND I/O interface 21 is a circuit for transmitting and receiving IO signals and control signals to and from the memory controller 2. The command user interface 33 acquires the command and the address among the command, the address, and the data received from the memory controller 2 via the IO signal line based on the control signal. The command user interface 33 passes the acquired command and address to the sequencer 32.

The oscillator 31 is a circuit that generates a clock. The clock generated by the oscillator 31 is supplied to each component including the sequencer 32. The sequencer 32 is a state machine driven by the clock supplied from the oscillator 31. The sequencer 32 executes control such as access to the NAND memory cell array 23. For example, the sequencer 32 issues commands for controlling various internal voltages, operation timings, and the like in accordance with commands received from the command user interface 33. Further, the sequencer 32 supplies the block address and page address included in the address received from the command user interface 33 to the row decoder 37. Further, the sequencer 32 supplies the column counter 35 with the column address included in the address received from the command user interface 33.

The voltage supply unit 34 generates various internal voltages supplied to the word lines and various internal voltages supplied to the bit lines, and supplies the internal voltages to the row decoder 37 and the sense amplifier 38. The column counter 35 sequentially advances the column address according to the control signal supplied from the serial access controller 36 with the column address supplied from the sequencer 32 as the head during the program operation or the read operation.

The page buffer 24 sequentially stores the data received from the serial access controller 36 in the column address region designated by the column counter 35 during the program operation. Further, during the read operation, the page buffer 24 sequentially sends the data at the column address specified by the column address among the stored data to the serial access controller 36 during the read operation.

The serial access controller 36 stores the data received serially from the NAND I/O interface 21 for each bit width of the IO signal line in the page buffer 24 during the program operation. Further, the serial access controller 36 sends the data received serially from the page buffer 24 for each bit width of the JO signal line to the NAND I/O interface 21 during the read operation.

The row decoder 37 decodes a block address and a page address during the program operation and the read operation, and selects a word line corresponding to a page to be accessed included in the access destination block BLK. Each row decoder 37 applies an appropriate voltage to the selected word line and the unselected word line.

In the program operation, the sense amplifier 38 transfers the corresponding data stored in the page buffer 24 to the memory cell transistor. In the read operation, the sense amplifier 38 senses data read from the selected word line to the bit line and stores the obtained data in the page buffer 24. The data stored in the page buffer 24 is sent to the memory controller 2 via the serial access controller 36 and the NAND I/O interface 21.

Figure 3:
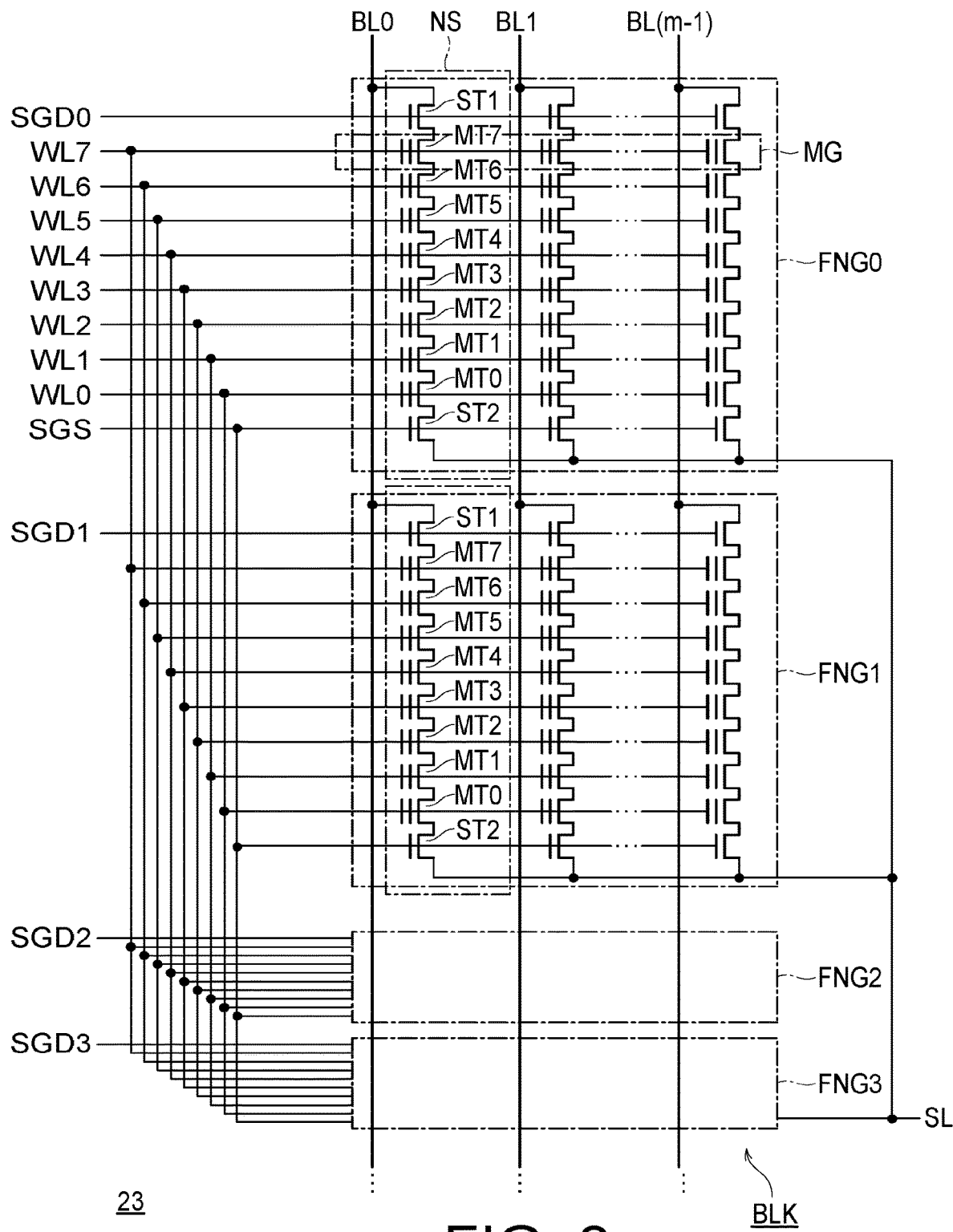
FIG. 3 is a circuit diagram illustrating an example of a NAND memory cell array having a three-dimensional structure.

FIG. 3 is a circuit diagram illustrating an example of the NAND memory cell array 23 having a three-dimensional structure. FIG. 3 illustrates a circuit configuration of one block BLK among a plurality of blocks in the NAND memory cell array 23 having a three-dimensional structure. The other blocks of the NAND memory cell array 23 have the same circuit configuration as that of FIG. 3. Incidentally, this embodiment can also be applied to a memory cell having a two-dimensional structure.

As illustrated in FIG. 3, the block BLK has, for example, four fingers FNG (FNG0 to FNG3). Each finger FNG includes a plurality of NAND strings NS. Each of the NAND strings NS includes, for example, eight memory cell transistors MT (MT0 to MT7) connected in cascade and select transistors ST1 and ST2. In this specification, each finger FNG may be referred to as a string St.

Note that the number of memory cell transistors MT in the NAND string NS is not limited to eight. The memory cell transistor MT is arranged between the select transistors ST1 and ST2 such that the current path thereof is connected in series. The current path of the memory cell transistor MT7 on one end side of the series connection is connected to one end of the current path of the select transistor ST1, and the current path of the memory cell transistor MT0 on the other end side is connected to one end of the current path of the select transistor ST2.

The gates of the select transistors ST1 of the fingers FNG0 to FNG3 are commonly connected to select gate lines SGD0 to SGD3, respectively. On the other hand, the gates of the select transistors ST2 are commonly connected to the same select gate line SGS between the plurality of fingers FNG. The control gates of the memory cell transistors MT0 to MT7 in the same block BLK are commonly connected to the word lines WL0 to WL7, respectively. That is, the word lines WL0 to WL7 and the select gate line SGS are connected in common between a plurality of fingers FNG0 to FNG3 in the same block BLK, whereas the select gate line SGD is independent for each of the fingers FNG0 to FNG3 even in the same block BLK.

The word lines WL0 to WL7 are connected to the control gate electrodes of the memory cell transistors MT0 to MT7 configuring the NAND string NS, respectively, and the i-th memory cell transistor MTi (i=0 to n) in each NAND string NS in the same finger FNG is commonly connected by the same word line WLi (i=0 to n). That is, the control gate electrodes of the memory cell transistors MTi in the same row in the block BLK are connected to the same word line WLi.

Each NAND string NS is connected to the word line WLi and also to the bit line. Each memory cell in each NAND string NS can be identified by an address for identifying the word line WLi and select gate lines SGD0 to SGD3 and an address for identifying the bit line. As described above, the data in the memory cells (memory cell transistors MT) in the same block BLK are erased collectively. On the other hand, data reading and writing are performed in units of physical sectors MS. One physical sector MS includes a plurality of memory cells connected to one word line WLi and belonging to one finger FNG.

The memory controller 2 performs writing (programming) in units of all NAND strings NS connected to one word line in one finger. For this reason, the unit of the amount of data to be programmed by the memory controller 2 is 4 bits×the number of bit lines.

During the read operation and the program operation, one word line WLi and one select gate line SGD are selected according to the physical address, and the physical sector MS is selected. Incidentally, in this specification, writing data to a memory cell is called a program as necessary.

Figure 4:
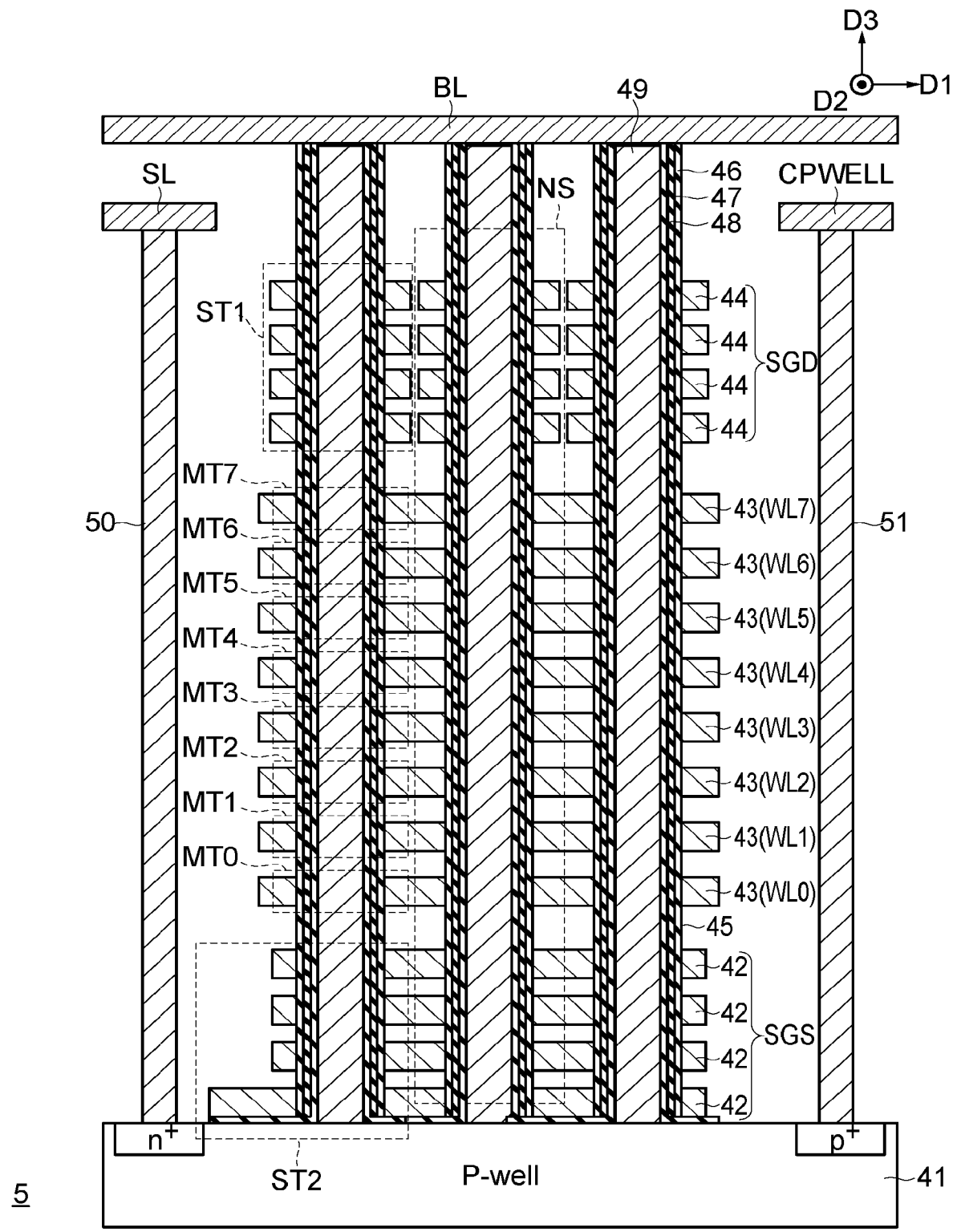
FIG. 4 is a cross-sectional view of a partial region of the NAND memory cell array of a NAND memory having a three-dimensional structure.

FIG. 4 is a cross-sectional view of a partial region of the NAND memory cell array 23 of the NAND memory 5 having a three-dimensional structure. As illustrated in FIG. 4, a plurality of NAND strings NS are formed in a vertical direction on a p-type well region (P-well) 41 of a semiconductor substrate. That is, on the p-type well region 41, a plurality of wiring layers 42 that function as select gate lines SGS, a plurality of wiring layers 43 that function as word lines WLi, and a plurality of wiring layers 44 that function as select gate lines SGD are formed in the vertical direction.

A memory hole 45 that penetrates through the wiring layers 42, 43, and 44 and reaches the p-type well region 41 is formed. A block insulating film 46, a charge storage layer 47, and a gate insulating film 48 are sequentially formed on the side surface of the memory hole 45, and a conductive film 49 is embedded in the memory hole 45. The conductive film 49 functions as a current path of the NAND string NS, and is a region where a channel is formed during the operation of the memory cell transistor MT and the select transistors ST1 and ST2.

In each NAND string NS, the select transistor ST2, the plurality of memory cell transistors MT, and the select transistor ST1 are sequentially stacked on the p-type well region 41. On the upper end of the conductive film 49, a wiring layer functioning as the bit line BL is formed.

Furthermore, an n+-type impurity diffusion layer and a p+-type impurity diffusion layer are formed in the surface of the p-type well region 41. A contact plug 50 is formed on the n+-type impurity diffusion layer, and a wiring layer functioning as a source line SL is formed on the contact plug 50. A contact plug 51 is formed on the p+-type impurity diffusion layer, and a wiring layer functioning as a well wiring CPWELL is formed on the contact plug 51. The well wiring CPWELL is used for applying an erasing voltage.

A plurality of NAND memory cell arrays 23 illustrated in FIG. 4 are arranged in the depth direction of the paper surface of FIG. 4, and one finger FNG is formed by a set of the plurality of NAND strings NS arranged in a line in the depth direction. The other fingers FNG are formed in a left-right direction in FIG. 4, for example. FIG. 3 illustrates four fingers FNG0 to FNG3, but FIG. 4 illustrates an example in which three fingers are arranged between the contact plugs 50 and 51.

Figure 5:
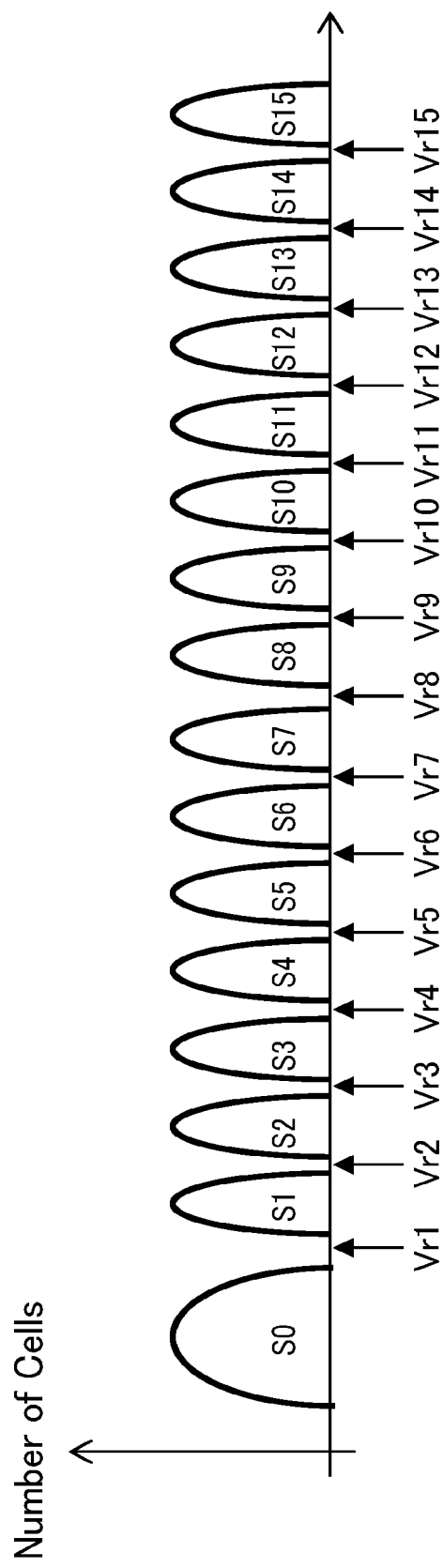
FIG. 5 is a diagram illustrating an example of a threshold region according to the first embodiment.

FIG. 5 is a diagram illustrating an example of a threshold region according to the first embodiment. FIG. 5 illustrates an example of the distribution of threshold regions of the nonvolatile memory 3 of 4 bits/cell. In the nonvolatile memory 3, information is stored by the charge amount of electrons stored in the charge storage layer 47 of the memory cell. Each memory cell has a threshold voltage corresponding to the charge amount of electrons. A plurality of data values stored in the memory cell are respectively associated with a plurality of regions (threshold regions) having different threshold voltages.

In FIG. 5, S0 to S15 indicate threshold distributions in sixteen threshold regions. The horizontal axis in FIG. 5 represents the threshold voltage, and the vertical axis represents the number of memory cells (number of cells). The threshold distribution is a range where the threshold varies. Thus, each memory cell has sixteen threshold regions partitioned by fifteen boundaries, and each threshold region has a unique threshold distribution.

In this embodiment, the region where the threshold voltage is less than or equal to Vr1 is referred to as a region S0, the region where the threshold voltage is greater than Vr1 and less than or equal to Vr2 is referred to as a region S1, the region where the threshold voltage is greater than Vr2 and less than or equal to Vr3 is referred to as a region S2, and the region where the threshold voltage is greater than Vr3 and less than or equal to Vr4 is referred to as a region S3. In this embodiment, the region where the threshold voltage is greater than Vr4 and less than or equal to Vr5 is referred to as a region S4, the region where the threshold voltage is greater than Vr5 and less than or equal to Vr6 is referred to as a region S5, the region where the threshold voltage is greater than Vr6 and less than or equal to Vr7 is referred to as a region S6, and the region where the threshold voltage is greater than Vr7 and less than or equal to Vr8 is referred to as a region S7. In this embodiment, the region where the threshold voltage is greater than Vr8 and less than or equal to Vr9 is referred to as a region S8, the region where the threshold voltage is greater than Vr9 and less than or equal to Vr10 is referred to as region S9, the region where the threshold voltage is greater than Vr10 and less than or equal to Vr11 is referred to as region S10, and the region where the threshold voltage is greater than Vr11 and less than or equal to Vr12 is referred to as a region S11. In this embodiment, the region where the threshold voltage is greater than Vr12 and less than or equal to Vr13 is referred to as a region S12, the region where the threshold voltage is greater than Vr13 and less than or equal to Vr14 is referred to as a region S13, the region where the threshold voltage is greater than Vr14 and less than or equal to Vr15 is referred to as a region S14, and the region where the threshold voltage is greater than Vr15 is referred to as a region S15.

The threshold distributions corresponding to the regions S0 to S15 are referred to as first to sixteenth distributions. Vr1 to Vr15 are threshold voltages that serve as boundaries between the threshold regions.

In the nonvolatile memory 3, a plurality of data values are respectively associated with a plurality of threshold regions of the memory cell. This correspondence is called data coding. This data coding is determined in advance, and when data is written (programmed), charges are injected into the charge storage layer 47 in the memory cell so as to be within the threshold region corresponding to the data value stored in accordance with the data coding. At the time of reading, a read voltage is applied to the memory cell, and the data logic is determined depending on whether the threshold of the memory cell is lower or higher than the read voltage.

When data is read, the logic of the data is determined depending on whether the threshold is lower or higher than the read level at the boundary to be read. A case where the threshold is the lowest means the "erased" state, and all bits of data are defined as "1". When the threshold is higher than the "erased" state, it is in a "programmed" state, and the data is defined as "1" or "0" according to the coding.

FIG. 6A is a diagram illustrating an example of data coding according to the first embodiment and illustrates an example of 1-4-5-5 data coding. In this embodiment, the sixteen threshold regions illustrated in FIG. 5 correspond to sixteen data values of 4 bits, respectively. The relationship between the threshold voltage illustrated in FIG. 6A and the data values of the bits corresponding to the Top, Upper, Middle, and Lower pages is as follows.

A memory cell of which the threshold voltage is in the S0 region is in a state of storing "1111".
A memory cell of which the threshold voltage is in the S1 region is in a state of storing "0111".
A memory cell of which the threshold voltage is in the S2 region is in a state of storing "0011".
A memory cell of which the threshold voltage is in the S3 region is in a state of storing "1011".
A memory cell of which the threshold voltage is in the S4 region is in a state of storing "1001".
A memory cell of which the threshold voltage is in the S5 region is in a state of storing "0001".
A memory cell of which the threshold voltage is in the S6 region is in a state of storing "0101".
A memory cell of which the threshold voltage is in the S7 region is in a state of storing "1101".
A memory cell of which the threshold voltage is in the S8 region is in a state of storing "1100".
A memory cell of which the threshold voltage is in the S9 region is in a state of storing "1110".
A memory cell of which the threshold voltage is in the S10 region is in a state of storing "1010".
A memory cell of which the threshold voltage is in the S11 region is in a state of storing "1000".
A memory cell of which the threshold voltage is in the S12 region is in a state of storing "0000".
A memory cell of which the threshold voltage is in the S13 region is in a state of storing "0100".
A memory cell of which the threshold voltage is in the S14 region is in a state of storing "0110".
A memory cell of which the threshold voltage is in the S15 region is in a state of storing "0010".

FIG. 6B is a diagram illustrating another example of data coding according to the first embodiment and illustrates an example of 4-3-4-4 data coding. The relationship between the threshold voltage illustrated in FIG. 6B and the data values of the bits corresponding to the Top, Upper, Middle, and Lower pages is as follows.

A memory cell of which the threshold voltage is in the S0 region is in a state of storing "1111".

A memory cell of which the threshold voltage is in the S1 region is in a state of storing "0111".

A memory cell of which the threshold voltage is in the S2 region is in a state of storing "0011".

A memory cell of which the threshold voltage is in the S3 region is in a state of storing "1011".

A memory cell of which the threshold voltage is in the S4 region is in a state of storing "1010".

A memory cell of which the threshold voltage is in the S5 region is in a state of storing "1110".

A memory cell of which the threshold voltage is in the S6 region is in a state of storing "1100".

A memory cell of which the threshold voltage is in the S7 region is in a state of storing "1000".

A memory cell of which the threshold voltage is in the S8 region is in a state of storing "1001".

A memory cell of which the threshold voltage is in the S9 region is in a state of storing "0001".

A memory cell of which the threshold voltage is in the S10 region is in a state of storing "0000".

A memory cell of which the threshold voltage is in the S11 region is in a state of storing "0010".

A memory cell of which the threshold voltage is in the S12 region is in a state of storing "0110".

A memory cell of which the threshold voltage is in the S13 region is in a state of storing "0100".

A memory cell of which the threshold voltage is in the S14 region is in a state of storing "0101".

A memory cell of which the threshold voltage is in the S15 region is in a state of storing "1101".

As illustrated in FIGS. 6A and 6B, the logic of 4-bit data of each memory cell can be assigned to each region of the threshold voltage. Incidentally, when the memory cell is in an unwritten state ("erased" state), the threshold voltage of the memory cell is in the S0 region. In the codes shown here, only one bit of data changes between any two adjacent regions such that data "1111" is stored in the S0 (erased) state, and data "0111" is stored in the S1 state. As described above, the data coding illustrated in FIGS. 6A and 6B is a Gray code in which only one bit of data changes between any two adjacent regions.

In the coding of this embodiment illustrated in FIG. 6A, the threshold voltage that serves as the boundary for determining the bit value of each page is as follows.

The threshold voltages that serve as boundaries for determining the bit value of the Top page are Vr1, Vr3, Vr5, Vr7, and Vr12.

The threshold voltages that serve as boundaries for determining the bit value of the Upper page are Vr2, Vr6, Vr10, Vr13, and Vr15.

The threshold voltages that serve as boundaries for determining the bit value of the Middle page are Vr4, Vr9, Vr11, and Vr14.

The threshold voltage that serves as a boundary for determining the bit value of the Lower page is Vr8.

In this way, the numbers (hereinafter referred to as a boundary number) of the threshold voltages for determining the bit value are 1, 4, 5, and 5 on the Lower page, Middle page, Upper page, and Top page, respectively. Hereinafter, such coding is referred to as 1-4-5-5 coding by using the respective boundary numbers of the Lower page, Middle page, Upper page, and Top page.

The first feature of this embodiment is that the maximum number of boundaries at which the bit value of each page changes is five. When sixteen states are expressed by 4 bits, the minimum value of the maximum boundary number is four, and the coding in FIG. 6 is only one more than this, and the bias of the bit error is reduced. As described above, the memory system 1 according to this embodiment includes the first feature and can suppress a bit error rate and also suppress the bias of the bit error for each page.

The second feature of this embodiment is that the number of the boundaries of the Lower page is one, and the number of the boundaries of the Middle page is four. The program can be made in two stages of the first stage program that combines the Lower page and the Middle page and the second stage program that combines the Upper page and the Top page.

The third feature of this embodiment is that the change width from the threshold region generated by the first stage program to the threshold region generated by the second stage program is small. That is, the change width of the threshold region is small. As the change width of the threshold region is smaller, it is more difficult to receive interference between adjacent cells. The above-described first to third features will be described in detail later.

The control unit 22 of the nonvolatile memory 3 controls the program to the NAND memory cell array 23 and the reading from the NAND memory cell array 23 based on the coding illustrated in FIGS. 6A and 6B.

In the three-dimensional memory cell, the miniaturization of the memory cell does not progress as much as the two-dimensional memory cell. For this reason, in the three-dimensional memory cell, the inter-cell interference is small if the generation is such that the interval between adjacent memory cells is wide. In this case, generally, a method is employed in which all bits of each memory cell are programmed simultaneously, for example, all pages are programmed simultaneously if all bits are allocated to different pages.

When all the bits of each memory cell are programmed simultaneously, combination of the data coding is not particularly limited. The positioned region among the sixteen threshold regions may be determined based on the data of all bits, and the region of S0 in the erased state may be programmed to become the determined threshold region. In this case, generally, data coding such as 4-4-3-4 data coding in which the maximum number of boundaries becomes a minimum value is employed. In the 4-4-3-4 data coding, when fifteen boundaries between sixteen threshold regions are distributed to four pages, four boundaries are distributed to the Lower page, four boundaries are distributed to the Middle page, three boundaries are distributed to the Upper page, and four boundaries are distributed to the Top page. In this data coding, since the deviation in the number of boundaries between pages is small, as a result, the deviation in the bit error rate between pages is reduced. This is because most of the causes of bit errors are caused by the threshold shifting to the adjacent threshold region, and the number of bit errors increases as the number of boundaries in the page increases. This is also effective for suppressing deterioration in response performance of the memory system 1 in response to the write request from the host 4, cost, and power consumption since the correction capability of the ECC circuit 10 necessary to correct the page data error must be strengthened even if the error rate as a memory cell is the same. Also, the reading speed bias caused by the bias of the boundary number is reduced.

In addition, in the 4-bit/Cell NAND memory 5, the interval between adjacent threshold regions is narrowed, so the influence of inter-cell interference is greater than that of the 1-bit/Cell or 2-bit/Cell NAND memory 5. For this reason, in the NAND memory 5 of the generation that has advanced recently in miniaturization, generally, a program method (Foggy-Fine program) is employed which gradually injects charges into the charge storage layer 47 of the memory cell by using a plurality of program stages, for example, two program stages (hereinafter sometimes simply referred to as stages) in order to suppress inter-cell interference. In this Foggy-Fine program, the memory cell is written in the first stage (Foggy stage), and then the neighboring cell is written. Then, the second stage (Fine stage) is written after returning to the first memory cell. Each stage in this case is a program execution unit, and the program of the memory cell corresponding to one word line WLi is completed by executing two program stages.

In both the first stage program and the second stage program, the program is executed using sixteen threshold regions. The threshold distribution in the threshold region at the end of the first stage program has a wider width than the threshold distribution of the threshold region in the final data coding. That is, in the Foggy stage, Foggy (rough) writing is performed. The Foggy stage program requires all four pages of input data. Since the threshold distribution after programming of the Foggy stage is in the intermediate state in which adjacent distributions overlap each other, data cannot be read out. In the program of the Fine stage which is the second stage, the threshold region after the Foggy stage program is moved to the threshold region in the final data coding. In other words, Fine writing is performed in the Fine stage. The Fine stage program also requires all four pages of input data. Since the threshold distribution after programming the Fine stage is in the final state in which adjacent distributions are separated, data can be read after programming the Fine stage.

In the case of 4-4-3-4 data coding, the deviation in the number of boundaries is small, but data input for the Foggy-Fine program requires data input for four pages at each stage. This increases the time required for data input and deteriorates the response performance of the memory system 1 in response to the write request from the host 4. In addition, in the memory system 1, the buffer amount (write buffer amount) of the write buffer (first storage) for holding data for input to the NAND memory 5 is increased. The write buffer is generally assigned with a partial region of the RAM 6 in the memory system 1.

As a measure for these, in this embodiment, the memory system 1 employs 1-4-5-5 data coding for the nonvolatile memory 3 having a three-dimensional structure, and further writes in page units (page by page) in two stages. Thereby, in this embodiment, even in the nonvolatile memory 3 having a three-dimensional structure, the write buffer amount of the memory controller 2 is reduced while suppressing the inter-cell interference between cells and the deviation of the bit error rate between pages. In the write buffer of this embodiment, the data of the bit, which is input redundantly during the first program and the second program, among the first to fourth bits (each data of Lower page, Middle page, Upper page, and Top page) can be discarded or invalidated after the second program is started, and the data of the other bits can be discarded or invalidated after the first program is started.

Here, the interference between adjacent memory cells will be described. The charge stored in the charge storage layer 47 of one memory cell disturbs the electric field of the adjacent memory cell, and as a result, gives noise that fluctuates the threshold voltage when reading the adjacent memory cell. When programming and verifying are performed under a certain electric field condition and the programming is completed, the adjacent memory cells are programmed to different charges, resulting in deterioration in reading accuracy. This interference between adjacent memory cells becomes more prominent as the memory device manufacturing technology becomes fine and the memory cell interval is reduced. The interference between adjacent memory cells is largely generated between adjacent memory cells connected to different bit lines on the same word line WLi.

The interference between adjacent memory cells can be mitigated by reducing the difference in the electric field condition between the memory cells during programming and verifying and during reading after the adjacent memory cells are programmed. As one method for reducing the interference between adjacent memory cells between adjacent memory cells connected to different bit lines on the same word line WLi, a method is provided which divides the program into a plurality of stages, and executes the program such that a large change in charge amount in the charge storage layer 47 does not occur between the stages.

In the program sequence in this embodiment, 4 bits on one word line WLi are programmed by two program stages, that is, a first stage and a second stage. Each program stage is a program execution unit, and the memory system 1 of this embodiment completes the writing of 4-bit data to the memory cell by executing the two program stages. Further, in this embodiment, the data of any one page of 4 bits is used for each of the two program stages. Specifically, Lower page data, Middle page, and Top page data are used for the first stage program, and Middle page, Upper page, and Top page data are used for the second stage program.

Figure 7:
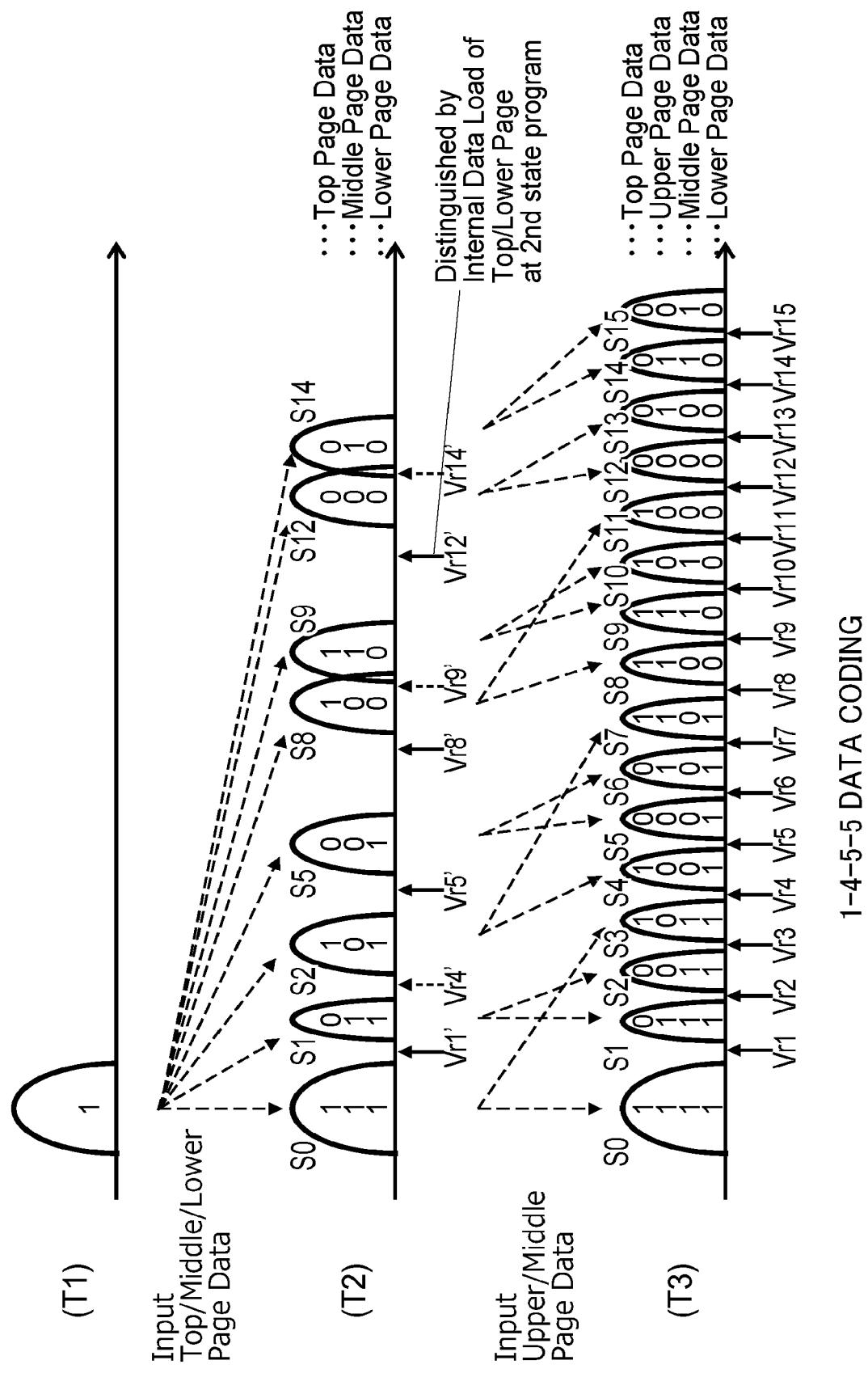
FIG. 7 is a diagram illustrating the threshold region after programming in the first embodiment.

FIG. 7 is a diagram illustrating the threshold region after programming in the first embodiment. FIG. 7 illustrates the threshold region after the first stage and second stage programs are performed on the memory cell. (T1) in FIG. 7 illustrates the threshold region in the erased state which is the initial state before programming. (T2) in FIG. 7 illustrates the threshold region after the first stage program (first program). (T3) in FIG. 7 illustrates the threshold region after the second stage program (second program).

As illustrated in (T1) of FIG. 7, all the memory cells in the NAND memory cell array 23 are in the state of the distribution S0 in an unwritten state ("erased" state). As illustrated in (T2) of FIG. 7, in the first stage program, the control unit 22 of the nonvolatile memory 3 remains the distribution S0 for each memory cell as it is, or moves the distribution to a distribution above the distribution S0 by injecting a charge according to the bit value written (stored) in the Lower page, Middle page, and Top page.

Specifically, the control unit 22 is programmed not to inject charges when all the bit values to be written in the Lower page, the Middle page, and the Top page are "1", and to inject charges to move the threshold voltage higher when at least one of the bit values to be written in the Lower page, the Middle page, and the Top page is "0".

That is, the distribution is moved to the distribution S1 when the bit values to be written in the Lower page, Middle page, and Top page are "011", to the distribution S4 when the bit values to be written in the Lower page, Middle page, and Top page are "101", to the distribution S5 when the bit values to be written in the Lower page, Middle page and Top page are "001", to the distribution S8 when the bit values to be written in the Lower page, Middle page, and Top page are "100", to the distribution S9 when the bit values to be written in the Lower page, Middle page, and Top page are "110", to the distribution S12 when the bit values to be written in the Lower page, Middle page, and Top page is "000", and to distribution S14 when the bit values to be written in the Lower page, Middle page, and Top page "010".

Here, preferably, the distribution S1, the distribution S4, the distribution S5, the distribution S8, the distribution S9, the distribution S12, and the distribution S14 are programmed roughly by widening the width of the threshold region such that the threshold voltage becomes slightly lower. That is, the increase width of the program voltage pulse which will be described later is increased. As a result, the time required for writing can be shortened. Then, by programming the threshold voltage to be slightly lower, the width of the threshold distribution region can be written so as to be finally a predetermined width in the programming of the second stage.

Preferably, the intervals between the adjacent distributions S8 and S9, and the adjacent threshold distributions S12 and S14 are made narrower than the intervals between other adjacent distributions. The data of the Middle page is different in the write bit value between the adjacent threshold distributions in which the intervals are narrowed. That is, since the data after the first stage program looks like binary, it is possible to read the Lower page, the Middle page data, and the Top page. However, when the intervals of the threshold distributions having different Middle page data are made narrower, the intervals between threshold distributions having different data of the Lower page and the Top page are widely secured, and the margin for reading the Lower page and the Top page is increased. The threshold distributions S0 to S14 illustrated in (T2) of FIG. 7 corresponds to the seventeenth to twenty-fourth threshold regions.

Next, as illustrated in (T3) of FIG. 7, in the second stage program, two pages of the Middle page and the Upper page are required for data writing. Then, the control unit 22 of the nonvolatile memory 3 performs programming such that the threshold distribution after the second stage program has a 16-value level in the final state in which adjacent distributions are separated. After the second stage program, all page data can be read.

In the second stage program, the greater the change width of the memory cell threshold from the end of the first stage program, the greater the interference between adjacent cells. Therefore, it is preferable that the amount of change in the threshold distribution having the largest amount of change in the threshold distribution of the memory cell is minimized. According to this embodiment, the variation of the maximum threshold distribution is equivalent to three threshold distributions, in which S0 changes to S3, S4 changes to S7, and S8 changes to S11. The threshold distributions S0 to S15 shown in (T3) of FIG. 7 corresponds to the first to sixteenth threshold regions.

Incidentally, typically, programming is performed by applying a program voltage pulse once or a plurality of times. In a plurality of program application pulses, the voltage value is increased stepwise. After each program voltage pulse, reading called verifying is performed to confirm whether or not the memory cell moves beyond the threshold boundary level. By repeating the application and reading, it becomes possible to move the threshold of the memory cell within a predetermined threshold distribution range.

Incidentally, the control unit 22 may continuously execute the first stage program and the second stage program for one word line WLi, but in order to reduce the influence of interference between adjacent memory cells, the program may be executed in a discontinuous order across a plurality of word lines WLi.

FIG. 8A is a diagram illustrating a first example of a program order according to the first embodiment. FIG. 8B is a diagram illustrating a second example of the program order according to the first embodiment. FIG. 8C is a diagram illustrating a third example of the program order according to the first embodiment. In FIGS. 8A to 8C, programming is performed in two program stages in order to reduce the influence of interference between adjacent memory cells. FIG. 8A illustrates an example of a program order in the NAND memory 5 in which one string St is connected to each word line in each block. FIGS. 8B and 8C illustrate an example of a program order in the NAND memory 5 in which four strings St are connected to each word line in each block. Incidentally, in FIGS. 8B and 8C, the four strings St connected to each word line are denoted as String0 to String3.

When writing is started, the control unit 22 advances each program stage while straddling the word lines WLi in a predetermined discontinuous order. That is, the first stage and the second stage for the same word line are not continuously executed. The programming is performed in the first stage for a certain word line, and then the programming is performed in the second stage for a different word line.

When the programming is completed up to the second stage for a certain word line, and programming of the first stage and the second stage is continuously performed for the adjacent word lines, the amount of fluctuation in the threshold voltage increases. When the fluctuation amount of the threshold voltage of the adjacent word line is large, the interference between adjacent memory cells between the word lines becomes large. Therefore, in order to reduce the interference between adjacent memory cells between the word lines, it is effective to reduce the fluctuation amount of the threshold voltage of the adjacent word line after the programming is completed to the second stage of the word line. In the sequence of FIG. 8A, the program stage of the adjacent word line after the programming is completed to the second stage of a certain word line is only the second stage.

In a case where the programming is performed on the NAND memory 5 having the three-dimensional structure in the program order of FIG. 8A, when writing is started, the control unit 22 executes the program in the order shown in the following (1) to (9) based on the instruction from the processor 8. The control unit 22 performs the program to the NAND memory 5 based on the instruction from the processor 8, but the description based on the instruction from the processor 8 is omitted below.

(1) First, the control unit 22 executes a program ST11 of the first stage of the word line WL0.

(2) Next, the control unit 22 executes a program ST12 of the first stage of the word line WL1.

(3) Next, the control unit 22 executes a program ST13 of the second stage of the word line WL0.

(4) Next, the control unit 22 executes a program ST14 of the first stage of the word line WL2.

(5) Next, the control unit 22 executes a program ST15 of the second stage of the word line WL1.

(6) Next, the control unit 22 executes a program ST16 of the first stage of the word line WL3.

(7) Next, the control unit 22 executes a program ST17 of the second stage of the word line WL2.

(8) Next, the control unit 22 executes a program ST18 of the first stage of the word line WL4.

(9) Next, the control unit 22 executes a program ST19 of the second stage of the word line WL3.

Similarly, the control unit 22 proceeds the process obliquely upward from the lower left to the upper right in FIG. 8A. Thus, in FIG. 8A, a plurality of memory cells in the nonvolatile memory 3 include a plurality of first memory cells connected to the first word line and a plurality of second memory cells connected to the second word line adjacent to the first word line. The memory controller 2 performs the first program on the plurality of first memory cells, and then performs the first program on the plurality of second memory cells. Next, after the first program is performed on the plurality of second memory cells, the second program is performed on the plurality of first memory cells.

In a case where the programming is performed on the NAND memory 5 having the three-dimensional structure in the program order of FIG. 8B, when writing is started, the control unit 22 executes the program in the order shown in the following (11) to (24).

(11) First, the control unit 22 executes a program ST21 of a first stage of a string St0_word line WL0.

(12) Next, the control unit 22 executes a program ST22 of a first stage of a string St1_word line WL0.

(13) Next, the control unit 22 executes a program ST23 of a first stage of a string St2_word line WL0.

(14) Next, the control unit 22 executes a program ST24 of a first stage of a string St3_word line WL0.

(15) Next, the control unit 22 executes a program ST25 of a first stage of a string St0_word line WL1.

(16) Next, the control unit 22 executes a program ST26 of a second stage of the string St0_word line WL0.

(17) Next, the control unit 22 executes a program ST27 of a first stage of a string St1_word line WL1.

(18) Next, the control unit 22 executes a program ST28 of a second stage of the string St1_word line WL0.

(19) Next, the control unit 22 executes a program ST29 of a first stage of a string St2_word line WL1.

(20) Next, the control unit 22 executes a program ST210 of a second stage of the string St2_word line WL0.

(21) Next, the control unit 22 executes a program ST211 of a first stage of a string St3_word line WL1.

(22) Next, the control unit 22 executes a program ST212 of a second stage of the string St3_word line WL0.

(23) Next, the control unit 22 executes a program ST213 of a first stage of a string St0_word line WL2.

(24) Next, the control unit 22 executes a program ST214 of a second stage of the string St0_word line WL1.

Similarly, the control unit 22 proceeds the process obliquely upward from the lower left to the upper right in FIG. 8B. Incidentally, in FIG. 8B, the case where there are four strings St in the block has been described, but the number of strings St in the block may be three or less, or may be five or more.

In a case where the programming is performed on the NAND memory 5 having the three-dimensional structure in the program order of FIG. 8C, when writing is started, the control unit 22 executes the program in the order shown in the following (31) to (50).

(31) First, the control unit 22 executes a program ST31 of the first stage of the string St0_word line WL0.

(32) Next, the control unit 22 executes a program ST32 of the first stage of the string St1_word line WL0.

(33) Next, the control unit 22 executes a program ST33 of the first stage of the string St2_word line WL0.

(34) Next, the control unit 22 executes a program ST34 of the first stage of the string St3_word line WL0.

(35) First, the control unit 22 executes a program ST35 of the first stage of the string St0_word line WL1.

(36) Next, the control unit 22 executes a program ST36 of the first stage of the string St1_word line WL1.

(37) Next, the control unit 22 executes a program ST37 of the first stage of the string St2_word line WL1.

(38) Next, the control unit 22 executes a program ST38 of the first stage of the string St3_word line WL1.

(39) Next, the control unit 22 executes a program ST39 of the second stage of the string St0_word line WL0.

(40) Next, the control unit 22 executes a program ST310 of the second stage of the string St1_word line WL0.

(41) Next, the control unit 22 executes a program ST311 of the second stage of the string St2_word line WL0.

(42) Next, the control unit 22 executes a program ST312 of the second stage of the string St3_word line WL0.

(43) Next, the control unit 22 executes a program ST313 of the first stage of the string St0_word line WL2.

(44) Next, the control unit 22 executes a program ST314 of the first stage of the string St1_word line WL2.

(45) Next, the control unit 22 executes a program ST315 of the first stage of the string St2_word line WL2.

(46) Next, the control unit 22 executes a program ST316 of the first stage of the string St3_word line WL2.

(47) Next, the control unit 22 executes a program ST317 of the second stage of the string St0_word line WL1.

(48) Next, the control unit 22 executes a program ST318 of the second stage of the string St1_word line WL1.

(49) Next, the control unit 22 executes a program ST319 of the second stage of the string St2_word line WL1.

(50) Next, the control unit 22 executes a program ST320 of the second stage of the string St3_word line WL1.

Incidentally, in FIG. 8C, the case where there are four strings St in the block has been described, but the number of strings St in the block may be three or less, or may be five or more.

As described above, even when there are a plurality of strings St, the program order of each program stage of the word line WLi in one string St is the same as that in the case of one string St. In the case of the nonvolatile memory 3 having a three-dimensional structure in which a plurality of strings St exist in a block, in the program of the combination position of the word line WLi and the string St, generally, the same word line number in different strings St is programmed first, and then the procedure proceeds to the next word line number. When FIG. 8A is combined according to such an order by the number of strings St, for example, the order illustrated in FIG. 8B or FIG. 8C is obtained.

Figure 9:
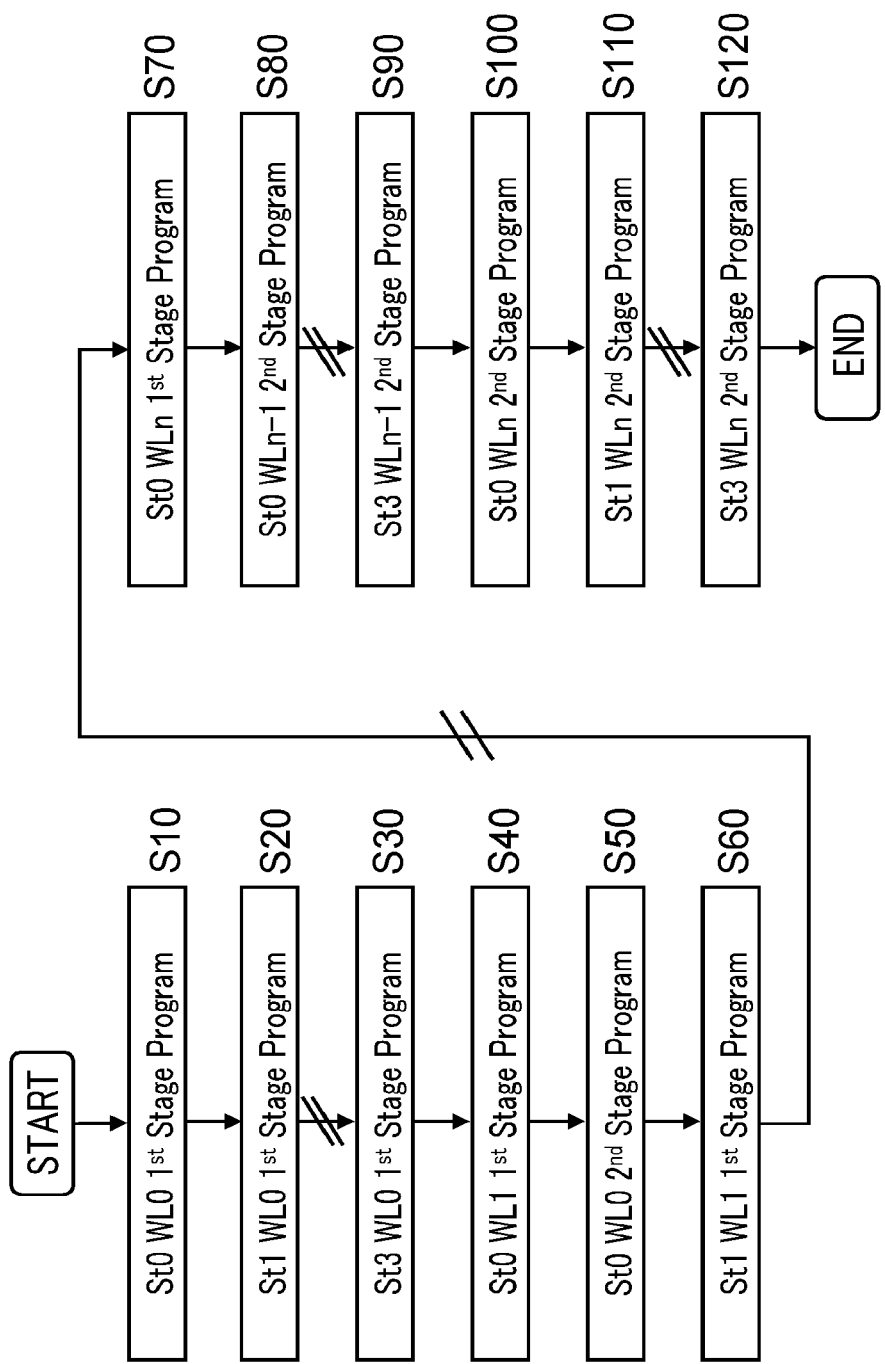
FIG. 9 is a flowchart illustrating a first example of a writing procedure for the entire one block according to the first embodiment.
Figure 10:
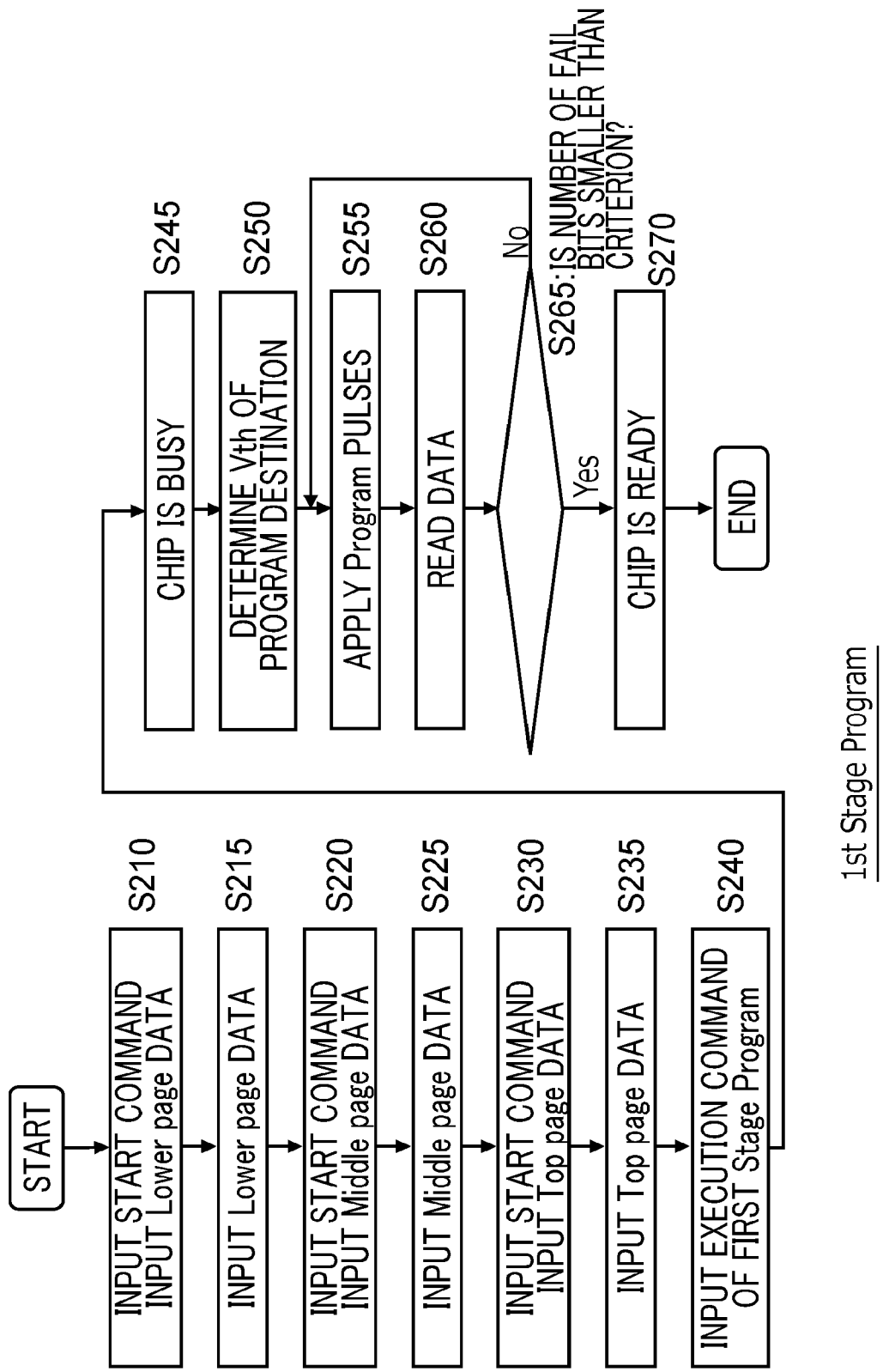
FIG. 10 is a flowchart illustrating a writing procedure in a first stage according to the first embodiment.
Figure 11:
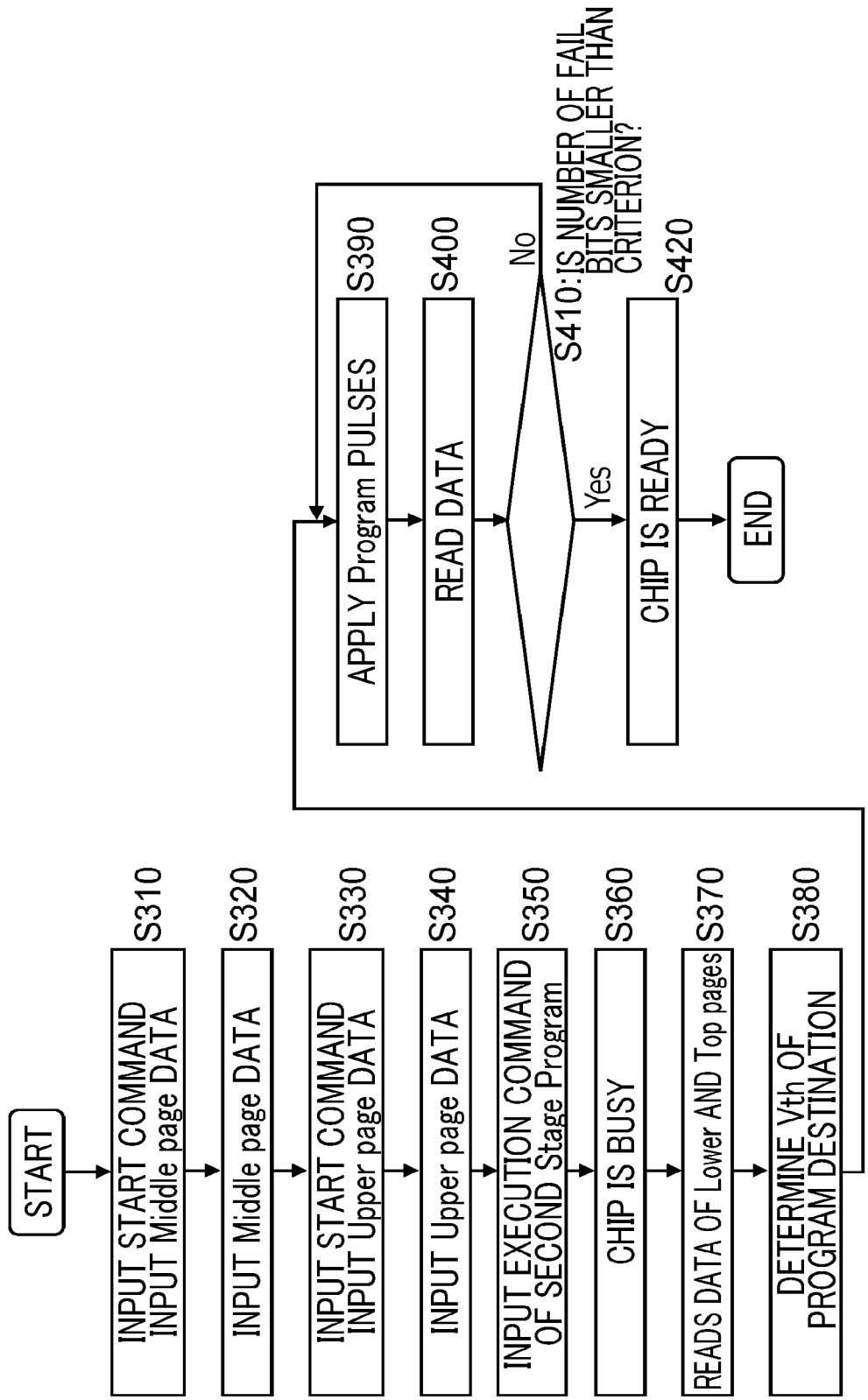
FIG. 11 is a flowchart illustrating a first example of a writing procedure in a second stage.

Here, an example of a writing procedure according to the program order according to the first embodiment will be described with reference to FIGS. 9 to 11. FIGS. 9 to 11 illustrate a writing procedure following the program order illustrated in FIG. 8B or 8C. As described above, the memory controller 2 advances the program stage while straddling the word lines WLi in a discontinuous order. Therefore, the program is executed by using a group (here, block) of certain word lines WLi as a group of program sequences.

FIG. 9 is a flowchart illustrating a first example of a writing procedure for the entire one block according to the first embodiment. Here, it is assumed that one block has n+1 word lines WLi of word lines WL0 to WLn (n is a natural number). FIG. 10 is a flowchart illustrating a writing procedure in the first stage according to the first embodiment, and FIG. 11 is a flowchart illustrating a writing procedure in the second stage according to the first embodiment.

As illustrated in FIG. 9, when writing is started, the control unit 22 executes the program of the first stage of the string St0_word line WL0 (step S10). Next, the control unit 22 executes the program of the first stage of the string St1_word line WL0 (step S20). Thereafter, the control unit 22 executes the same process as steps S10 and S20 on each string St. Then, the control unit 22 executes the program of the first stage of the string St3_word line WL0 (step S30).

Further, the control unit 22 executes the program of the first stage of the string St0_word line WL1 (step S40). Next, the control unit 22 executes the program of the second stage of the string St0_word line WL0 (step S50). Next, the control unit executes the program of the first stage of the string St1_word line WL1 (step S60). Thereafter, the control unit 22 repeats the processes such as steps S40, S50, and S60 for each word line WLi of each string St.

Then, the control unit 22 executes the program of the first stage of the string St0_word line WLn (step S70). Next, the control unit 22 executes the program of the second stage of the string St0_word line WLn−1 (step S80). Thereafter, the control unit 22 repeats the processes such as steps S70 and S80 for each word line WLi of each string St.

Then, the control unit 22 executes the program of the second stage of the string St3_word line WLn−1 (step S90). Next, the control unit 22 executes the program of the second stage of the string St0_word line WLn (step S100). Next, the control unit 22 executes the program of the second stage of the string St1_word line WLn (step S110). Thereafter, the control unit 22 performs the same process as steps S100 and S110 on each string St. Then, the control unit 22 executes the program of the second stage of the string St3_word line WLn (step S120).

FIG. 10 is a flowchart illustrating a first example of the writing procedure of the first stage. In the first stage program, first, the input start command of the Lower page data is input from the memory controller 2 to the nonvolatile memory 3 (step S210). Then, the Lower page data is input from the memory controller 2 to the nonvolatile memory 3 (step S215). Next, the input start command of the Middle page data is input from the memory controller 2 to the nonvolatile memory 3 (step S220). Then, the Middle page data is input from the memory controller 2 to the nonvolatile memory 3 (step S225). Next, the input start command of the Top page data is input from the memory controller 2 to the nonvolatile memory 3 (step S230). Then, the Top page data is input from the memory controller 2 to the nonvolatile memory 3 (step S235). Further, the program execution command of the first stage is input from the memory controller 2 to the nonvolatile memory 3 (step S240), and thereby the chip is busy (step S245).

At the time of data writing, the threshold voltage Vth is determined (step S250), and one or more program voltage pulses are applied (step S255). Then, data reading (verifying) is performed to confirm whether or not the memory cell moves beyond the threshold boundary level (step S260).

Furthermore, it is confirmed whether or not the number of data fail bits in the Lower page, the Middle page, and the Top page is smaller than a criterion (judgment criterion) (step S265). When the number of fail bits of data is equal to or more than the criterion, the processing (steps S255 to S265) from the application of the program pulse to the criterion determination is repeated. Then, when the number of fail bits of data becomes smaller than the criterion, the chip is ready (step S270). In this manner, by repeating the application, reading, and confirmation, it becomes possible to move the threshold of the memory cell within a predetermined threshold distribution range.

Incidentally, as described above, the read level after applying the program voltage pulse during the first stage writing may be slightly different from the read level after the second stage writing, and is preferably lower than the read level after the second stage writing. That is, Vr1'≤Vr1, Vr4'≤Vr4, Vr5'≤Vr5, Vr8'≤Vr8, Vr9'≤Vr9, Vr12'≤Vr12, and Vr14'≤Vr14.

In the reading after the application of the program voltage pulse in the first stage writing, reading by Vr9' and reading by Vr14' may be omitted. After passing the reading of Vr8', the writing of Vr9' may be completed after the application of a certain number of program voltage pulses, and after passing the reading of Vr13', the writing of Vr14' may be completed after the application of a certain number of program voltage pulses.

This is because, as described above, the interval of the threshold regions in which the data of the Middle page is different in the data after the programming of the first stage is narrowed so that the interval of the threshold regions in which the data of the Lower page and the data of the Top page where reading is performed during the second stage writing is different can be ensured sufficiently wide even with simple control of applying a certain number of program voltage pulses.

The reading after the application of the program voltage pulse of Vr8', Vr9', Vr12', and Vr14' is omitted, and after passing the reading of Vr5', the writing may be completed after the application of a certain number of program voltage pulses.

FIG. 11 is a flowchart illustrating a first example of a writing procedure in the second stage. In the second stage program, first, the input start command for the Middle page data is input from the memory controller 2 to the nonvolatile memory 3 (step S310). Then, the Middle page data is input from the memory controller 2 to the nonvolatile memory 3 (step S320).

Next, the input start command of the Upper page data is input from the memory controller 2 to the nonvolatile memory 3 (step S330). Then, the Upper page data is input from the memory controller 2 to the nonvolatile memory 3 (step S340). Next, the program execution command of the second stage is input from the memory controller 2 to the nonvolatile memory 3 (step S350), and thereby the chip is busy (step S360).

Thereafter, the control unit 22 performs reading of the Lower page and Top page data as IDL (Internal Data Load) (step S370). The Vth (threshold voltage) of the program destination of the Upper page is determined based on the Middle page data input first and the Lower page and Top page data by IDL (step S380). Thereafter, the data writing to the Upper page is performed using the determined Vth. More specifically, the voltage values of the plurality of program pulses are written gradually up to reach the determined threshold voltage (step S390). The memory cells that have reached the target threshold voltages are excluded from the write targets.

Then, the written data is read (step S400), and it is confirmed whether or not the number of fail bits is smaller than the criterion (judgment criterion) (step S410). When the number of fail bits of data is equal to or more than the criterion, the processing (steps S390 to S410) from the application of the program pulse to the criterion determination is repeated. Then, when the number of fail bits of data becomes smaller than the criterion, the chip is ready (step S420).

Here, this embodiment has two features. The first feature is that the Middle page data is already input also in the first stage program, and the threshold region after the first program is in the written state that also includes the Middle page data, but the Middle page data is input again also in the second stage program. The second feature is that, in the first stage program, the interval between adjacent threshold regions where the data of the Middle page is switched is narrow, and on the contrary, the interval between adjacent threshold distributions where the data of the Lower page and the data of the Top page are switched is wide. Accordingly, it is possible to improve the reliability of the Lower page and Top page data read by IDL. On the other hand, the reliability of the data of the Middle page may decrease if the data is read by IDL, but in this embodiment, the data of the Middle page used in the first stage program is input again, so there is no risk of decrease in reliability.

Furthermore, in order to increase the reliability of the IDL read data, the control unit 22 can perform reading a plurality of times and use the majority decision of the read results in the page buffer in the chip as next write data. Of course, the control unit 22 can perform reading a plurality of times during a normal reading operation and use the majority decision of the read results in the chip as the read data to the outside.

Figure 12:
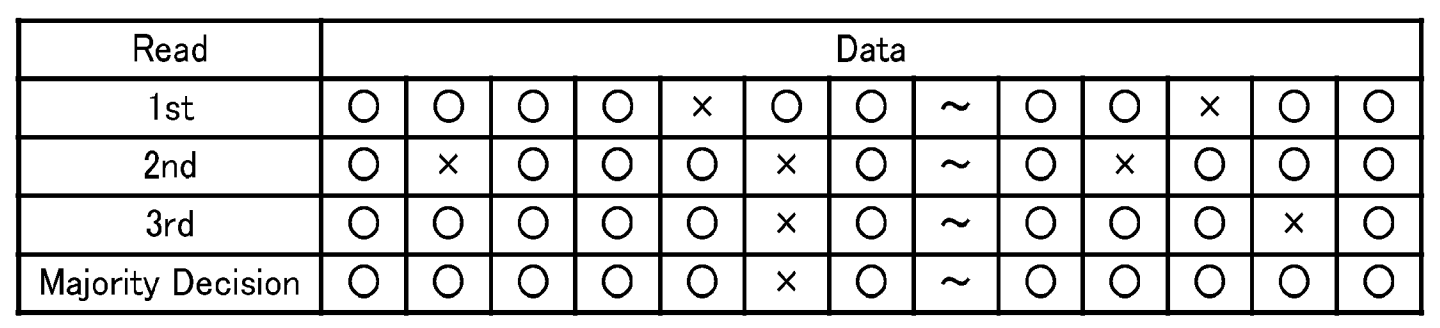

FIG. 12 is a diagram for explaining the process of the majority processing of a plurality of read results. In FIG. 12, as a result of reading data of a predetermined page, correct bits are indicated by circles (○), and incorrect bits are indicated by crosses (x). In addition, FIG. 12 illustrates the result of the majority decision when the reading is performed three times.

In each bit, it is determined that the majority result is "wrong" (a) when "wrong" is made three times and (b) when "wrong" is made twice. If p is the probability that each bit is wrong, when p=0.2, (a) the probability of three times of "wrong" is p×p×p=0.2×0.2×0.2, and (b) the probability of two times of "wrong" is (1−p)×p×p=(1−0.2)×0.2×0.2.

Therefore, it is determined that the result of the three-times majority decision is "wrong" with the probability of (p×p×p)+3×(1−p)×p×p=0.104. Thus, the control unit 22 can improve the reliability of read data by performing the process of the majority processing of the plurality of read results in the page buffer 24 in the chip.

In order to improve the reliability of the IDL read data in the second stage writing of the word line WLn, the control unit 22 may perform the reading with changing the read voltage of the word line WLn in IDL according to the data written in the first stage writing of WLn+1 or the threshold voltage.

In order to improve the reliability of the IDL read data in the second stage writing of the word line WLn, the control unit 22 may perform the reading with changing the non-selection voltage of the word line WLn+1 in IDL according to the data written in the first stage writing of the word line WLn+1 or the threshold voltage.

At the time of data writing to the Upper page, one or more program voltage pulses are applied. Then, data reading (verifying) of the Upper page is performed to confirm whether or not the memory cell moves beyond the threshold boundary level. The read level at this time is a predetermined level.

Further, it is confirmed whether or not the number of data fail bits in the Upper page is smaller than the criterion. When the number of data fail bits in the Upper page is greater than or equal to the criterion, the processes from the application of the program voltage pulse to the verifying are repeated. Then, when the number of fail bits of data becomes smaller than the criterion, the chip is ready.

Figure 13:
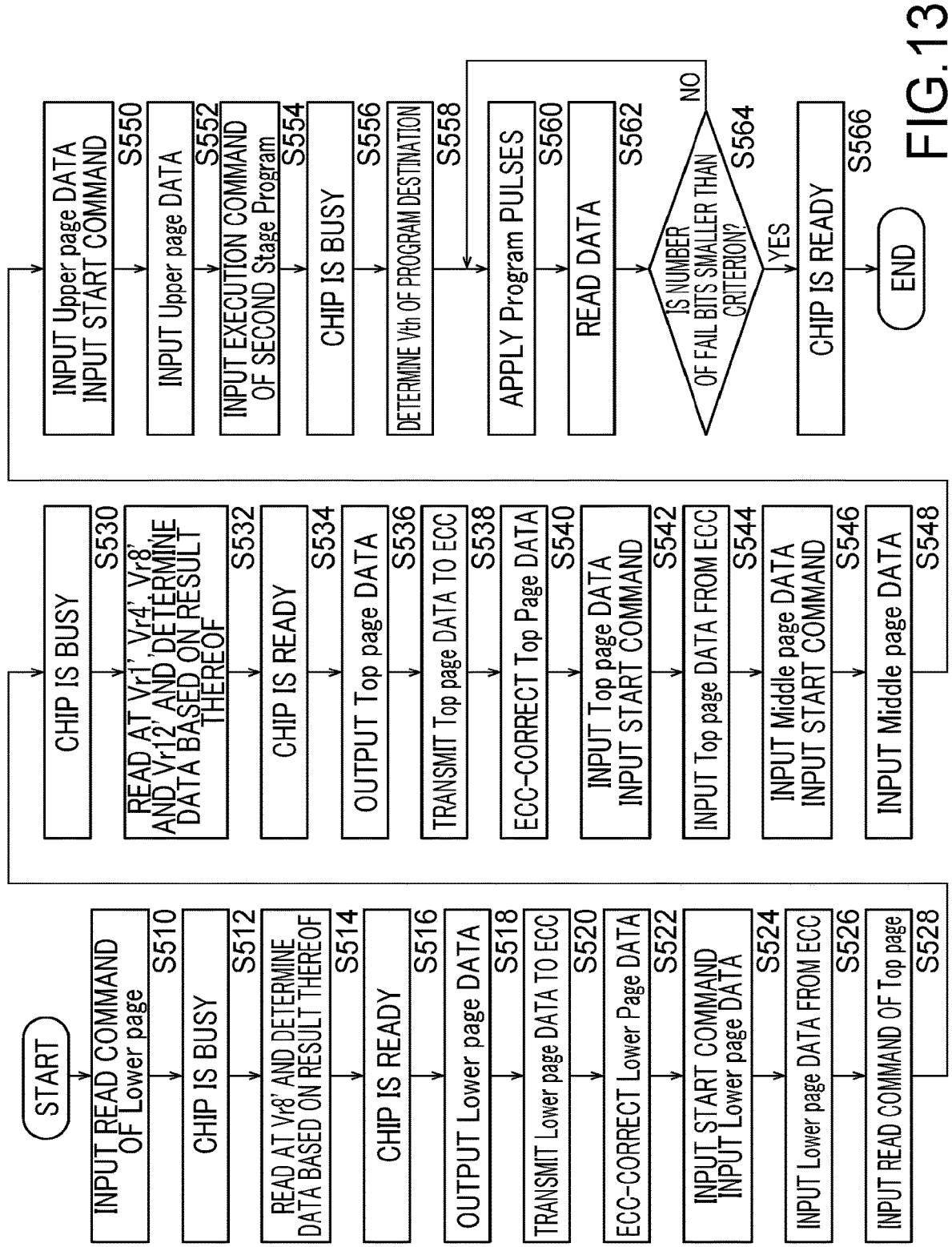
FIG. 13 is a flowchart illustrating a modification of the writing procedure in the second stage according to the first embodiment.

Here, a modification of the writing procedure illustrated in FIG. 11 will be described. FIG. 13 is a flowchart illustrating a modification of the writing procedure in the second stage according to the first embodiment. Incidentally, the flowchart of FIG. 13 additionally includes a procedure of performing error correction on the IDL data read from the data programmed in the first stage and then returning the IDL data to the nonvolatile memory 3. Specifically, first, the read command of the Lower page data is input from the memory controller 2 to the nonvolatile memory 3 (step S510). As a result, the chip becomes busy (step S512). Next, the control unit 22 reads the Lower page data at the threshold voltage of Vr8'. Then, the control unit 22 determines the value of the read data as "0" or "1" based on the read result at the threshold voltage of Vr8' (step S514). Thereafter, the chip is ready (step S516).

When the Lower page data read by the control unit 22 is output (step S518), the Lower page data is transmitted to the ECC circuit 10 (step S520). As a result, the ECC circuit 10 performs ECC correction on the Lower page data (step S522).

Next, the input start command of the Lower page data is input from the memory controller 2 to the nonvolatile memory 3 (step S524). As a result, the ECC circuit 10 inputs the Lower page data to the nonvolatile memory 3 (step S526).

Next, the read command of the Top page is input from the memory controller 2 to the nonvolatile memory 3 (step S528), and thereby the chip is busy (step S530). Thereafter, the control unit 22 reads the Top page data at the threshold voltages of Vr2' and Vr10'. Then, the control unit 22 determines the value of the read data as "0" or "1" based on the read result at the threshold voltages of Vr1', Vr4', Vr8', and Vr12' (step S532). Thereafter, the chip is ready (step S534).

When the Top page data read by the control unit 22 is output (step S536), the Top page data is transmitted to the ECC circuit 10 (step S538). As a result, the ECC circuit 10 performs ECC correction on the Top page data (step S540). Next, the input start command of the Top page data is input from the memory controller 2 to the nonvolatile memory 3 (step S542). As a result, the ECC circuit 10 inputs the Top page data to the nonvolatile memory 3 (step S544).

Thereafter, the input start command of the Middle page data is input from the memory controller 2 to the nonvolatile memory 3 (Step S546). The subsequent steps are the same as the procedure in FIG. 11. The threshold voltage Vth of the program destination is determined based on the Lower page data and the Top page data from the ECC circuit 10, the Middle page data input again, and the newly input Upper page data.

In the above-described second stage program, the data input to the nonvolatile memory 3 is performed in only two pages of the Middle page and the Upper page. However, in this second stage, the threshold voltage Vth, which is the destination of the memory cell program, requires data for four pages including the Lower page and the Top page (the threshold voltage Vth before starting the second stage). For this reason, in the program at this stage, as a preprocess, the control unit 22 performs the operation of reading the Lower page data and Top page data first and synthesizing the data with the input Middle page and Upper page to determine the threshold voltage Vth of the program destination. Note that the read level during the second stage verifying may be slightly different from the read level after the second stage writing.

Figure 14A:
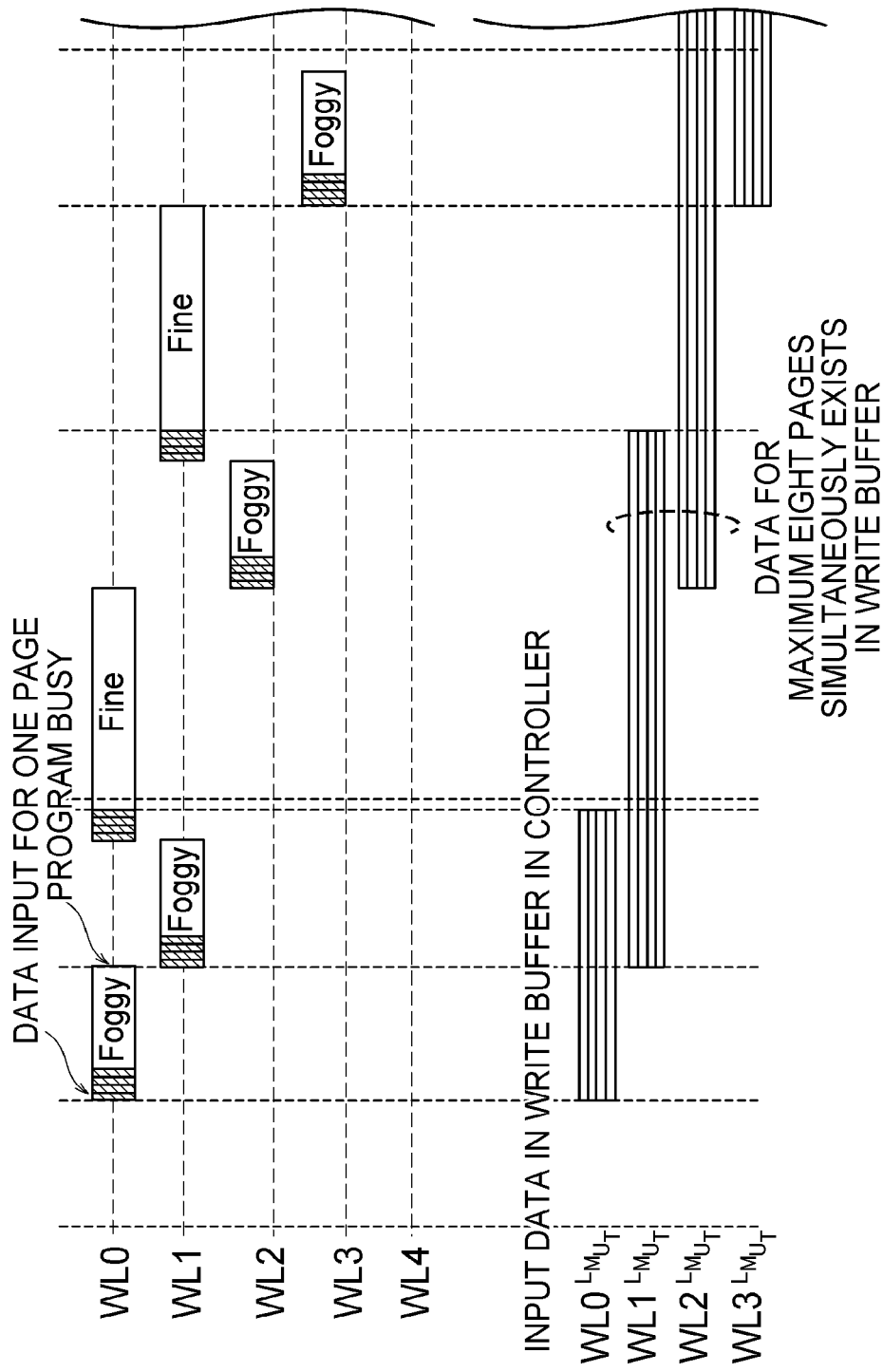
FIG. 14A is a diagram for explaining a data amount of a write buffer in a Foggy-Fine program adopting 4-3-4-4 data coding.
Figure 14B:
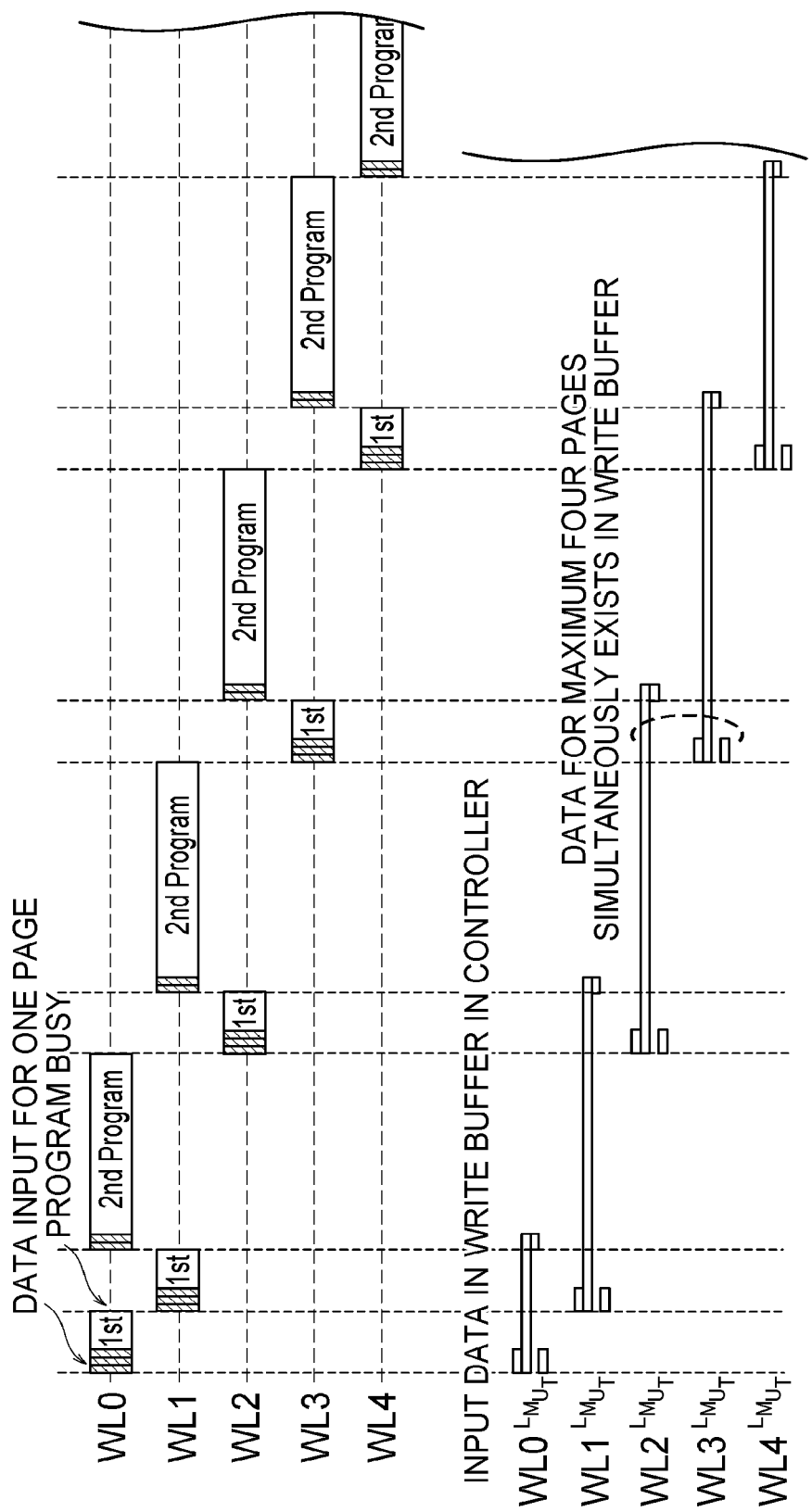
FIG. 14B is a diagram for explaining the data amount of the write buffer in this embodiment.

Here, a comparison between the process procedure of the Foggy-Fine program adopting 4-3-4-4 data coding and the program process procedure of this embodiment will be described. FIG. 14A is a diagram for explaining a data amount of a write buffer in a Foggy-Fine program adopting 4-3-4-4 data coding. FIG. 14B is a diagram for explaining the data amount of the write buffer in this embodiment. FIG. 14B illustrates an example in which 1-4-5-5 data coding is adopted.

In FIGS. 14A and 14B, the time chart of data input for block writing and program execution is shown on the upper side, and the time chart for the period necessary to hold data in the write buffer is shown on the lower side. Note that FIGS. 14A and 14B to be described later illustrate a case where the number of strings St in one block is 1 in order to simplify the description. When there are a plurality of strings St, the amount of data in the write buffer is required to be as many times the number of strings St.

In the case of the Foggy-Fine program with the 4-3-4-4 data coding, the data input for four pages and the program for four pages (Foggy stage program) are performed in the Foggy stage which is the first stage. In addition, in the case of the Foggy-Fine program with 4-3-4-4 data coding, the data input for four pages and the program for four pages (Fine stage program) are performed also in the Fine stage which is the second stage.

For each of the word lines WL0, WL1, WL2, and so on, it is necessary to store the data for four pages written in the Foggy stage in the write buffer until the program is started in the Fine stage.

Even in the Foggy-Fine program, the data for four Lower/Middle/Upper/Top pages is not written continuously in order to reduce the interference between adjacent memory cells. For example, after the Foggy stage to the word line WL0 is executed, the Foggy stage to the word line WL1 adjacent to the word line WL0 is executed before the Fine stage to the word line WL0 is executed. Further, after the Foggy stage to the word line WL0 is executed, the Foggy stage to the word line WL2 adjacent to the word line WL1 is executed before the Fine stage to the word line WL1 is executed. In the case of this method, it is necessary to hold the data for four Lower/Middle/Upper/Top pages in the write buffer until the data input of the final second Fine stage is completed. Further, in order to reduce the interference between adjacent memory cells, it is necessary to hold the data for a plurality of word lines WLi in the write buffer. For example, when the Foggy stage is executed for the word line WL2, it is necessary to hold the data for three pages for the word line WL1 and the data for three pages for the word line WL2 in the write buffer. Thus, in the case of the Foggy-Fine program with 4-3-4-4 data coding, it is necessary to hold the data for maximum eight pages in the write buffer.

As illustrated in FIG. 14B, in the program of this embodiment, for example, a two-stage program is used in 1-4-5-5 data coding. In the program of this embodiment, data input for three pages (Lower page, Middle page, and Top page) and a program for these three pages (first program) are performed in the first stage. In the case of the program of this embodiment, data input for two pages (Middle page and Upper page) and a program for one page of the Upper page (second program) are performed in the second stage.

For each of the word lines WL0, WL1, WL2, and so on, except the Middle page input in both stages, the data may be stored at the time of data input of each stage in the write buffer. When the program is started, the data may be deleted from the write buffer. For example, when data is input in the first stage, this data is stored in the write buffer. When the program is started at the first stage, the Lower page and Top page data stored in the write buffer may be deleted. Similarly, when the data is input in the second stage, this data is stored in the write buffer. When the program is started at the second stage, all the data stored in the write buffer may be deleted. For this reason, in the case of the program of this embodiment, the data that needs to be held in the write buffer is data for at most four pages.

Also in the program of this embodiment, the data for four pages of Lower/Middle/Upper/Top is not continuously written in order to reduce interference between adjacent memory cells. For example, after the first stage to the word line WL0 is executed, the first stage to the word line WL1 adjacent to the word line WL0 is executed before the second stage to the word line WL0 is executed. Similarly, after the first stage to the word line WL1 is executed, the first stage to the word line WL2 adjacent to the word line WL1 is executed before the second stage to the word line WL1 is executed.

As described above, in this embodiment, the page data other than the Middle page is necessary only for one stage of the program, and therefore the data in the write buffer can be discarded when the data input is completed. Therefore, in this embodiment, the number of pages that need to be simultaneously held in the write buffer is reduced.

The page data to be programmed into the nonvolatile memory 3 is once held in a write buffer in the RAM 6 and then input into the nonvolatile memory 3 at the time of programming. In this embodiment, the required capacity of the RAM 6 can be reduced, so that the cost can be reduced.

Also, when the Foggy-Fine program is used, all page data must be transferred twice, so it takes time to transfer and extra consumption power is necessary during the transfer. In this embodiment, the page data other than the Middle page is completed by one data transfer for each page, so that the transfer time and power consumption can be reduced to about ½.

Here, the page reading process will be described. The page reading method differs depending on whether the program for the word line WLi including the page to be read is before or after writing in the second stage.

Before the second stage writing, only the Lower page, Middle page, and Top page are valid as recorded data. Therefore, the control unit 22 reads data from the memory cell when the read page is the Lower page, the Middle page, and the Top page, but when the read page is another page (specifically, the Upper page), the control unit 22 performs control to all forcibly output "1" as read data without performing the memory cell read operation.

On the other hand, in the case of the word line WLi that is completed to the second stage, the control unit 22 reads the memory cell regardless of whether the read page is any one of the Top/Upper/Middle/Lower pages. In this case, since the necessary read voltage differs depending on which page is read, the control unit 22 executes only necessary read for the selected page.

Figure 15:
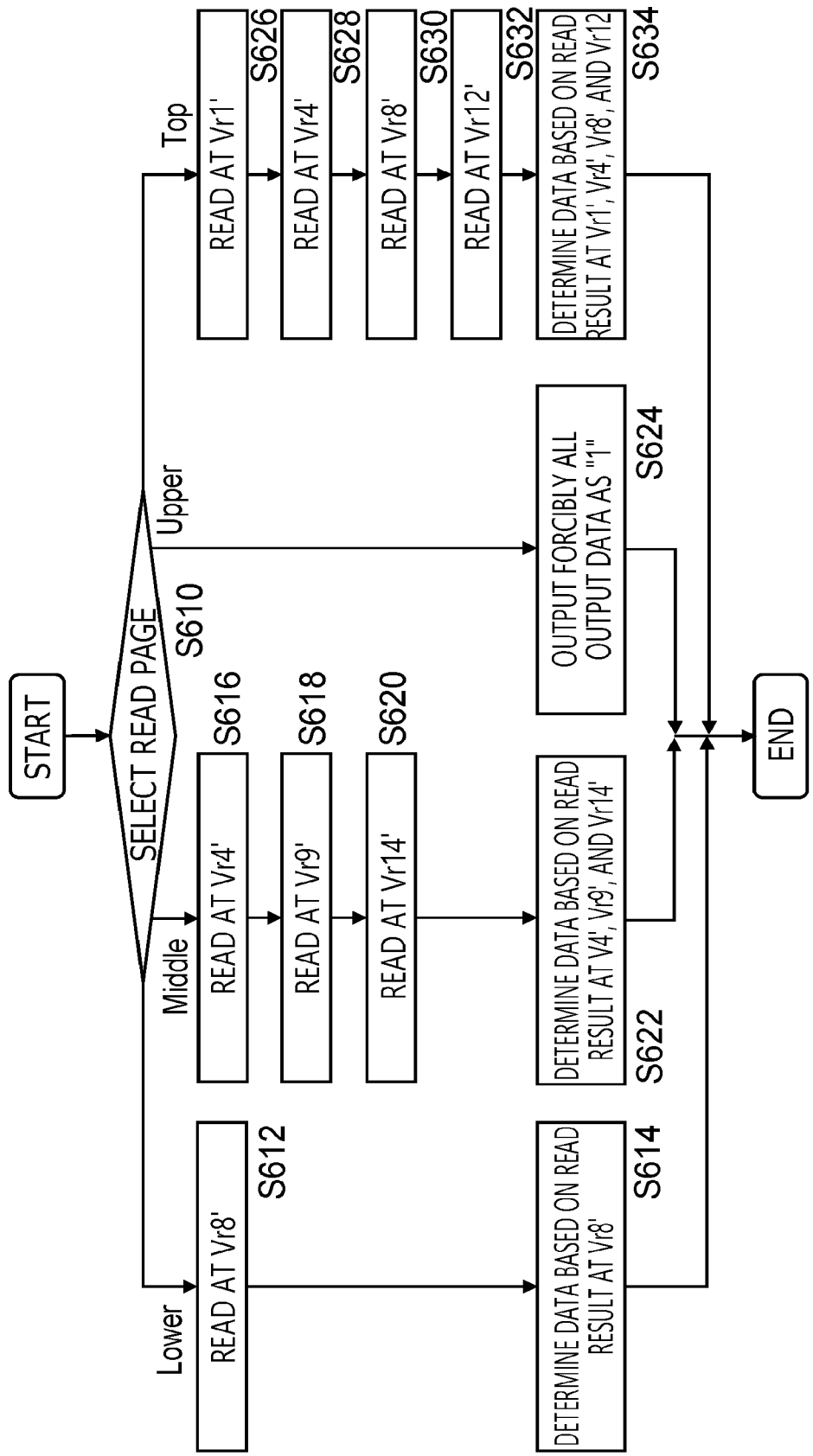
FIG. 15 is a flowchart illustrating a page read process procedure on a word line for which the program is completed up to the first stage.

Hereinafter, a specific process procedure for page reading will be described. FIG. 15 is a flowchart illustrating a page read process procedure on a word line for which the program is completed up to the first stage (the second stage program is not completed) in the memory system 1 according to the first embodiment. According to 1-4-5-5 data coding illustrated in FIG. 6, since there is one boundary between the threshold states at which the Lower page data changes, the control unit determines the data depending on the position of the threshold in the two ranges separated by the boundary. For example, when the threshold voltage is smaller than Vr8', the control unit 22 performs control to output "1" as data of the memory cell. On the other hand, when the threshold voltage is higher than Vr8', the control unit 22 performs control to output "0" as data of the memory cell.

In addition, since there are three boundaries between threshold states where the data of the Middle page changes, the control unit 22 determines the data depending on the position of the threshold in the four ranges separated by these boundaries. In addition, since there are four boundaries between threshold states where the data of the Top page changes, the control unit determines the data depending on the position of the threshold in the five ranges separated by these boundaries.

As illustrated in FIG. 15, in the case of the word line WLi before the second stage writing, the control unit 22 selects a read page (step S610). When the read page is the Lower page, the control unit 22 performs reading with one read voltage (step S612). This voltage is Vr8'. However, as described above, in the case of a word line before second stage writing, as illustrated in FIG. 8(T2), with a margin of the read voltage and the threshold voltage, Vr8' may also be used, for example. Then, the control unit 22 determines the value of the read data as "0" or "1" based on the read result at the threshold voltage of Vr8 (step S614).

When the read page is the Middle page, the control unit 22 performs reading with three read voltages (steps S616, S618, and S620). This voltage is Vr4, Vr9, and Vr14 as described above. However, in the case of a word line before second stage writing, as illustrated in FIG. 8(T2), with a margin of the read voltage and the threshold voltage, for example, Vr4', Vr9', and Vr14' may also be used instead of those voltages, respectively. Then, the control unit 22 determines the value of the read data as "0" or "1" based on the read result at the threshold voltage of Vr4, the read result at the threshold voltage of Vr9, and the read result at the threshold voltage of Vr14 (step S622). Here, as described above, since the intervals of the threshold distributions having different Middle page data are narrow, and the read margin of the Middle page is narrow, the value of the read data may be extremely unreliable, and the Middle page data before the second stage writing may be defined as invalid. In this case, when the read page is the Middle page, the control unit 22 may perform control to all forcibly output "1" as the output data of the memory cell.

When the read page is the Upper page, since the program of the Upper page is not performed in the first program, the control unit 22 forcibly outputs all "1" as output data (step S624).

When the read page is the Top page, the control unit 22 performs reading with four read voltages (steps S626, S628, S630, and S632). This voltage is Vr1, Vr4, Vr8, and Vr12 as described above. However, in the case of a word line before second stage writing, as illustrated in FIG. 8(T2), with a margin of the read voltage and the threshold voltage, for example, Vr1', Vr4', Vr8', and Vr12' may also be used instead of those voltages, respectively. Then, the control unit 22 determines the value of the read data as "0" or "1" based on the read result at the threshold voltage of Vr1, the read result at the threshold voltage of Vr4, the read result at the threshold voltage of Vr8, and the read result at the threshold voltage of Vr12 (step S634).

Figure 16A:
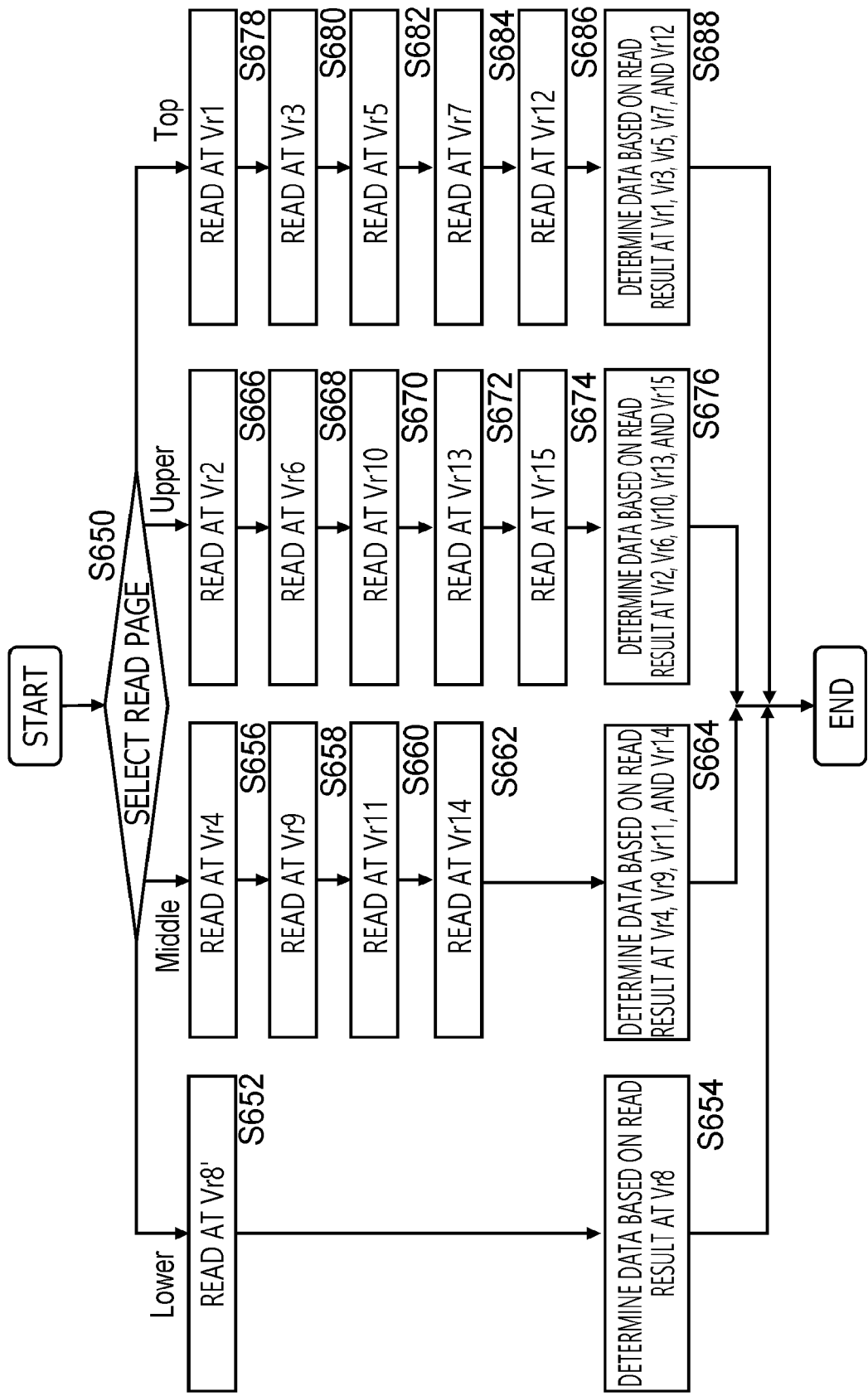
FIG. 16A is a flowchart illustrating a page read process procedure on a word line for which the program is completed up to the second stage.

FIG. 16A is a flowchart illustrating a page read process procedure on a word line for which the program is completed up to the second stage in the memory system 1 according to the first embodiment. In the case of the word line WLi that is completely programmed up to the second stage, the control unit 22 selects a read page (step S650). When the read page is the Lower page, the control unit 22 performs reading with one threshold voltage of Vr8 (step S652). Then, the control unit 22 determines the value of the read data as "0" or "1" based on the read result at one threshold voltage of Vr8 (step S654).

When the read page is the Middle page, the control unit 22 performs reading with the threshold voltages of Vr4, Vr9, Vr11, and Vr14 (steps S656, S658, S660, and S662). Then, the control unit 22 determines the value of the read data as "0" or "1" based on the read result at the threshold voltages of Vr4, Vr9, Vr11, and Vr14 (step S664).

When the read page is the Upper page, the control unit 22 performs reading with threshold voltages of Vr2, Vr6, Vr10, Vr13, and Vr15 (steps S666, S668, S670, S672, and S674). Then, the control unit 22 determines the value of the read data as "0" or "1" based on the read result at the threshold voltages of Vr2, Vr6, Vr10, Vr13, and Vr15 (step S676).

When the read page is the Top page, the control unit 22 performs reading with the threshold voltages of Vr1, Vr3, Vr5, Vr7, and Vr12 (steps S678, S680, S682, S684, and S686). Then, the control unit 22 determines the value of the read data as "0" or "1" based on the read result at the threshold voltages of Vr1, Vr3, Vr5, Vr7, and Vr12 (step S688).

Note that the memory controller 2 can manage and identify whether the program for the word line WLi is before or after the completion of the second stage writing. In the memory system 1, since the memory controller 2 performs program control, if the memory controller 2 records the progress, the memory controller 2 can easily refer to the address and the program state of the nonvolatile memory 3. In this case, when reading is performed from the nonvolatile memory 3, the memory controller 2 identifies the program state of the word line WLi including the target page address and issues a read command corresponding to the identified state. In addition, another method can be provided in which a flag cell is provided for each word line WLi, the flag cell is written at the time of second stage writing, and whether the program is before or after the completion of second stage writing is managed and identified in the nonvolatile memory 3 according to the flag cell data.

A modification of the page read process will be described below. In the modification of the page read process, the program for the word line WLi including the page to be read is performed only after the second stage writing. The page read process according to the modification is effective in that the reading speed may be improved when all data of the selected word line is read.

FIG. 16B shows an example of data coding suitable for the page read process according to the modification. Another page read process performed in the case of this data coding will be described below. In the page read process according to the modification, data are read from all of Top, Upper, Middle, and Lower pages.

Figure 16C:
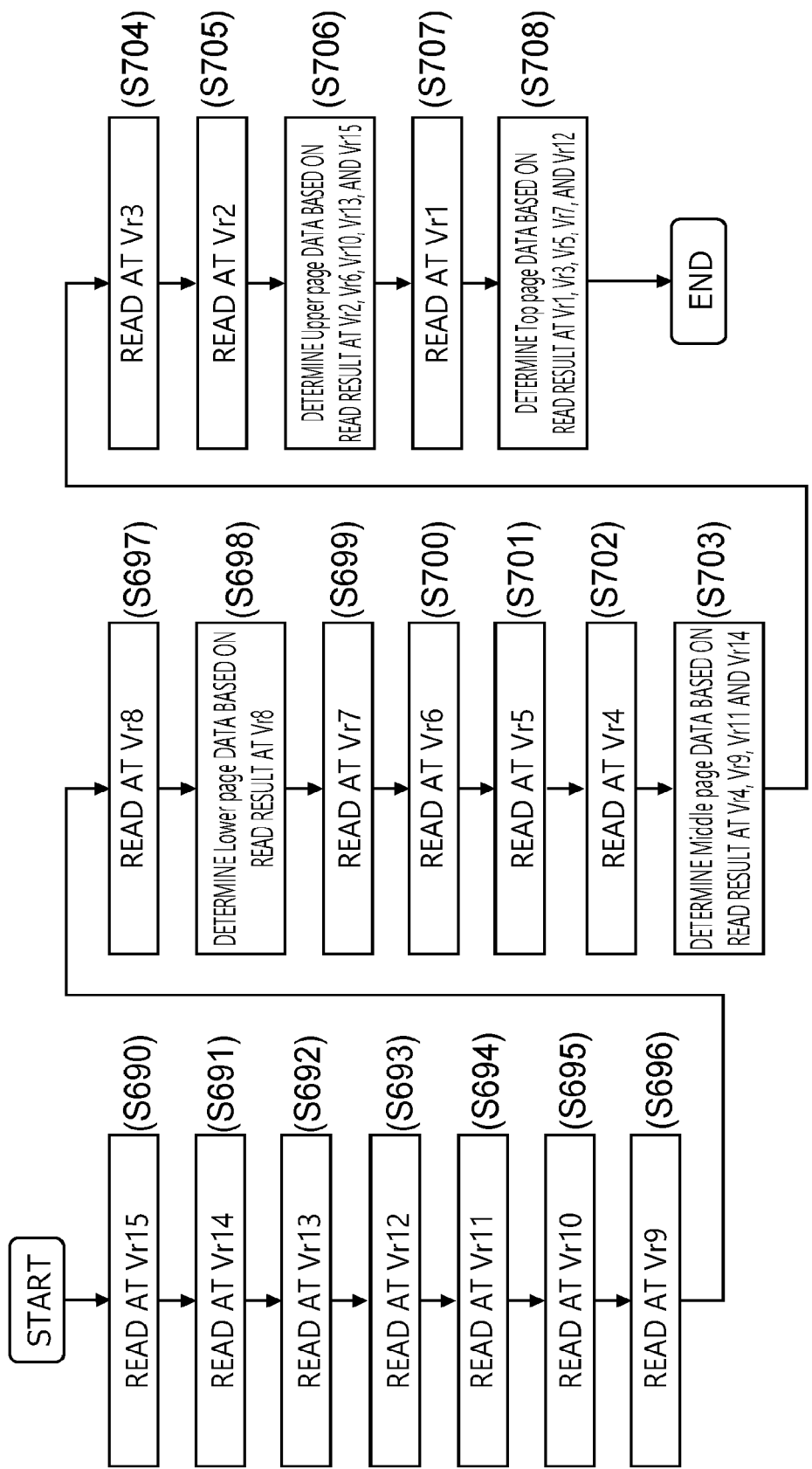
FIG. 16C is a flowchart illustrating a page read process procedure according to the modification.
Figure 16D:
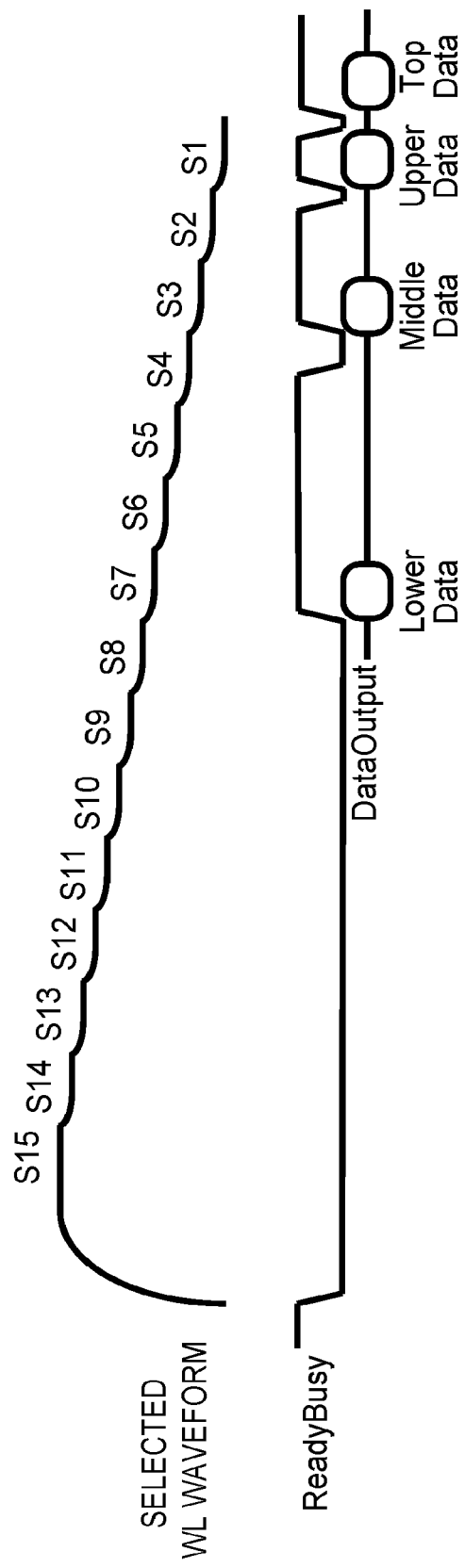
FIG. 16D is a voltage waveform diagram on the selected word line, a ReadyBusy signal line, and an output data line.

FIG. 16C is a flowchart illustrating a page read process procedure according to the modification. FIG. 16D is a voltage waveform diagram on the selected word line, a ReadyBusy signal line, and an output data line. The control unit 22 sequentially performs a reading operation with all of 15 read voltages from Vr15 to Vr1. As shown in FIG. 16D, the reading operation is started with the highest voltage, Vr15 (step S690), and then the read voltage is lowered stepwise (steps S691 to S707). When the reading procedure required to determine the data read from a certain page is completed, the data may be outputted.

In the page read process according to the modification, the data is sequentially read from the voltage Vr15, and when the data has been read until the voltage Vr8 (step S697), data of the Lower page is determined and the data can be outputted (step S698). In step S698, the data of the Lower page is determined based on the data read with the read voltage Vr8.

When the reading operation proceeds to the read voltage Vr4 (step S702), data of the Middle page is determined (step S703). In step S703, the data of the Middle page is determined based on the data read with the read voltages Vr4, Vr9, Vr11 and Vr14.

When the reading operation proceeds to the read voltage Vr2 (step S705), data of the Upper page is determined (step S706). In step S706, the data of the Upper page is determined based on the data read with the read voltages Vr6, Vr10, Vr13 and Vr15.

When the reading operation proceeds to the read voltage Vr1 (step S707), data of the Top page is finally determined (step S708). In step S708, the data of the Top page is determined based on the data read with the read voltages Vr1, Vr3, Vr5, Vr7, and Vr12.

Although the latency for determining and outputting the data of an arbitrarily selected page in the page read process according to the modification becomes long, the total time for reading all of four pates is shorter than that in the page read process where the pages are read one by one as described before. As shown in FIG. 16D, the charging of the word line from zero to the highest voltage, Vr15, is performed only once in the preparation for the reading operation, and when the read voltage level is changed, the fluctuations in the voltage change is small and the voltage becomes stable in a short time. Therefore, the time required for the stabilization of the read voltage is shortened. This shortens the total time needed for changing voltage levels in the selected word line when the reading operation is performed for all of the read voltages Vr15 to Vr1. As a result, the reading operation may be performed at a high speed.

Although the example of data coding shown in FIG. 16B has been described, basically any kind of data coding may be performed in the above-described manner. Since the reading operation is performed with the read voltage being sequentially changed from the highest voltage to the lowest voltage, whether the data of a page can be outputted depends on whether the reading operation with the read voltages that are required to determine the data is completed. Therefore, depending on the type of data coding, the pages are not read in the order of the Lower page, the Middle page, the Upper page, and the Top page.

As described above, in the first embodiment, when programming the nonvolatile memory 3 (the NAND memory of 4 bits/Cell having a three-dimensional structure or a two-dimensional structure), 1-4-5-5 data coding is adopted, and the program stage is set to a two-stage system. Since the programming is performed in two stages as above, the amount of data input during data programming at each stage is reduced, and the amount of write buffer required for the memory controller 2 can be suppressed. In addition, since the number of threshold boundaries in each page is uniform, the deviation of the bit error rate between the pages of the nonvolatile memory 3 can be reduced, and thus the cost of the ECC can be reduced. Further, since data transfer is performed only once for each page except for one page, transfer time and power consumption can be suppressed.

Further, since each program stage is executed while straddling the word line WLi, the amount of interference between adjacent cells with the adjacent word line WLi can be reduced. Further, since 1-4-5-5 data coding is used, the amount of change in the threshold distribution in the second program is small, so that the amount of interference between adjacent cells can be suppressed. Further, by inputting data in both stages in one page (specifically, the Middle page), it is possible to expand the IDL margin before the second stage and improve the reliability of the write sequence. In addition, since 1-4-5-5 data coding is used, at the time of the first stage program, the number of threshold boundaries in the Lower page is set to one, and the number of threshold boundaries in the Middle page is set to two, so that the first stage program, that is, the Lower page and Middle page program can be accelerated. Incidentally, the first stage program can be sped up, for example, when the step voltage at the time of writing while stepping up the write voltage little by little when writing and writing verification are repeated is set to a larger value compared to the time of the second stage program.

Second Embodiment

In the first embodiment, 1-4-5-5 data coding is described as an example, but various data coding modifications are possible. The hardware configuration of the memory system 1 according to a second embodiment is common to that of the memory system 1 according to the first embodiment. FIGS. 17 to 25 illustrate examples of data coding of the memory system 1 according to the second embodiment. The memory system 1 according to the second embodiment uses data coding other than 1-4-5-5 data coding.

Figure 17:
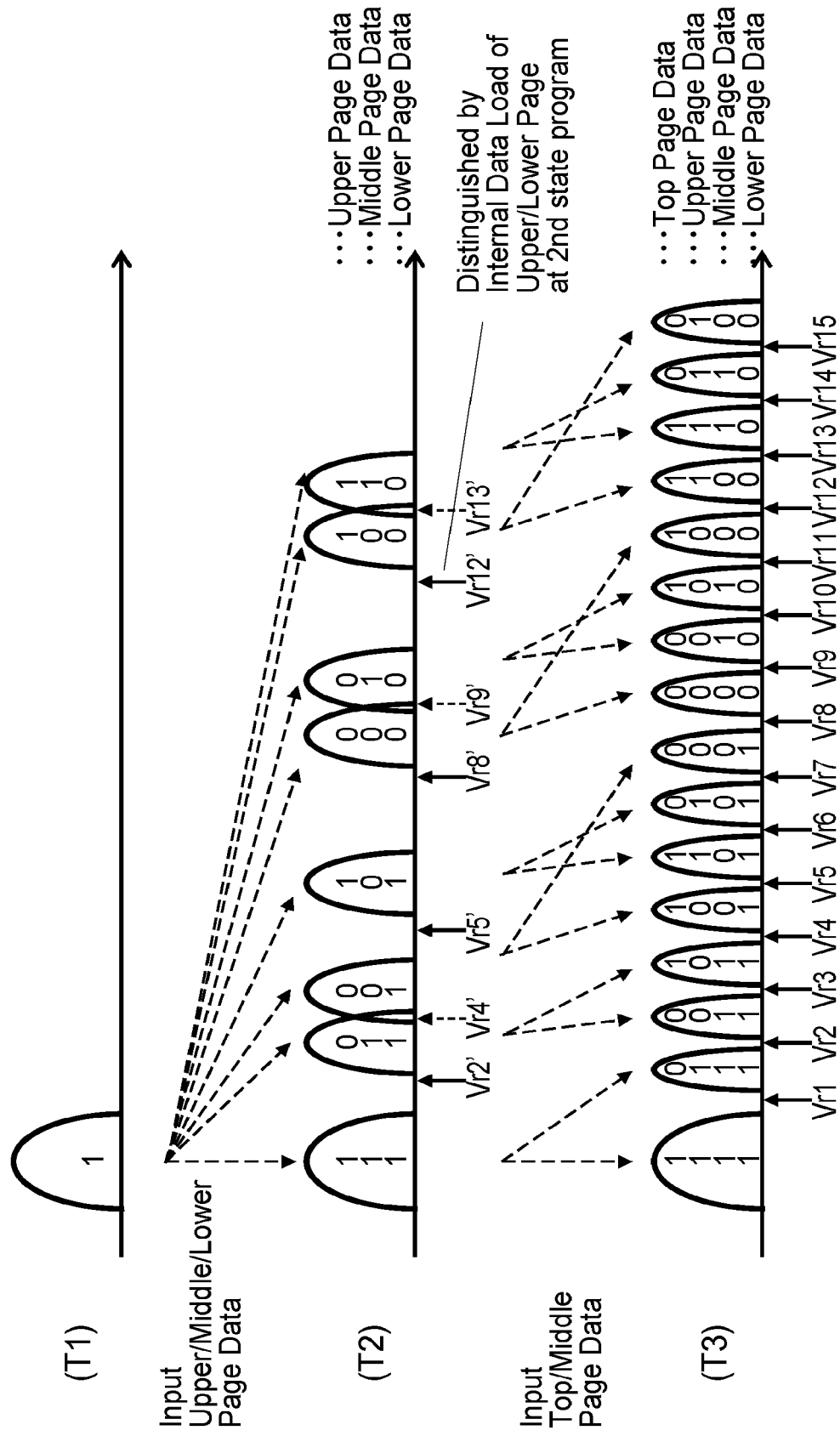
FIG. 17 is a diagram illustrating an example of 1-5-4-5 data coding.

FIG. 17 is a diagram illustrating an example of 1-5-4-5 data coding. In the example of FIG. 17, the number of transitions in the threshold region at the end of the second program is three at maximum. Here, the threshold region at the time of completion of the first stage program and the threshold region at time of completion of the second stage program do not exactly match the voltage distribution range. However, in this specification, for convenience, the number of threshold regions changed when the second program is performed is called as the number of transitions by associating each threshold region at time of completion of the first stage program with the threshold region at time of completion of the second stage program having the closest voltage distribution range. In the case of FIG. 17, in the first stage, the data of the Lower page, the Middle page, and the Upper page is input for programming, and in the second stage, the data of the Top page and the Middle page is input for programming. The data of the Middle page is input redundantly in the first stage and second stage. The interval between the two threshold regions that can be separated by the data value of the Middle page at the time of completion of the first stage program is narrower than the interval between other threshold regions.

Figure 18:
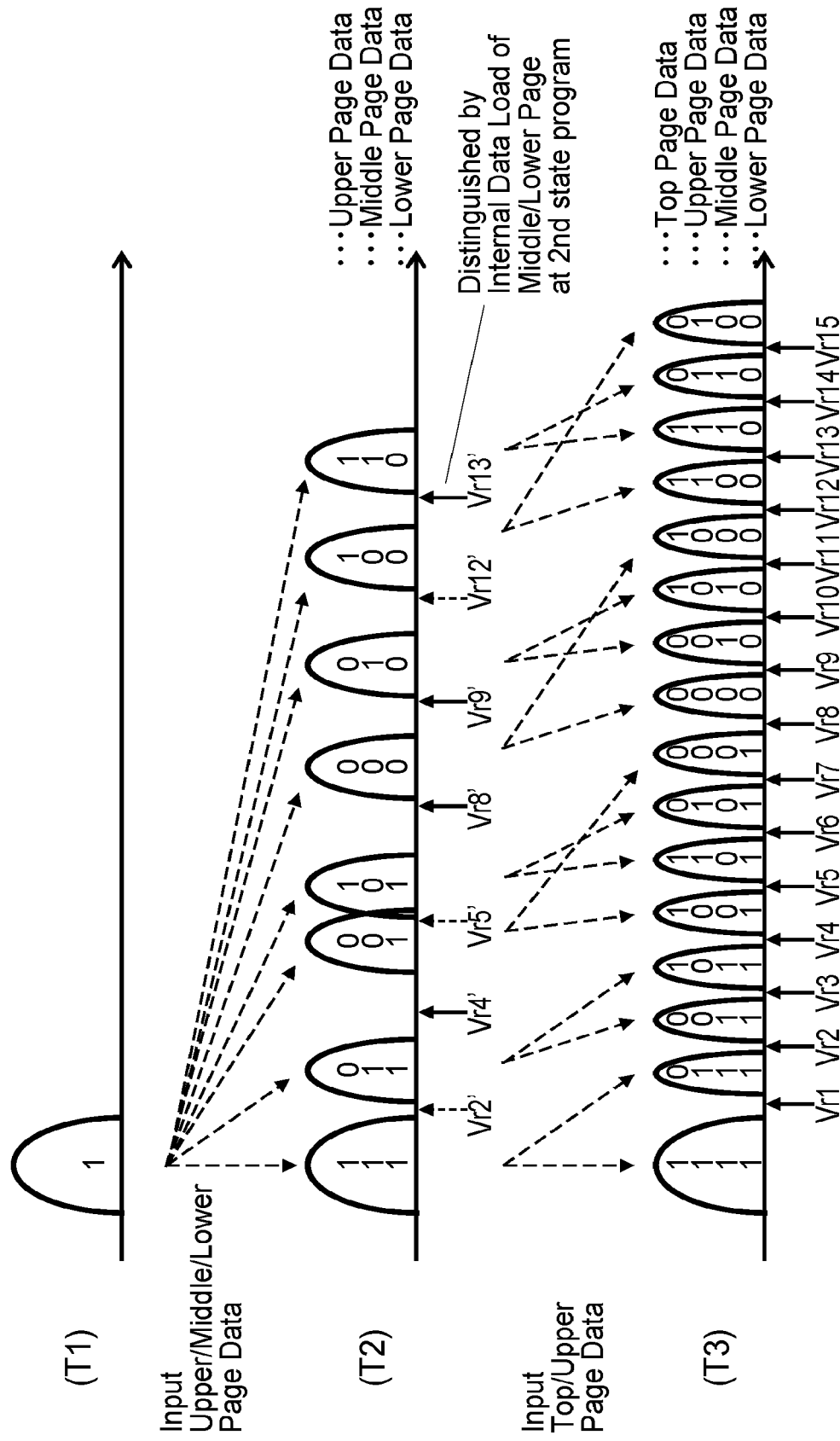
FIG. 18 is a diagram illustrating an example of 1-5-4-5 data coding.

FIG. 18 is a diagram illustrating an example of 1-5-4-5 data coding. In the example of FIG. 18, the number of transitions in the threshold region at the end of the second program is three at maximum. In the case of FIG. 18, in the first stage, the data of the Lower page, the Middle page, and the Upper page is input for programming, and in the second stage, the data of the Top page and the Upper page is input for programming. The data of the Upper page is input redundantly in the first stage and second stage. The interval between the two threshold regions that can be separated by the data value of the Upper page at the time of completion of the first stage program is narrower than the interval between other threshold regions.

Figure 19:
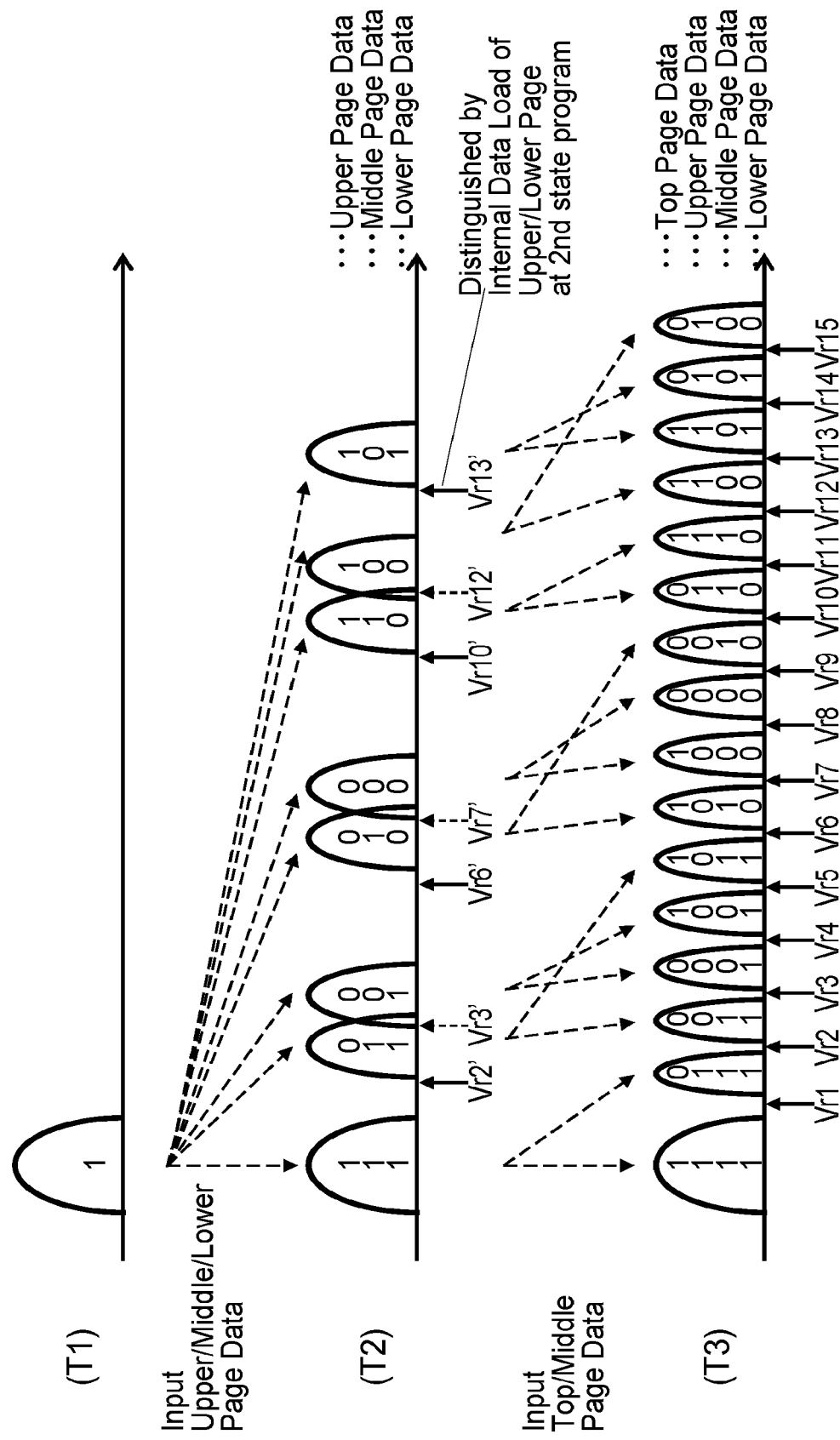
FIG. 19 is a diagram illustrating an example of 3-5-2-5 data coding.

FIG. 19 is a diagram illustrating an example of 3-5-2-5 data coding. In the example of FIG. 18, the number of transitions in the threshold region at the end of the second program is three at maximum. In the case of FIG. 18, in the first stage, the data of the Lower page, the Middle page, and the Upper page is input for programming, and in the second stage, the data of the Top page and the Middle page is input for programming. The data of the Middle page is input redundantly in the first stage and second stage. The interval between the two threshold regions that can be separated by the data value of the Middle page at the time of completion of the first stage program is narrower than the interval between other threshold regions.

Figure 20:
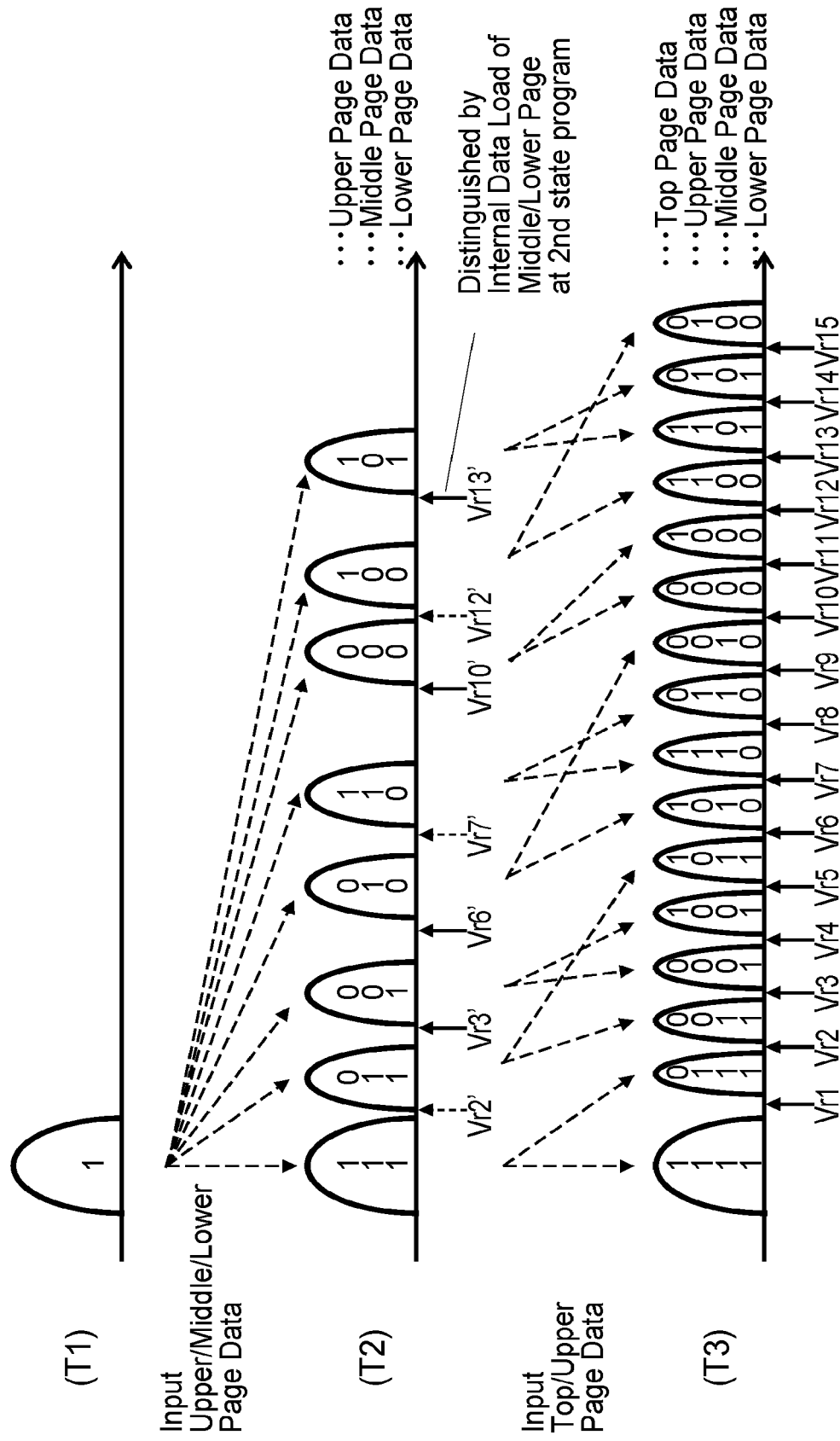
FIG. 20 is a diagram illustrating an example of 3-3-4-5 data coding.

FIG. 20 is a diagram illustrating an example of 3-3-4-5 data coding. In the example of FIG. 20, the number of transitions in the threshold region at the end of the second program is three at maximum. In the case of FIG. 20, in the first stage, the data of the Lower page, the Middle page, and the Upper page is input for programming, and in the second stage, the data of the Top page and the Upper page is input for programming.

Figure 21:
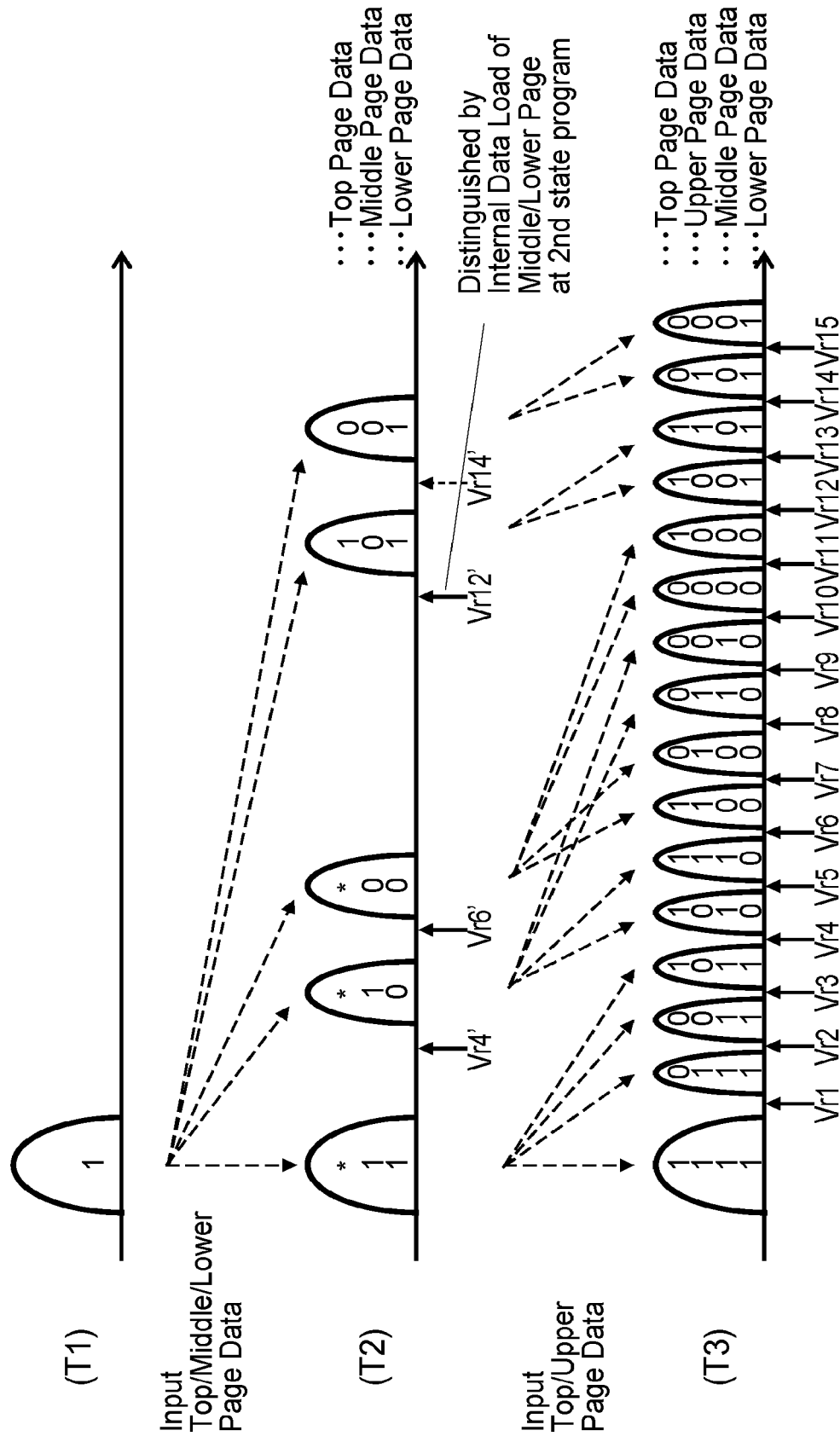
FIG. 21 is a diagram illustrating an example of 2-3-5-5 data coding.

FIG. 21 is a diagram illustrating an example of 2-3-5-5 data coding. In the example of FIG. 21, the number of transitions in the threshold region at the end of the second program is five at maximum. In the case of FIG. 21, in the first stage, the data of the Lower page, the Middle page, and the Top page is input for programming, and in the second stage, the data of the Top page and the Upper page is input for programming. The data of the Top page is input redundantly in the first stage and second stage. In the case of FIG. 21, when the first stage program is completed, three threshold regions become the same whether the Top page data is 0 or 1, and the total number of threshold regions becomes five. Therefore, it is possible to widen the intervals between the threshold regions and to correctly perform the data read at the time of completion of the first stage program.

Figure 22:
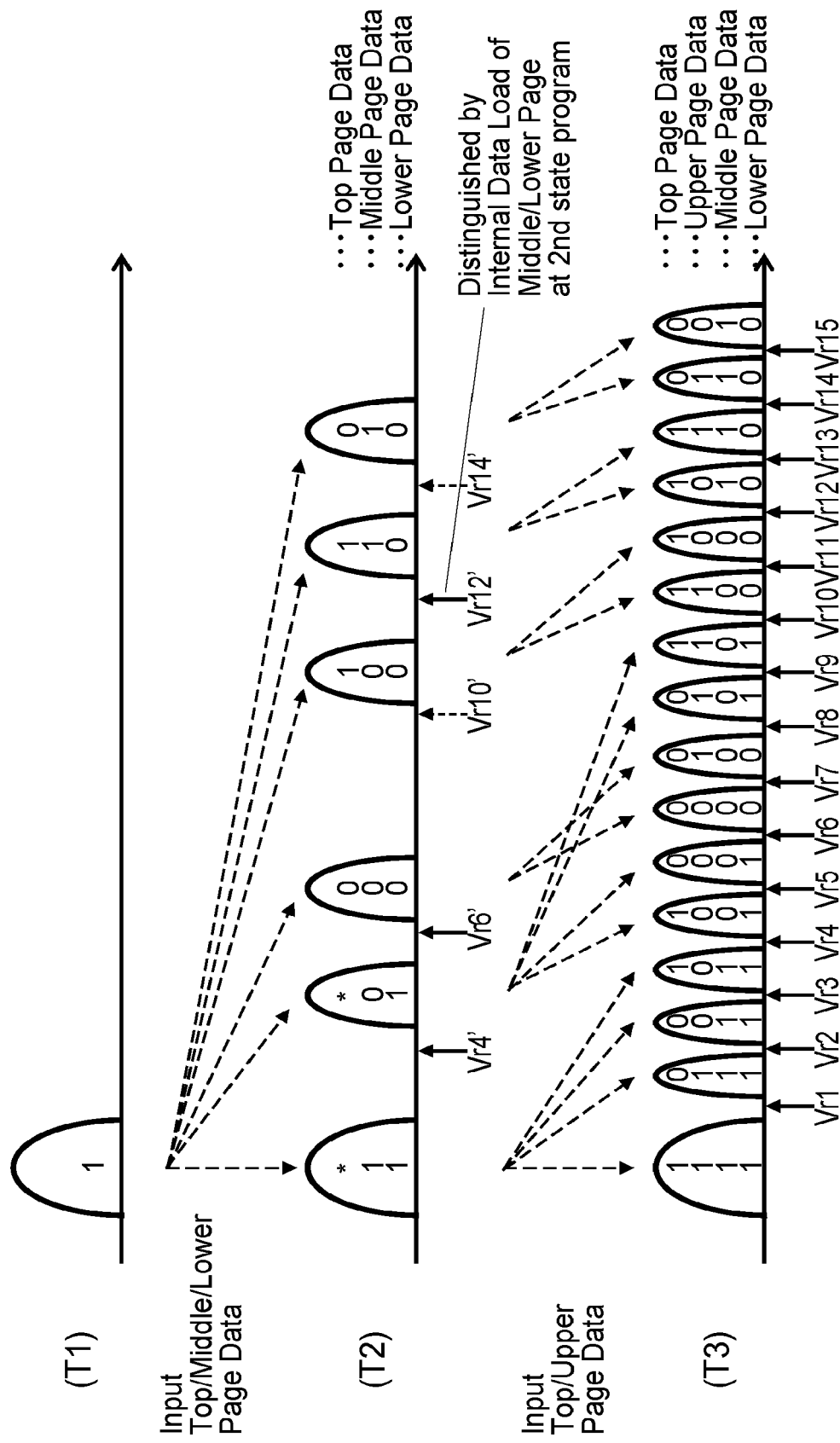
FIG. 22 is a diagram illustrating an example of 3-2-5-5 data coding.

FIG. 22 is a diagram illustrating an example of 3-2-5-5 data coding. In the example of FIG. 22, the number of transitions in the threshold region at the end of the second program is five at maximum. In the case of FIG. 22, in the first stage, the data of the Lower page, the Middle page, and the Top page is input for programming, and in the second stage, the data of the Top page and the Upper page is input for programming. The data of the Top page is input redundantly in the first stage and second stage. In the case of FIG. 22, when the first stage program is completed, two threshold regions become the same whether the Top page data is 0 or 1, and the total number of threshold regions becomes six.

Figure 23:
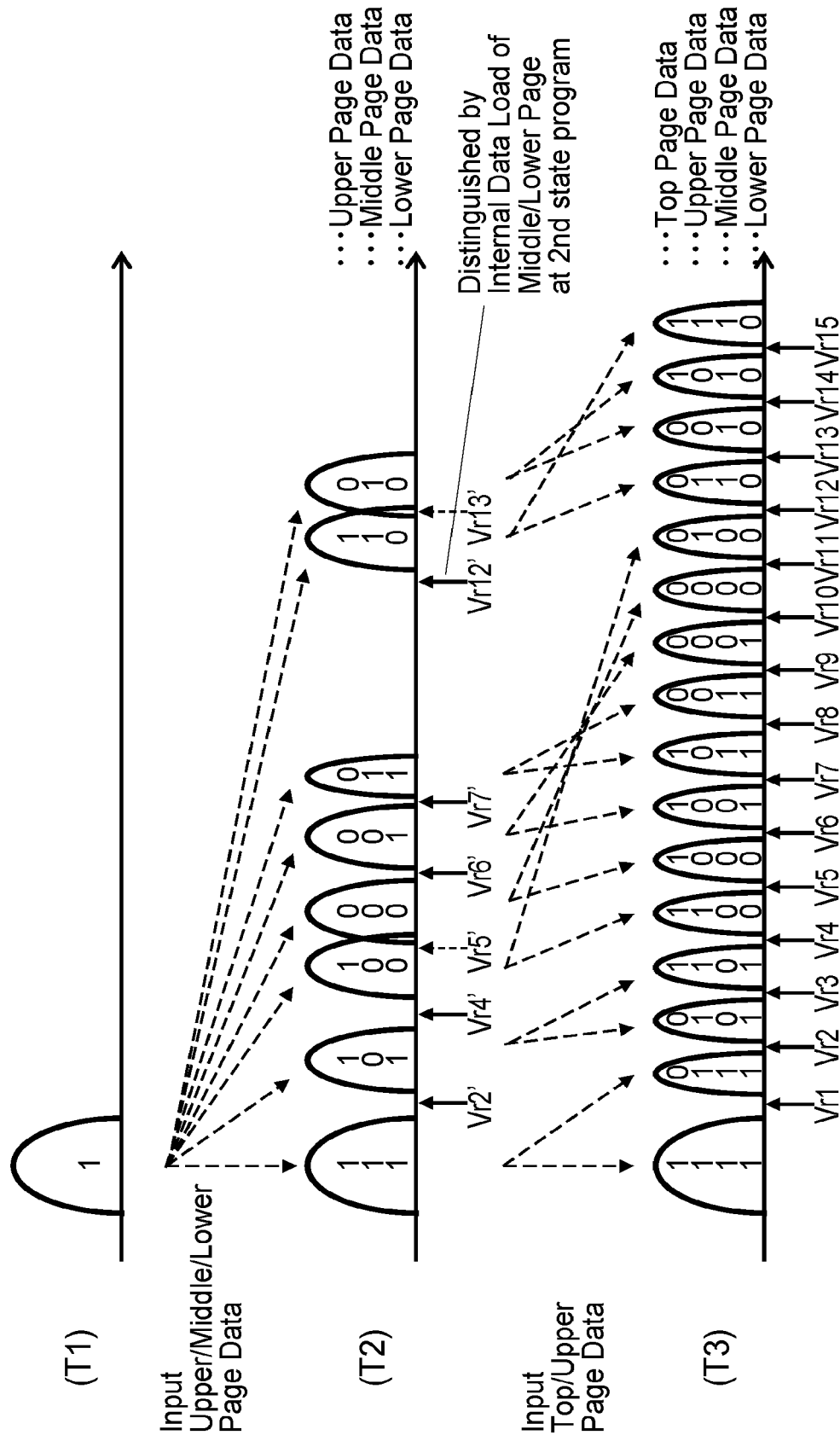
FIG. 23 is a diagram illustrating an example of 3-4-4-4 data coding.

FIG. 23 is a diagram illustrating an example of 3-4-4-4 data coding. In the example of FIG. 23, the number of transitions in the threshold region at the end of the second program is seven at maximum. In the case of FIG. 23, in the first stage, the data of the Lower page, the Middle page, and the Upper page is input for programming, and in the second stage, the data of the Top page and the Upper page is input for programming. The data of the Upper page is input redundantly in the first stage and second stage. The interval between the two threshold regions that can be separated by the data value of the Upper page at the time of completion of the first stage program is narrower than the interval between other threshold regions.

Figure 24:
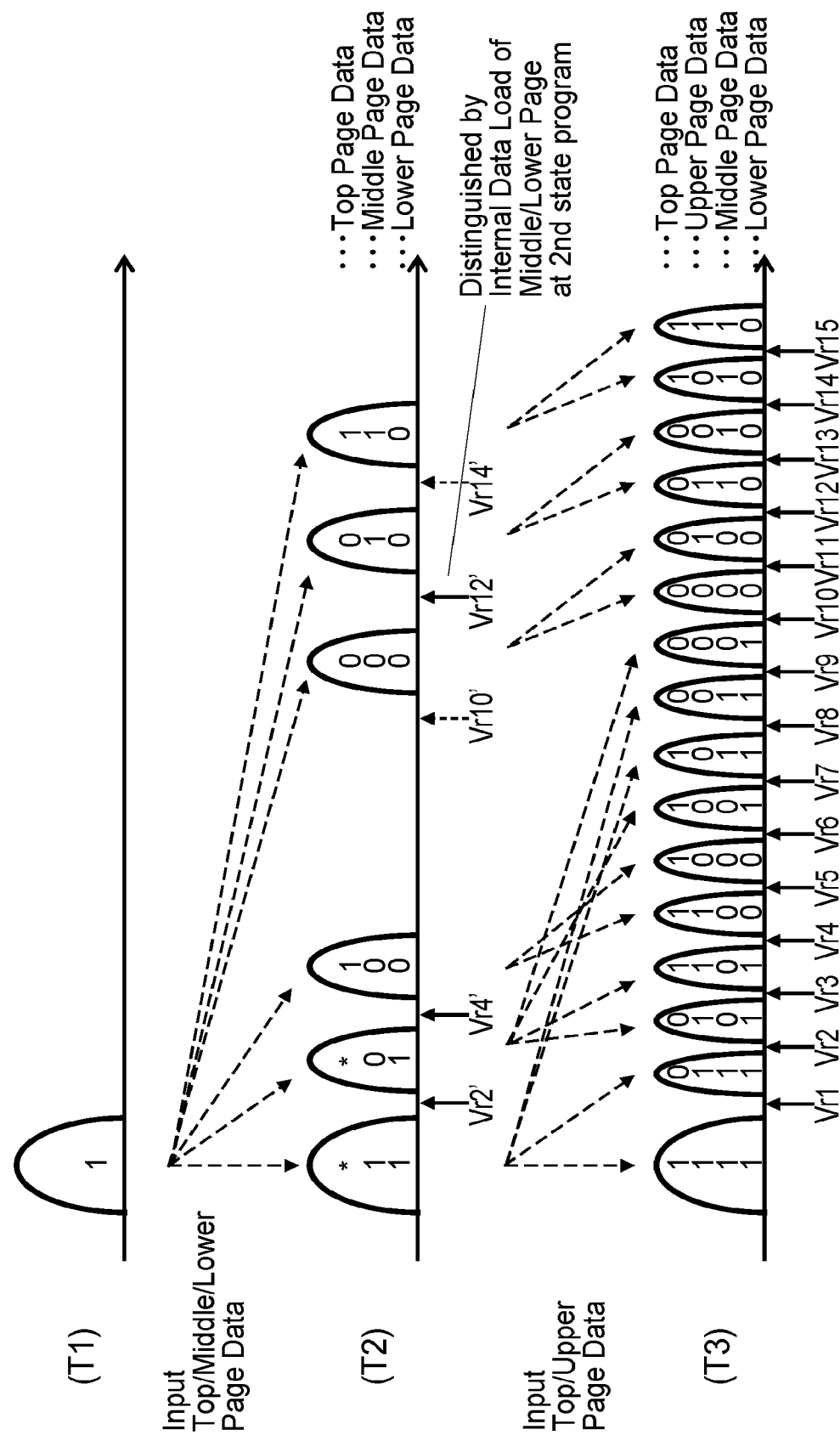
FIG. 24 is a diagram illustrating an example of 3-4-4-4 data coding.

FIG. 24 is a diagram illustrating an example of 3-4-4-4 data coding. In the example of FIG. 24, the number of transitions in the threshold region at the end of the second program is eight at maximum. In the case of FIG. 24, in the first stage, the data of the Lower page, the Middle page, and the Top page is input for programming, and in the second stage, the data of the Top page and the Upper page is input for programming. The data of the Top page is input redundantly in the first stage and second stage. In the case of FIG. 24, when the first stage program is completed, two threshold regions become the same whether the Top page data is 0 or 1, and the total number of threshold regions becomes six.

FIGS. 17 to 24 are merely examples of data coding, and other data coding may be adopted.

Figure 25:
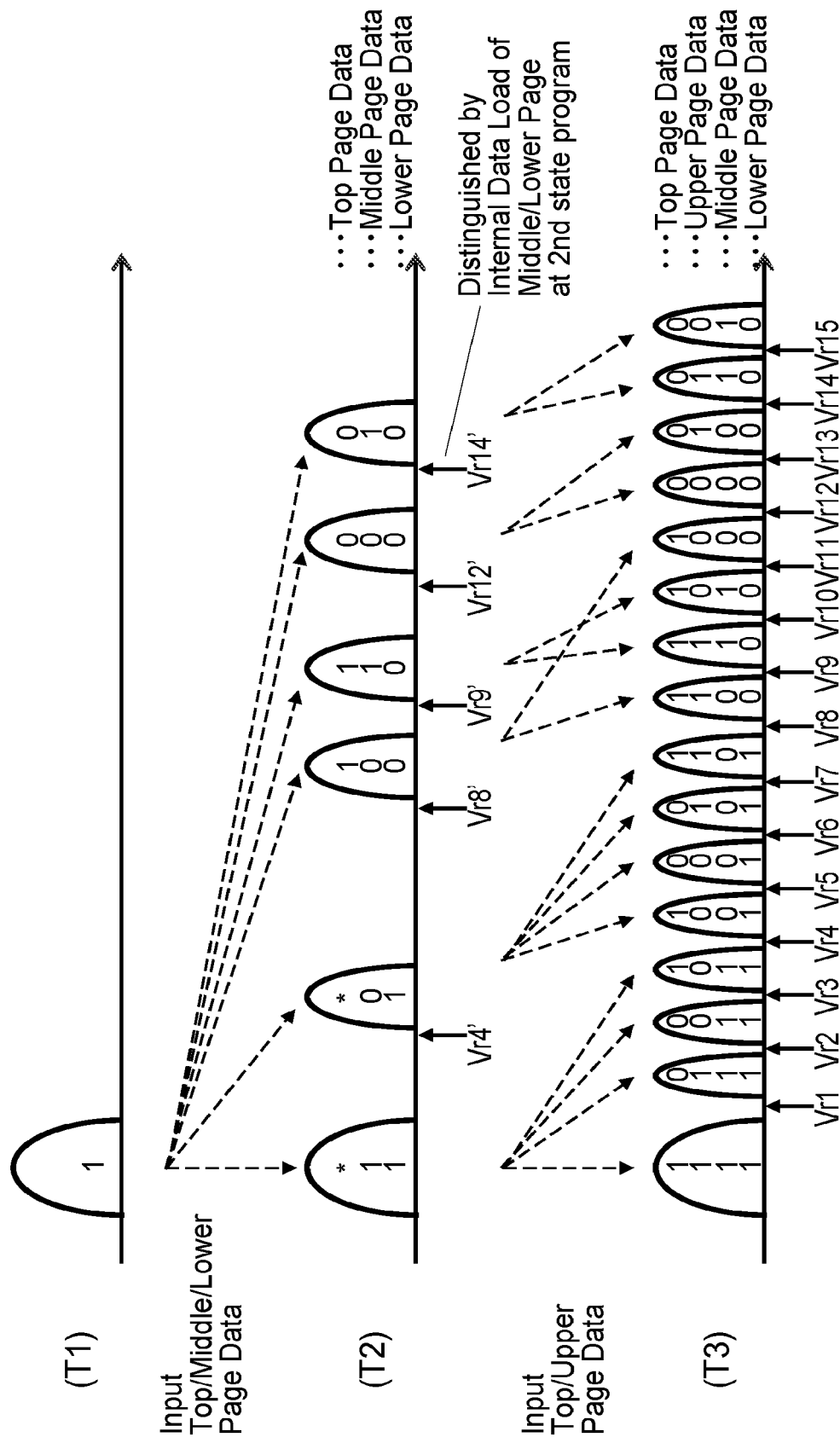
FIG. 25 is a diagram illustrating an example of 1-4-5-5 data coding.
Figure 26:
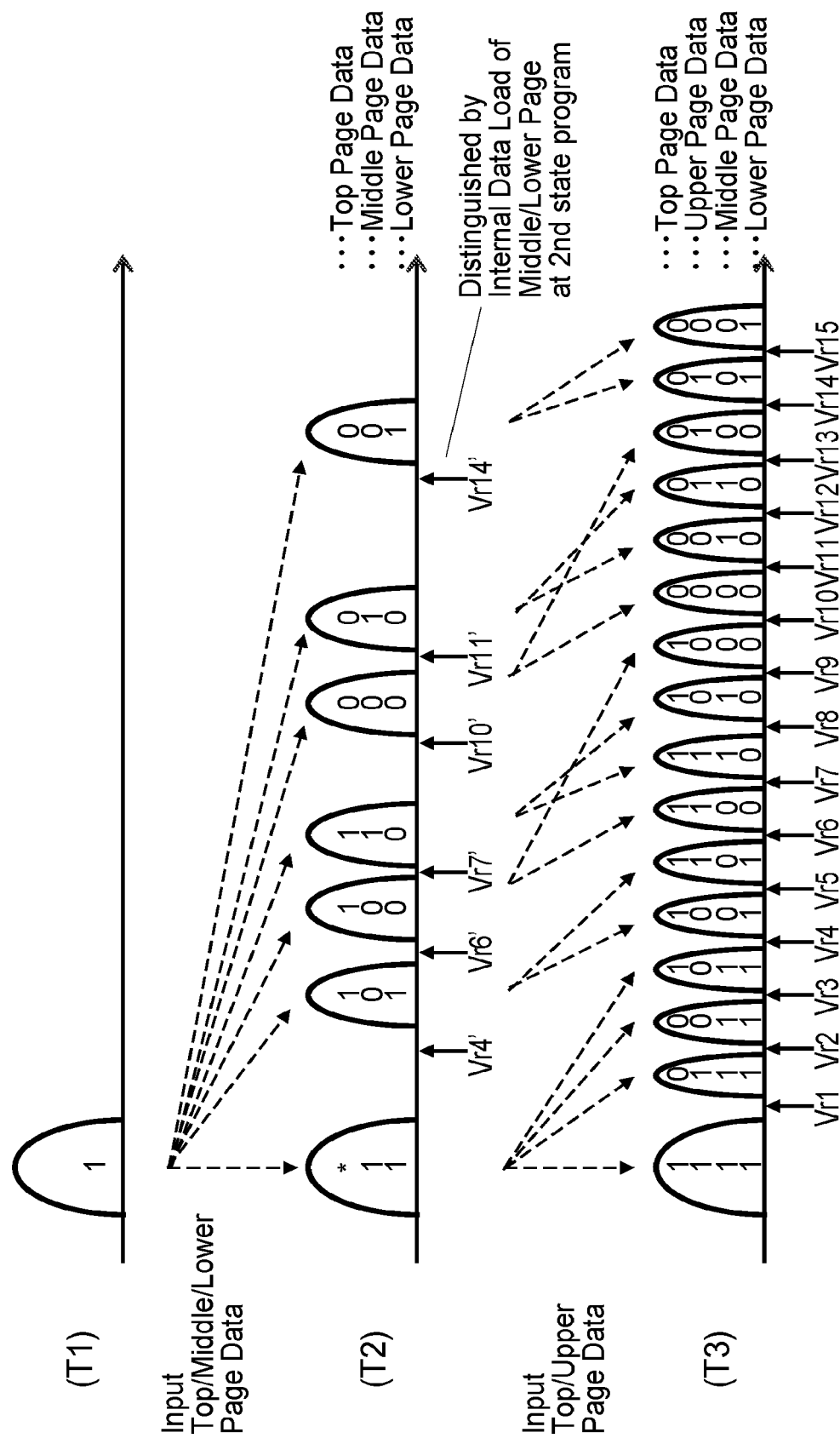
FIG. 26 is a diagram illustrating an example of 2-5-3-5 data coding.
Figure 27:
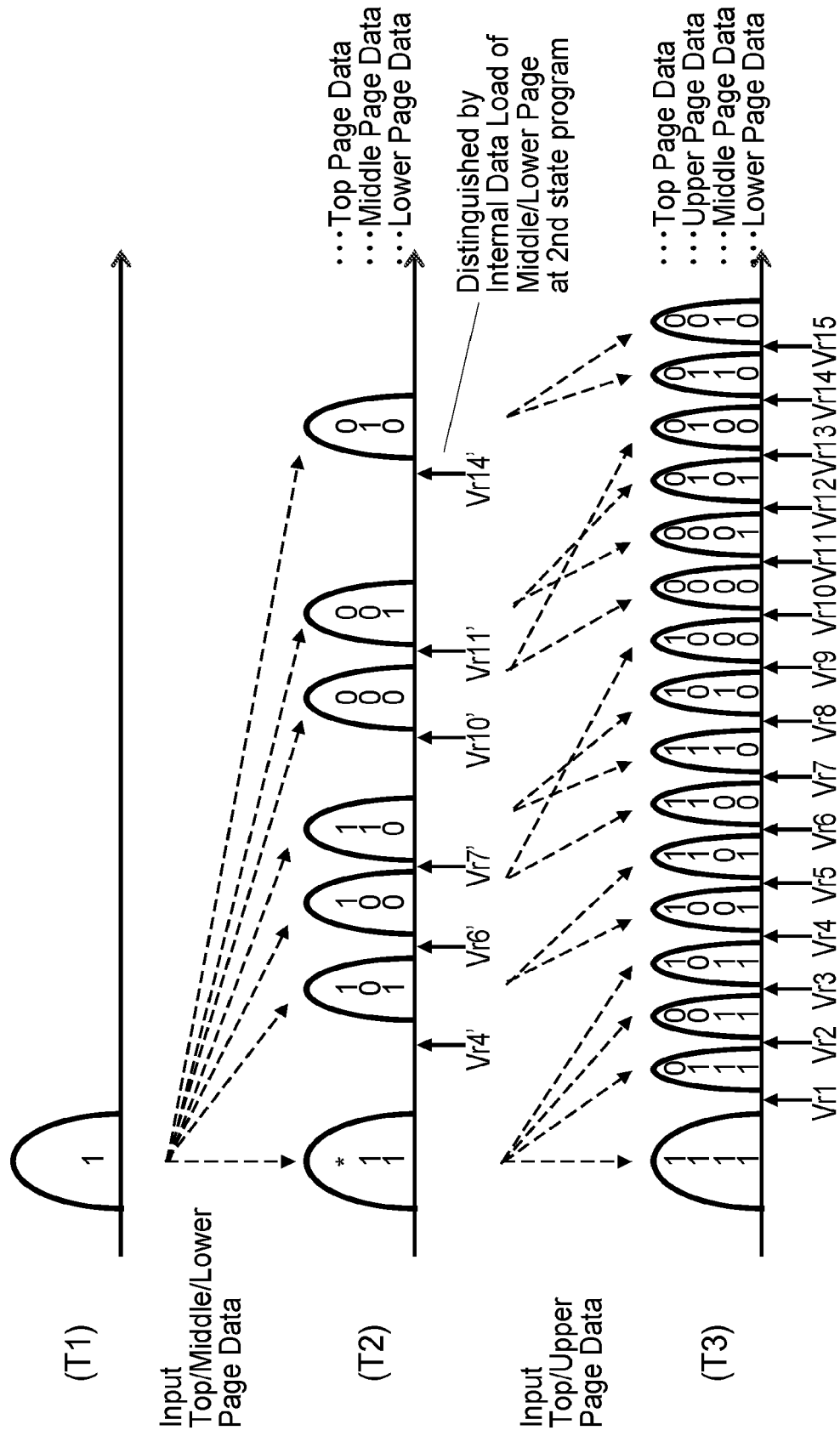
FIG. 27 is a diagram illustrating an example of 3-4-5-3 data coding.

For example, examples in which the number of transitions in the threshold region at the end of the second program is three at maximum include following FIGS. 25 to 27 in addition to FIGS. 17 to 20. FIG. 25 is a diagram illustrating an example of 1-4-5-5 data coding. In the example of FIG. 25, six different threshold regions are generated when the first program is completed. Among them, the threshold regions where the Middle page is 1 and the Lower page is 1 and the threshold regions where the Middle page is 0 and the Lower page is 1 become the same threshold region whether the Top page is 0 or 1. Therefore, the threshold regions which are necessarily generated as eight threshold regions originally are aggregated into six threshold regions.

FIG. 26 is a diagram illustrating an example of 2-5-3-5 data coding. In the example of FIG. 26, seven different threshold regions are generated when the first program is completed. Among them, the threshold regions where the Middle page is 1 and the Lower page is 1 become the same threshold region whether the Top page is 0 or 1. Therefore, the threshold regions which are necessarily generated as eight threshold regions originally are aggregated into seven threshold regions.

FIG. 27 is a diagram illustrating an example of 3-4-5-3 data coding. In the example of FIG. 27, seven different threshold regions are generated when the first program is completed. Among them, the threshold regions where the Middle page is 1 and the Lower page is 1 become the same threshold region whether the Top page is 0 or 1. Therefore, the threshold regions which are necessarily generated as eight threshold regions originally are aggregated into seven threshold regions.

In addition, other data coding examples are also conceivable. Below, the diagrams illustrating the code allocation of each data coding are listed. FIG. 28 illustrates an example of 3-2-5-5 data coding, FIG. 29 illustrates an example of 3-2-5-5 data coding, and FIG. 30 illustrates an example of 1-5-5-4 data coding. Further, FIG. 31 illustrates an example of 1-5-4-5 data coding, FIG. 32 illustrates an example of 1-4-5-5 data coding, and FIG. 33 illustrates an example of 1-5-3-6 data coding. Further, FIG. 34 illustrates an example of 1-3-6-5 data coding, FIG. 35 illustrates an example of 1-2-6-6 data coding, and FIG. 36 illustrates an example of 1-2-6-6 data coding.

FIG. 37 illustrates an example of 1-2-6-6 data coding, FIG. 38 illustrates an example of 1-4-6-4 data coding, and FIG. 39 illustrates an example of 1-4-4-6 data coding. Further, FIG. 40 illustrates an example of 1-4-6-4 data coding, FIG. 41 illustrates an example of 1-4-4-6 data coding, and FIG. 42 illustrates an example of 2-5-2-6 data coding. Further, FIG. 43 illustrates an example of 2-5-2-6 data coding, FIG. 44 illustrates an example of 2-5-2-6 data coding, and FIG. 45 illustrates an example of 3-3-3-6 data coding. Further, FIG. 46 illustrates an example of 3-3-6-3 data coding, FIG. 47 illustrates an example of 2-3-4-6 data coding, and FIG. 48 illustrates an example of 3-4-2-6 data coding.

FIG. 49 illustrates an example of 2-3-4-6 data coding, FIG. 50 illustrates an example of 3-2-6-4 data coding, and FIG. 51 illustrates an example of 3-2-4-6 data coding.

Further, FIG. illustrates an example of 3-2-6-4 data coding, FIG. 53 illustrates an example of 3-4-2-6 data coding, and FIG. 54 illustrates an example of 3-2-4-6 data coding. Further, FIG. 55 illustrates an example of 5-3-2-5 data coding, FIG. 56 illustrates an example of 3-5-2-5 data coding, and FIG. 57 illustrates an example of 3-2-5-5 data coding. Further, FIG. 58 illustrates an example of 2-3-5-5 data coding, FIG. 59 illustrates an example of 2-3-5-5 data coding, and FIG. 60 illustrates an example of 2-3-5-5 data coding.

FIG. 61 illustrates an example of 5-4-2-4 data coding, FIG. 62 illustrates an example of 4-5-2-4 data coding, and FIG. 63 illustrates an example of 5-4-2-4 data coding. Further, FIG. illustrates an example of 2-4-5-4 data coding, FIG. 65 illustrates an example of 2-4-5-4 data coding, and FIG. 66 illustrates an example of 2-5-4-4 data coding. Further, FIG. 67 illustrates an example of 2-5-4-4 data coding, FIG. 68 illustrates an example of 2-5-4-4 data coding, and FIG. 69 illustrates an example of 1-5-4-5 data coding. Further, FIG. 70 illustrates an example of 1-4-5-5 data coding, FIG. 71 illustrates an example of 1-5-5-4 data coding, and FIG. 72 illustrates an example of 1-4-5-5 data coding.

FIG. 73 illustrates an example of 1-5-5-4 data coding, FIG. 74 illustrates an example of 1-5-4-5 data coding, and FIG. 75 illustrates an example of 1-5-5-4 data coding. Further, FIG. 76 illustrates an example of 1-5-4-5 data coding, FIG. 77 illustrates an example of 1-4-5-5 data coding, and FIG. 78 illustrates an example of 1-4-5-5 data coding. Further, FIG. 79 illustrates an example of 1-4-5-5 data coding, FIG. 80 illustrates an example of 1-4-5-5 data coding, and FIG. 81 illustrates an example of 3-5-4-3 data coding. Further, FIG. 82 illustrates an example of 3-4-5-3 data coding, FIG. 83 illustrates an example of 3-5-3-4 data coding, and FIG. 84 illustrates an example of 3-4-3-5 data coding.

FIG. 85 illustrates an example of 3-4-5-3 data coding, FIG. 86 illustrates an example of 3-4-3-5 data coding, and FIG. 87 illustrates an example of 3-3-5-4 data coding. Further, FIG. illustrates an example of 3-3-5-4 data coding, FIG. 89 illustrates an example of 4-5-3-3 data coding, and FIG. 90 illustrates an example of 3-5-4-3 data coding. Further, FIG. 91 illustrates an example of 3-4-5-3 data coding, FIG. 92 illustrates an example of 3-3-4-5 data coding, and FIG. 93 illustrates an example of 3-3-4-5 data coding.

FIG. 94 illustrates an example of 3-3-4-5 data coding, FIG. 95 illustrates an example of 3-4-5-3 data coding, and FIG. 96 illustrates an example of 3-3-5-4 data coding. Further, FIG. 97 illustrates an example of 3-3-4-5 data coding, FIG. 98 illustrates an example of 4-3-4-4 data coding, and FIG. 99 illustrates an example of 3-4-4-4 data coding. Further, FIG. 100 illustrates an example of 3-4-4-4 data coding, FIG. 101 illustrates an example of 4-3-4-4 data coding, and FIG. 102 illustrates an example of 3-4-4-4 data coding. Further, FIG. 103 illustrates an example of 3-4-4-4 data coding, FIG. 104 illustrates an example of 3-4-4-4 data coding, and FIG. 105 illustrates an example of 3-4-4-4 data coding. Further, FIG. 106 illustrates an example of 4-4-3-4 data coding, and FIG. 107 illustrates an example of 4-4-3-4 data coding.

In this way, when the data of a part of pages is input redundantly in the first stage and second stage, the data of the other pages is input in only one of the first stage and second stage, and the program is performed, it is possible to avoid the inter-cell interference, reduce the capacity of the write buffer, and suppress the bias of the bit error rate at the time of writing each bit data. Particularly, in the case of 1-4-5-5, 1-5-4-5, 3-3-4-5, or 3-5-2-5 data coding, the number of boundaries of each page data is uniform, and the number of transitions in the threshold region during the second stage program is 3 or less. Thus, it is possible to suppress the bias of the bit error rate and reduce the inter-cell interference.

Third Embodiment

The memory system 1 according to a third embodiment reduces the capacity of the write buffer as compared with the first and second embodiments.

The hardware configuration of the memory system 1 according to the third embodiment is common to that of the memory system 1 according to the first and second embodiments. In the third embodiment, the page data which is input redundantly in the second stage program as well as in the first stage program is continuously held in the page buffer 24 inside the nonvolatile memory 3 after the first stage program is started. As a result, in the second stage program, it is possible to omit the data input procedure for the corresponding page and input the data for all pages only once. As a result, the capacity of the write buffer can be reduced.

In this embodiment, the second stage program of the word line WLn-1 and the first stage program of the word line WLn are performed together. As described above, the page buffer 24 can store the data of the bit, which is input redundantly in the first stage program and the second stage program, among the first to fourth bits (Lower page, Middle page, Upper page, and Top page) before the first stage program is started, and can discard or invalidate the data after the second stage program is started. Hereinafter, also in this embodiment, an example in which the same 1-4-5-5 data coding as that described in FIG. 6 of the first embodiment is used will be described.

In the program flowchart illustrated in FIG. 9, the first stage program is deviated from the second stage program in execution timing, and each program command and each program data are input for each program. On the other hand, in this embodiment, the program command and the program data in the first stage and the second stage are input collectively as much as possible.

For example, as illustrated in FIG. 8B, the program of the first stage of the word line WLn and the program of the second stage of the word line WLn-1 are necessarily continued except at the beginning portion and end portion of the block. In this regard, in this embodiment, a batch of command input is used as this part. That is, the program data of the Lower page, Middle page, and Top page of the word line WLn and the program data of the Upper page of the word line WLn-1 are input together by a single command input. This means that the data of the Lower/Middle/Upper/Top pages is input together (however, in this case, the pages in the same word line WLi) with a single program command as much as four pages of data amount even in the case of adopting the Foggy-Fine.

In this way, by inputting program commands and program data together, the frequency of command input and polling (periodic check on whether or not chip busy has returned to ready) in the control performed by the memory controller 2 is reduced. Thus, the memory system 1 can be sped up, and the control can be simplified.

Figure 108:
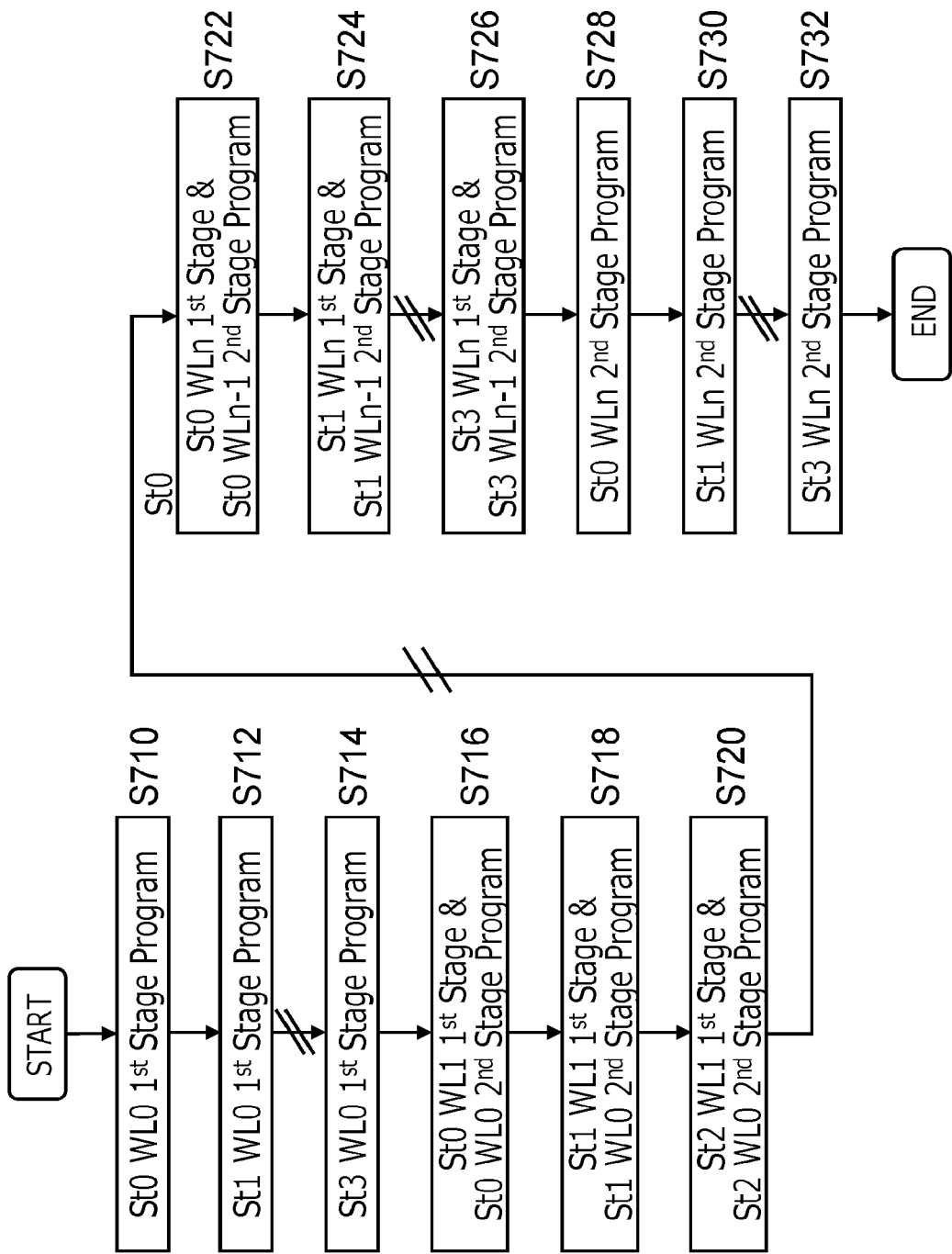
FIG. 108 is a flowchart illustrating a writing procedure for the entire one block according to a third embodiment.
Figure 109:
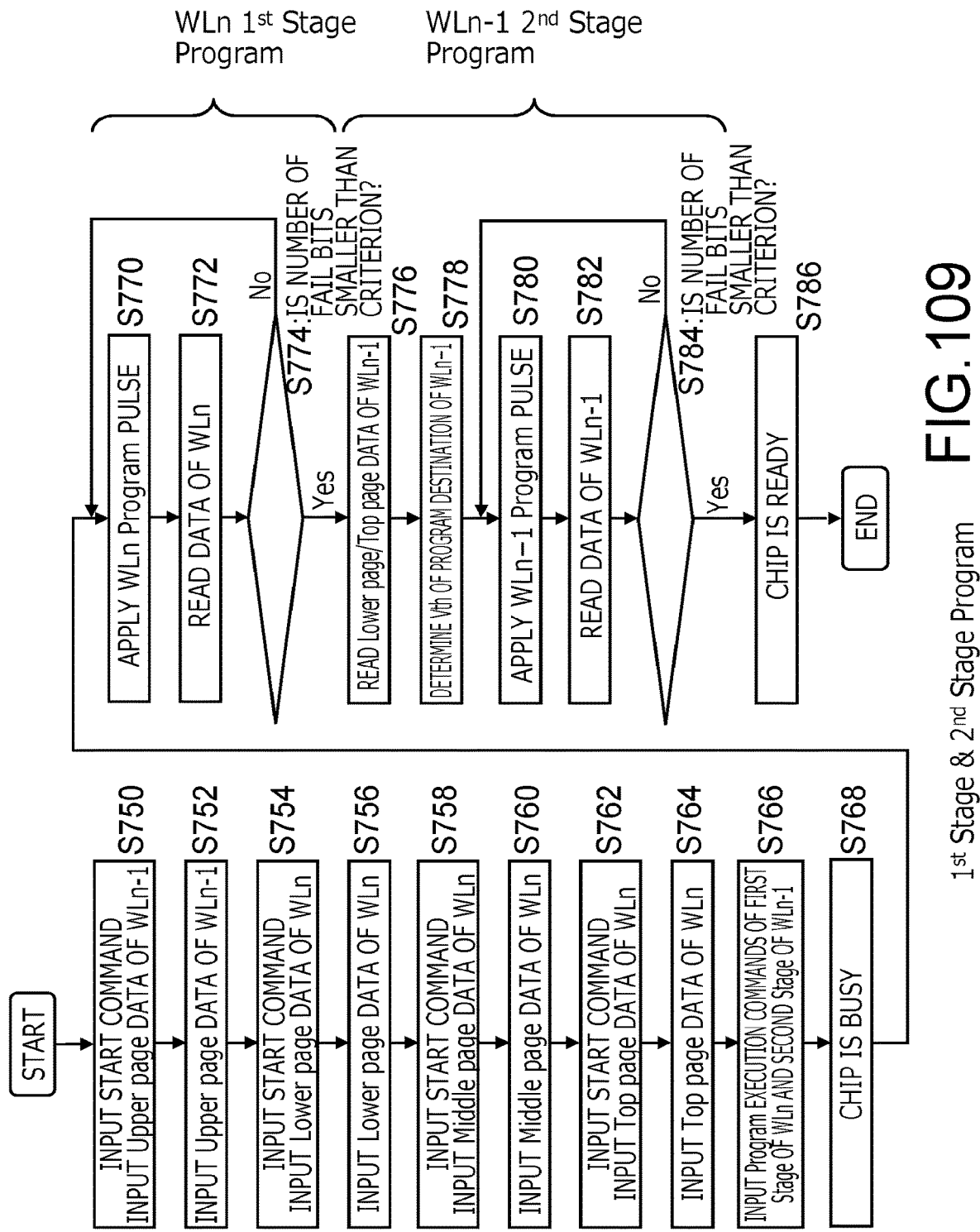
FIG. 109 is a flowchart illustrating a writing procedure in a first stage and a second stage according to the third embodiment.

Here, an example of a writing procedure according to the program order according to the third embodiment will be described with reference to FIGS. 108 and 109. FIGS. 108 and 109 illustrate the writing procedure following the program order illustrated in FIG. 8B.

FIG. 108 is a flowchart illustrating the writing procedure for the entire one block according to the third embodiment. Here, it is assumed that one block has n+1 word lines WLi of word lines WL0 to WLn (n is a natural number). As illustrated in FIG. 108, when writing is started (step S710), the processing of the program of the first stage of the word line WL0 of the strings St0 to St3 is executed (step S712). Accordingly, the control unit 22 executes the program of the first stage of the word line WL0 of the strings St0 to St3 (step S714).

The control unit 22 executes the first stage program of the string St0_word line WL1 and the second stage program of the string St0_word line WL0 (step S716).

Next, the control unit 22 executes the first stage program of the string St1_word line WL1 and the second stage program of the string St1_word line WL0 (step S718). Next, the control unit 22 executes the first stage program of the string St2_word line WL1 and the second stage program of the string St2_word line WL0 (step S720). Thereafter, the control unit 22 repeats the same process for each word line WLi of each string.

Next, the first stage program of the string St0_word line WLn and the second stage program of the string St0_word line WLn−1 are executed (step S722). Next, the control unit 22 executes the first stage program of the string St1_word line WLn and the second stage program of the string St1_word line WLn−1 (step S724). Thereafter, the control unit 22 repeats the same process for each word line WLi of each string.

Next, the control unit 22 executes the first stage program of the string St3_word line WLn and the second stage program of the string St3_word line WLn−1 (step S726). Next, the control unit 22 executes the second stage program of the word line WLn of the strings St0 to St3 (step S728, S730, and S732).

As described above, the program of only the first stage is executed at the beginning of the block as in the first embodiment, and the program of only the second stage is executed at the end of the block as in the first embodiment. In this case, the program of only the first stage is executed according to the procedure illustrated in FIG. 8B, and the program of only the second stage is executed according to the procedure illustrated in FIG. 8C. Further, in the flowchart of FIG. 108, the program of the first stage of the word line WLn and the program of the second stage of the word line WLn−1 are performed together except for the beginning and end of the block. As a result, the frequency of command input and polling performed by the memory controller 2 is reduced, and the processing of the memory system 1 can be sped up.

FIG. 109 is a flowchart illustrating a writing procedure in the first stage and the second stage according to the third embodiment. As illustrated in FIG. 109, in the first stage and second stage programs, after the first stage program is executed, the second stage program is subsequently executed. Specifically, first, the input start command of the Upper page data of the word line WLn−1 is input from the memory controller 2 to the nonvolatile memory 3 (step S750). Then, the Upper page data of the word line WLn−1 is input from the memory controller 2 to the nonvolatile memory 3 (step S752).

Next, the input start command of the Lower page data of the word line WLn is input from the memory controller 2 to the nonvolatile memory 3 (step S754). Then, the Lower page data of the word line WLn is input from the memory controller 2 to the nonvolatile memory 3 (step S756).

Next, the input start command of the Middle page data of the word line WLn is input from the memory controller 2 to the nonvolatile memory 3 (step S758). Then, the Middle page data of the word line WLn is input from the memory controller 2 to the nonvolatile memory 3 (step S760). The data of the Middle page is not only input to the nonvolatile memory 3 but also stored in the page buffer 24. After storing in the page buffer 24, the Middle page data in the write buffer can be discarded or invalidated.

Next, the input start command of the Top page data of the word line WLn is input from the memory controller 2 to the nonvolatile memory 3 (step S762). Then, the Top page data of the word line WLn is input from the memory controller 2 to the nonvolatile memory 3 (step S764).

Next, the program execution commands of the first and second stages are input from the memory controller 2 to the nonvolatile memory 3 (step S766), and thereby the chip is busy (step S768).

Thereafter, one or more program voltage pulses are applied to the Lower page, Middle page, and Top page of the word line WLn (step S770). Then, in order to confirm whether or not the memory cell moves beyond the threshold boundary level, the data reading of the Lower page and Top page of the word line WLn is performed (step S772).

Furthermore, it is confirmed whether or not the number of data fail bits in the Lower page and Top page is smaller than the criterion (step S774). When the number of data fail bits in the Lower page and Top page is greater than or equal to the criterion, the processes of steps S770 to S774 are repeated. Further, when the number of data fail bits becomes smaller than the criterion, the Lower page/Top page data of the word line WLn−1 is read (step S776).

The threshold voltage Vth of the program destination of the Upper page is determined based on the Lower and Top page data of the word line WLn−1 and the data of the Middle page read from the page buffer 24 (step S778). Thereafter, the data writing to the Upper page of the word line WLn−1 is performed using the determined threshold voltage Vth (step S780).

At the time of writing data to the Upper page, one or more program voltage pulses are applied to the Upper page of the word line WLn−1. Then, in order to confirm whether or not the memory cell moves beyond the threshold boundary level, the data reading of the Upper page of the word line WLn−1 is performed (step S782).

Furthermore, verifying is performed to confirm whether or not the number of data fail bits in the Upper page is smaller than the criterion (step S784). When the number of data fail bits in the Upper page is greater than or equal to the criterion, the processes of the application of the program voltage pulse, the data reading, and the verifying are repeated. Then, when the number of fail bits of data becomes smaller than the criterion, the chip is ready (step S786).

Incidentally, in the program of the first stage for the same word line, the order of pages in the data input start command and the data input process for a plurality of pages is arbitrary, and any page may be input first. Further, in the program of the second stage for the same word line, the order of pages in the data input start command and the data input process for a plurality of pages is arbitrary. However, each word line number and the order of processing the programs of the two stages are necessarily in the order shown in FIG. 109.

As described above, in FIG. 109, the case where the first stage program of the word line WLn is executed before the second stage program of the word line WLn−1 has been described. This is because the first stage program of the word line WLn is performed first so that the cells of the word line WLn−1 to which the 16-value threshold voltage Vth is written are not affected by the adjacent cells.

As described above, in this embodiment, four pages of data including the Upper page data of the word line WLn−1 and the Lower page, Middle page, and Top page data of the word line WLn are continuously input.

As another modification, after the program command is input, the data of the Lower page, Middle page, and Top page of the word line WLn−1 is first read as the IDL, and then the Lower page, Middle page, and Top page of the word line WLn are programmed. Next, the threshold voltage Vth of the program destination of the Upper page of the word line WLn−1 is determined, and the Upper page of the word line WLn−1 is programmed with the determined threshold voltage Vth. In this way, the Lower page, Middle page, Top page data of the word line WLn−1 of the IDL can be read before the interference between adjacent cells due to the writing of the word line WLn is received.

Incidentally, the actual execution order of the program by the collective command of the first stage of the word line WLn and the second stage of the word line WLn−1 in this embodiment can be modified. That is, either the programs of the Lower page, Middle page, and Top page of the word line WLn illustrated in FIG. 109 or the reading of the Lower page, Middle page, and Top page data of the word line WLn−1 as IDL may be performed first and can be interchanged. The reading of the Lower page, Middle page, and Top page data of the word line WLn−1 is performed before the programs of the Lower page, Middle page, and Top page of the word line WLn, so that the IDL is possible without being affected by the programs of the Lower page, Middle page, and Top page of the word line WLn.

As described above, in the third embodiment, since the second stage program of the word line WLn−1 and the first stage program of the word line WLn are collectively performed, the frequency of command input and polling is reduced. Therefore, the memory system 1 can be sped up, and the control can be simplified.

Figure 110:
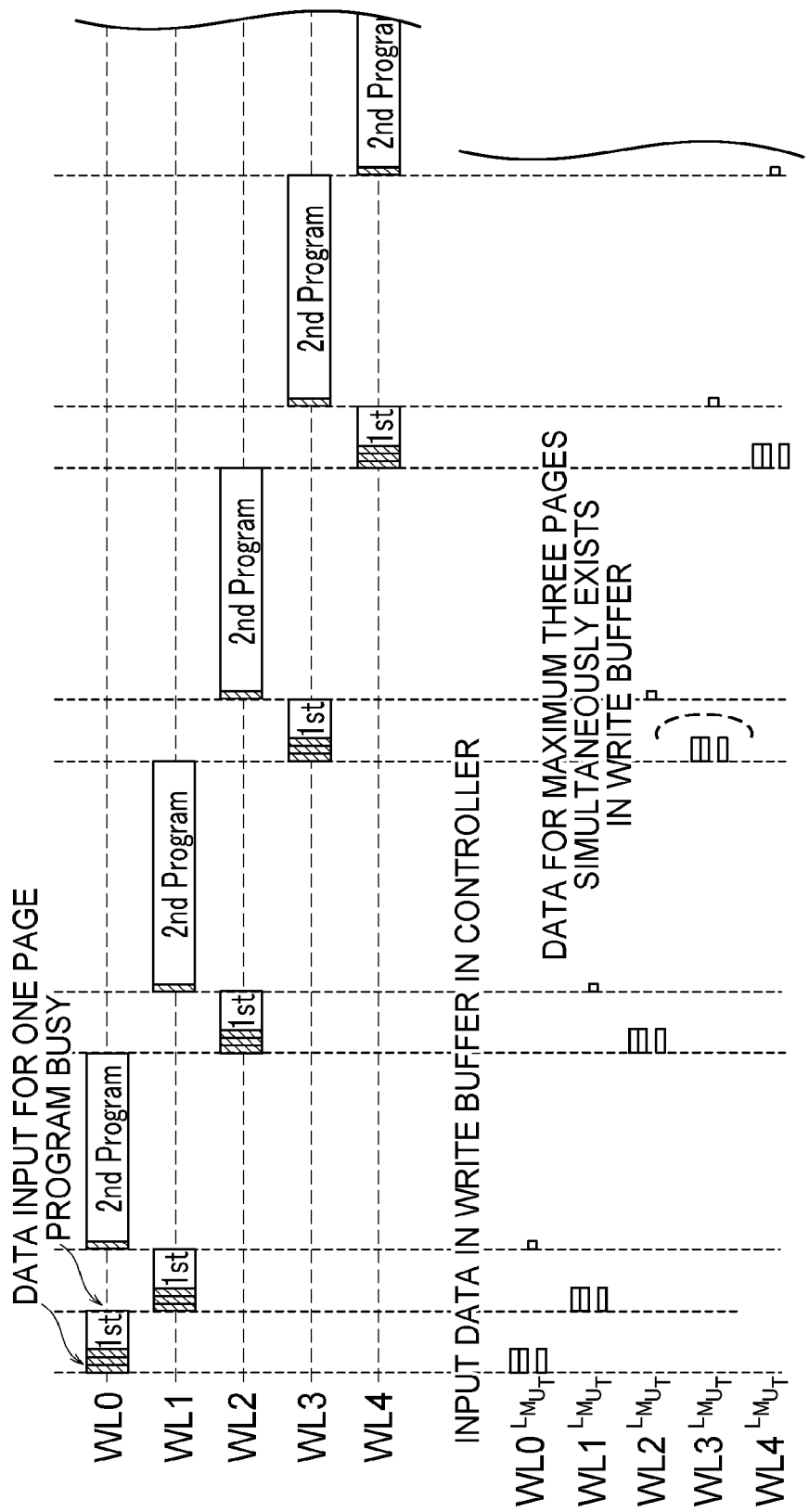
FIG. 110 is a diagram for explaining a write buffer amount in a program of the third embodiment.

FIG. 110 is a diagram for explaining a write buffer amount (buffer data amount) in the program of the third embodiment. In this embodiment, a two-stage program is used in 1-4-5-5 data coding. In the program of this embodiment, data input for three pages (Lower page, Middle page, and Top page) and a program for these three pages (first program) are performed in the first stage. Further, in the case of the program of this embodiment, data input for one page (Upper page) and a program for one page (second program) of the Upper page are performed in the second stage.

For each of the word lines WL0, WL1, WL2, and so on, the data may be stored at the time of data input of each stage in the write buffer. When the program is started, the data may be deleted from the write buffer. For example, when data is input in the first stage, this data is stored in the write buffer. Further, when the program is started at the first stage, the Lower page, Top page, and Middle page data stored in the write buffer may be deleted. However, since the Middle page data is also used in the second stage, it is necessary to store the Middle page data in the page buffer 24 until the program of the second stage is started. Similarly, when the data is input in the second stage, this data is stored in the write buffer. When the program is started at the second stage, all the data stored in the write buffer may be deleted. For this reason, in the case of the program of this embodiment, the data that needs to be held in the write buffer is data for at most three pages and is smaller than that of the first embodiment.

Also in the program of this embodiment, the data for four pages of Lower/Middle/Upper/Top is not continuously written in order to reduce interference between adjacent memory cells. For example, after the first stage to the word line WL0 is executed, the first stage to the word line WL1 adjacent to the word line WL0 is executed before the second stage to the word line WL0 is executed. Similarly, after the first stage to the word line WL1 is executed, the first stage to the word line WL2 adjacent to the word line WL1 is executed before the second stage to the word line WL1 is executed.

As described above, in this embodiment, all the page data is necessary only for one stage of the program, and therefore the data in the write buffer can be discarded when the data input is completed. Therefore, in this embodiment, the number of pages that need to be simultaneously held in the write buffer is smaller than that of the first embodiment.

The page data to be programmed into the nonvolatile memory 3 is once held in a write buffer in the RAM 6 and then input into the nonvolatile memory 3 at the time of programming. In this embodiment, the required capacity of the RAM 6 can be reduced, so that the cost is reduced.

In this embodiment, since each page is completed by one data transfer, the page data transfer time is shorter than that in the first embodiment, and power consumption during transfer can be reduced.

The page reading process in this embodiment has the same process procedure as that described in the first embodiment, and therefore description thereof is omitted.

Incidentally, in this embodiment, it is necessary to increase the page buffer 24 inside the NAND flash memory in order to newly hold page data. As illustrated in FIG. 8A, in the program of the NAND flash memory in which one string exists in the block, the amount of the page buffer 24 that needs to be increased is one page of data. On the other hand, as illustrated in FIG. 8B or 8C, in the program of the NAND flash memory in which four strings exist in the block, the amount of the page buffer 24 that needs to be increased is four pages of data. This is because the programs of the first stages of other three strings are necessarily executed after executing the program of the first stage of one string and then executing the program of the second stage of the same string, and eventually, one page of data is required to be held for each of all four strings.

In this embodiment, 1-4-5-5 data coding has been described as an example. However, various data coding variations are possible, and it is obvious that the embodiments described above can be realized.

In the first to third embodiments described above, the case where the nonvolatile memory 3 is configured using the NAND memory 5 has been described. However, other types of nonvolatile memory 3 such as a resistive random access memory (ReRAM), a magneto-resistive random access memory (MRAM), a phase change random access memory (PRAM), and a ferroelectric random access memory (FeRAM) may be used.

The invention claimed is:

1. A memory system comprising:
a nonvolatile memory which comprises a plurality of memory cells capable of storing 4-bit data represented by first to fourth bits by sixteen threshold regions including a first threshold region indicating an erased state in which data is erased and second to sixteenth threshold regions having a higher voltage level than that of the first threshold region and indicating a written state in which data is written; and a memory controller configured to cause the nonvolatile memory to execute a first program for writing data of the first bit, the second bit, and the fourth bit and then causes the nonvolatile memory to execute a second program for writing data of the third bit, wherein in fifteen boundaries existing between adjacent threshold regions among the first to sixteenth threshold regions, a maximum value of the number of first boundaries used for determining a value of the data of the first bit, the number of second boundaries used for determining a value of the data of the second bit, the number of third boundaries used for determining a value of the data of the third bit, and the number of fourth boundaries used for determining a value of the data of the fourth bit is five, and a second largest value is four, the memory controller is configured to cause the nonvolatile memory to execute the first program such that a threshold region in the memory cell becomes any threshold region of a seventeenth threshold region indicating an erased state in which data is erased and eighteenth to twenty-fourth threshold regions having a higher voltage level than that of the seventeenth threshold region and indicating a written state in which data is written according to the data of the first bit, the second bit, and the fourth bit, the memory controller is configured to cause the nonvolatile memory to execute the second program such that the threshold region in the memory cell becomes any threshold region in two threshold regions among the first to sixteenth threshold regions from any threshold region of the seventeenth to twenty-fourth threshold regions according to the data of the third bit, the number of threshold regions between a threshold region having a lowest voltage level and a threshold region having a highest voltage level among the two threshold regions is two or less, and the memory controller is configured to input the second bit data and the third bit data to the nonvolatile memory when causing the nonvolatile memory to execute the second program.

2. The memory system according to claim 1, wherein the memory controller is configured to cause the nonvolatile memory to execute the first program and the second program such that, among fifteen boundaries existing between adjacent threshold regions in the first to sixteenth threshold regions, the number of boundaries having different values of the first bit, the number of boundaries having different values of the second bit, the number of boundaries having different values of the third bit, and the number of boundaries having different values of the fourth bit are (1, 4, 5, 5), (1, 5, 4, 5), or (3, 3, 4, 5) in order.

3. The memory system according to claim 1, wherein the memory controller is configured to cause the nonvolatile memory to execute the first program such a difference in voltage level between two threshold regions having different values of the second bit data among the seventeenth to twenty-fourth threshold regions is smaller than a difference in voltage level between two threshold regions having different values of the first bit data and further is smaller than a difference in voltage level between two threshold regions having different values of the fourth bit data.

4. The memory system according to claim 3, wherein the memory controller is configured to cause the nonvolatile memory to execute the second program such that an interval between adjacent threshold regions among four threshold regions obtained by performing the second program on two threshold regions, which have different values of the second bit data during the first program, by the third bit data is wider than an interval of the two threshold regions.

5. The memory system according to claim 1, wherein the first bit is a least significant Lower bit, the second bit is a second smallest Middle bit, the third bit is a second largest Upper bit, and the fourth bit is a most significant Top bit.

6. The memory system according to claim 1, further comprising:
a volatile first storage configured to store the data of the first to fourth bits, wherein
the first storage is capable of discarding or invalidating data of a bit, which is input redundantly during the first program and the second program, among the first to fourth bits after the second program is started, and discarding or invalidating data of other bits after the first program is started.

7. The memory system according to claim 1, further comprising:
a volatile first storage configured to store the data of the first to fourth bits; and
a nonvolatile second storage configured to store data of a bit, which is input redundantly during the first program and the second program, among the first to fourth bits, wherein
the first storage is capable of discarding or invalidating the data of the first to fourth bits after the first program is started, and
the second storage is capable of storing the data of the bit, which is input redundantly during the first program and the second program, among the first to fourth bits before the first program is started, and discarding or invalidating the data after the second program is started.

8. The memory system according to claim 7, wherein the second storage is provided in units of word lines.

9. The memory system according to claim 1, wherein the plurality of memory cells in the nonvolatile memory comprises a plurality of first memory cells connected to a first word line and a plurality of second memory cells connected to a second word line adjacent to the first word line, and
the memory controller is configured to perform the first program on the plurality of second memory cells after performing the first program on the plurality of first memory cells, and then performs the second program on the plurality of first memory cells.

10. The memory system according to claim 1, wherein the nonvolatile memory comprises at least a first word line and a second word line to which two or more of the memory cells are each connected, and
the memory controller instructs the nonvolatile memory to execute continuous execution of the first program for the memory cell connected to the first word line and the second program for the memory cell connected to the second word line by inputting continuous commands and data.

11. The memory system according to claim 1, wherein the nonvolatile memory comprises a control unit which determines a threshold voltage of data of a bit programmed by the second program on a basis of data obtained by reading data programmed by the first program, the data of the second bit input redundantly in the first program and the second program, and input data of the third bit programmed by the second program.

12. The memory system according to claim 11, further comprising:
an error correction unit which performs error correction by reading the data programmed by the first program, wherein
the control unit is configured to determine the threshold voltage of the data of the bit programmed by the second program on a basis of data after error correction by the error correction unit, the data of the second bit, and the input data of the third bit.

13. A memory system comprising:
a nonvolatile memory which comprises a plurality of memory cells capable of storing 4-bit data represented by first to fourth bits by sixteen threshold regions including a first threshold region indicating an erased state in which data is erased and second to sixteenth threshold regions having a higher voltage level than that of the first threshold region and indicating a written state in which data is written; and
a memory controller configured to cause the nonvolatile memory to execute a first program for writing data of the first bit, the second bit, and the fourth bit and then causes the nonvolatile memory to execute a second program for writing data of the third bit, wherein
in fifteen boundaries existing between adjacent threshold regions among the first to sixteenth threshold regions, the number of first boundaries used for determining a value of the data of the first bit, the number of second boundaries used for determining a value of the data of the second bit, the number of third boundaries used for determining a value of the data of the third bit, and the number of fourth boundaries used for determining a value of the data of the fourth bit are (3, 5, 2, 5) in order,
the memory controller is configured to cause the nonvolatile memory to execute the first program such that a threshold region in the memory cell becomes any threshold region of a seventeenth threshold region indicating an erased state in which data is erased and eighteenth to twenty-fourth threshold regions having a higher voltage level than that of the seventeenth threshold region and indicating a written state in which data is written according to the data of the first bit, the second bit, and the fourth bit,
the memory controller is configured to cause the nonvolatile memory to execute the second program such that the threshold region in the memory cell becomes any threshold region in two threshold regions among the first to sixteenth threshold regions from any threshold region of the seventeenth to twenty-fourth threshold regions according to the data of the third bit,
the number of threshold regions between a threshold region having a lowest voltage level and a threshold region having a highest voltage level among the two threshold regions is two or less, and
the memory controller is configured to input the second bit data and the third bit data to the nonvolatile memory when causing the nonvolatile memory to execute the second program.

14. The memory system according to claim 13, wherein the memory controller is configured to cause the nonvolatile memory to execute the second program such that an interval between adjacent threshold regions among four threshold regions obtained by performing the second program on two threshold regions, which have different values of the second bit data during the first program, by the third bit data is wider than an interval of the two threshold regions.

15. The memory system according to claim 13, wherein the first bit is a least significant Lower bit, the second bit is a second smallest Middle bit, the third bit is a second largest Upper bit, and the fourth bit is a most significant Top bit.

16. The memory system according to claim 13, further comprising:
a volatile first storage configured to store the data of the first to fourth bits, wherein
the first storage is capable of discarding or invalidating data of a bit, which is input redundantly during the first program and the second program, among the first to fourth bits after the second program is started, and discarding or invalidating data of other bits after the first program is started.

17. The memory system according to claim 13, further comprising:
a volatile first storage configured to store the data of the first to fourth bits; and
a nonvolatile second storage configured to store data of a bit, which is input redundantly during the first program and the second program, among the first to fourth bits, wherein
the first storage is capable of discarding or invalidating the data of the first to fourth bits after the first program is started, and
the second storage is capable of storing the data of the bit, which is input redundantly during the first program and the second program, among the first to fourth bits before the first program is started, and discarding or invalidating the data after the second program is started.

18. The memory system according to claim 17, wherein the second storage is provided in units of word lines.

19. The memory system according to claim 13, wherein the plurality of memory cells in the nonvolatile memory comprises a plurality of first memory cells connected to a first word line and a plurality of second memory cells connected to a second word line adjacent to the first word line, and
the memory controller is configured to perform the first program on the plurality of second memory cells after performing the first program on the plurality of first memory cells, and then performs the second program on the plurality of first memory cells.

20. The memory system according to claim 13, wherein the nonvolatile memory comprises at least a first word line and a second word line to which two or more of the memory cells are each connected, and
the memory controller instructs the nonvolatile memory to execute continuous execution of the first program for the memory cell connected to the first word line and the second program for the memory cell connected to the second word line by inputting continuous commands and data.

* * * * *